(12) United States Patent
Yamazaki et al.

(10) Patent No.: US 7,995,183 B2
(45) Date of Patent: Aug. 9, 2011

(54) SEMICONDUCTOR DEVICE AND A METHOD OF MANUFACTURING THE SAME

(75) Inventors: Shunpei Yamazaki, Tokyo (JP); Jun Koyama, Kanagawa (JP); Yasuyuki Arai, Kanagawa (JP); Hideaki Kuwabara, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/932,113

(22) Filed: Sep. 2, 2004

(65) Prior Publication Data

US 2005/0041166 A1 Feb. 24, 2005

Related U.S. Application Data

(62) Division of application No. 10/388,656, filed on Mar. 17, 2003, now Pat. No. 6,806,499, which is a division of application No. 09/566,723, filed on May 9, 2000, now Pat. No. 6,709,901.

(30) Foreign Application Priority Data

Mar. 13, 2000 (JP) ................................. 2000-069563

(51) Int. Cl.
*G02F 1/1345* (2006.01)
(52) U.S. Cl. .......... 349/152; 349/43; 349/149; 349/150; 349/151
(58) Field of Classification Search ........... 349/149–152
See application file for complete search history.

(56) References Cited

U.S. PATENT DOCUMENTS

| 4,624,737 A | 11/1986 | Shimbo |
| 4,960,719 A | 10/1990 | Tanaka et al. |
| 5,028,551 A | 7/1991 | Dohjo et al. |
| 5,084,961 A | 2/1992 | Yoshikawa |
| 5,151,806 A | 9/1992 | Kawamoto et al. |
| 5,362,660 A | 11/1994 | Kwasnick et al. |
| 5,478,766 A | 12/1995 | Park et al. |
| 5,532,180 A | 7/1996 | Den Boer et al. |
| 5,539,219 A | 7/1996 | Den Boer et al. |
| 5,668,379 A | 9/1997 | Ono et al. |

(Continued)

FOREIGN PATENT DOCUMENTS

JP 5-175500 7/1993

(Continued)

OTHER PUBLICATIONS

Japanese Office Action (Application No. 2000/069563) dated Nov. 4, 2009.

(Continued)

*Primary Examiner* — Richard H Kim
(74) *Attorney, Agent, or Firm* — Nixon Peabody LLP; Jeffrey L. Costellia

(57) ABSTRACT

A pixel TFT formed in a pixel region is formed on a first substrate by a channel etch type reverse stagger type TFT, and patterning of a source region and a drain region, and patterning of a pixel electrode are performed by the same photomask. A driver circuit formed by using TFTs having a crystalline semiconductor layer, and an input-output terminal dependent on the driver circuit, are taken as one unit. A plurality of units are formed on a third substrate, and afterward the third substrate is partitioned into individual units, and the obtained stick drivers are mounted on the first substrate.

9 Claims, 30 Drawing Sheets

U.S. PATENT DOCUMENTS

| | | | |
|---|---|---|---|
| 5,706,064 A | 1/1998 | Fukunaga et al. | |
| 5,710,612 A * | 1/1998 | Mase | 349/149 |
| 5,739,880 A | 4/1998 | Suzuki et al. | |
| 5,757,453 A | 5/1998 | Shin et al. | |
| 5,757,456 A | 5/1998 | Yamazaki et al. | |
| 5,766,977 A | 6/1998 | Yamazaki | |
| 5,811,318 A | 9/1998 | Kweon | |
| 5,821,138 A | 10/1998 | Yamazaki et al. | |
| 5,825,449 A | 10/1998 | Shin | |
| 5,834,327 A | 11/1998 | Yamazaki et al. | |
| 5,847,687 A | 12/1998 | Hirakata et al. | |
| 5,867,233 A | 2/1999 | Tanaka | |
| 5,892,562 A | 4/1999 | Yamazaki et al. | |
| 5,917,567 A | 6/1999 | Oh et al. | |
| 5,959,599 A | 9/1999 | Hirakata | |
| 5,966,189 A | 10/1999 | Matsuo | |
| 5,977,562 A | 11/1999 | Hirakata et al. | |
| 5,986,724 A | 11/1999 | Akiyama et al. | |
| 5,990,998 A | 11/1999 | Park et al. | |
| 5,995,190 A | 11/1999 | Nagae et al. | |
| 5,998,229 A | 12/1999 | Lyu et al. | |
| 6,008,869 A | 12/1999 | Oana et al. | |
| 6,025,892 A | 2/2000 | Kawai et al. | |
| 6,054,975 A | 4/2000 | Kurokawa et al. | |
| 6,055,028 A | 4/2000 | Nishi et al. | |
| 6,064,456 A | 5/2000 | Taniguchi et al. | |
| 6,075,257 A | 6/2000 | Song | |
| 6,097,458 A | 8/2000 | Tsuda et al. | |
| 6,097,459 A | 8/2000 | Shimada et al. | |
| 6,097,465 A | 8/2000 | Hiroki et al. | |
| 6,114,184 A | 9/2000 | Matsumoto et al. | |
| 6,118,502 A | 9/2000 | Yamazaki et al. | |
| 6,124,606 A | 9/2000 | Den Boer et al. | |
| 6,147,667 A | 11/2000 | Yamazaki et al. | |
| 6,160,600 A | 12/2000 | Yamazaki et al. | |
| 6,188,452 B1 | 2/2001 | Kim et al. | |
| 6,190,933 B1 | 2/2001 | Shimabukuro et al. | |
| 6,197,625 B1 | 3/2001 | Choi | |
| 6,208,390 B1 | 3/2001 | Ejiri et al. | |
| 6,208,395 B1 | 3/2001 | Kanoh et al. | |
| 6,218,221 B1 | 4/2001 | Sah | |
| 6,255,668 B1 | 7/2001 | Kang et al. | |
| 6,265,889 B1 * | 7/2001 | Tomita et al. | 324/765 |
| 6,266,117 B1 | 7/2001 | Yanagawa et al. | |
| 6,271,818 B1 | 8/2001 | Yamazaki et al. | |
| 6,278,130 B1 * | 8/2001 | Joo et al. | 257/59 |
| 6,304,243 B1 | 10/2001 | Kondo et al. | |
| 6,323,051 B1 | 11/2001 | Shimada | |
| 6,335,778 B1 * | 1/2002 | Kubota et al. | 349/151 |
| 6,344,888 B2 * | 2/2002 | Yasukawa | 349/113 |
| 6,387,737 B1 | 5/2002 | Yamazaki et al. | |
| 6,518,557 B1 * | 2/2003 | Izumi et al. | 250/208.1 |
| 6,747,288 B2 | 6/2004 | Yamazaki et al. | |
| 6,806,495 B1 | 10/2004 | Yamazaki et al. | |
| 6,806,499 B2 * | 10/2004 | Yamazaki et al. | 257/72 |
| 6,855,957 B1 | 2/2005 | Yamazaki et al. | |
| 6,882,012 B2 | 4/2005 | Yamazaki et al. | |
| 6,900,084 B1 | 5/2005 | Yamazaki | |
| 7,102,718 B1 | 9/2006 | Yamazaki et al. | |
| 7,256,760 B2 | 8/2007 | Yamazaki et al. | |
| 7,579,214 B2 | 8/2009 | Yamazaki et al. | |
| 7,612,376 B2 | 11/2009 | Yamazaki et al. | |
| 7,714,975 B1 | 5/2010 | Yamazaki et al. | |
| 2002/0145602 A1 | 10/2002 | Matsueda | |
| 2003/0058210 A1 | 3/2003 | Yamazaki et al. | |

FOREIGN PATENT DOCUMENTS

| | | |
|---|---|---|
| JP | 05-323371 | 12/1993 |
| JP | 07-014880 | 1/1995 |
| JP | 8-87033 | 4/1996 |
| JP | 08-139333 | 5/1996 |
| JP | 08-250742 | 9/1996 |
| JP | 09-015621 | 1/1997 |
| JP | 09-054318 | 2/1997 |
| JP | 09-152626 | 6/1997 |
| JP | 10-048655 | 2/1998 |
| JP | 10-125928 A | 5/1998 |
| JP | 10-133232 | 5/1998 |
| JP | 10-197897 | 7/1998 |
| JP | 11-160734 | 6/1999 |
| JP | 11-168214 | 6/1999 |
| JP | 11-202368 A | 7/1999 |
| JP | 11-258596 | 9/1999 |
| KR | 96-262 | 1/1996 |
| KR | 510439 | 8/2005 |

OTHER PUBLICATIONS

U.S. Appl. No. 09/566,733, filed May 9, 2000.
U.S. Appl. No. 10/144,067, filed May 14, 2002.
Wolf et al., "Chemical Vapor Deposition of Amorphous and Polycrystalline Thin Films", pp. 161-175 and 335, 1986, Silicon Processing for the VLSI Era, vol. 1: Process Technology.
U.S. Appl. No. 09/566,730, filed May 9, 2000; Shunpei Yamazaki et al; "Semiconductor Device and Method of Fabricating the Same".
U.S. Appl. No. 09/566,729, filed May 9, 2000; Shunpei Yamazaki et al.; "Liquid Crystal Display Device and Method of Manufacturing the Same".
U.S. Appl. No. 09/566,742, filed Jul. 7, 2000; Shunpei Yamazaki et al.; "Liquid Crystal Display Device and Manufacturing Method Thereof".
U.S. Appl. No. 09/566,722, filed May 9, 2000; Shunpei Yamazaki et al.; "Semiconductor Device and Manufacturing Method Thereof".
U.S. Appl. No. 09/635,945; Setsuo et al.; filed Aug. 10, 2000; "Semiconductor Device and Method of Manufacturing the Semiconductor Device" (Specification, Claims and Drawings).
Wolf et al., "Chemical Vapor Deposition of Amorphous and Polycrystalline Thin Films", pp. 161-175 and 335, 1986, Silicon Processing for the VLSI Era, vol. 1: Process Technology.
U.S. Appl. No. 09/635,945; Setsuo et al.; filed Aug. 10, 2000; "Semiconductor Device and Method of Manufacturing the Semiconductor Device" (Specification, Claims and Drawings).

* cited by examiner

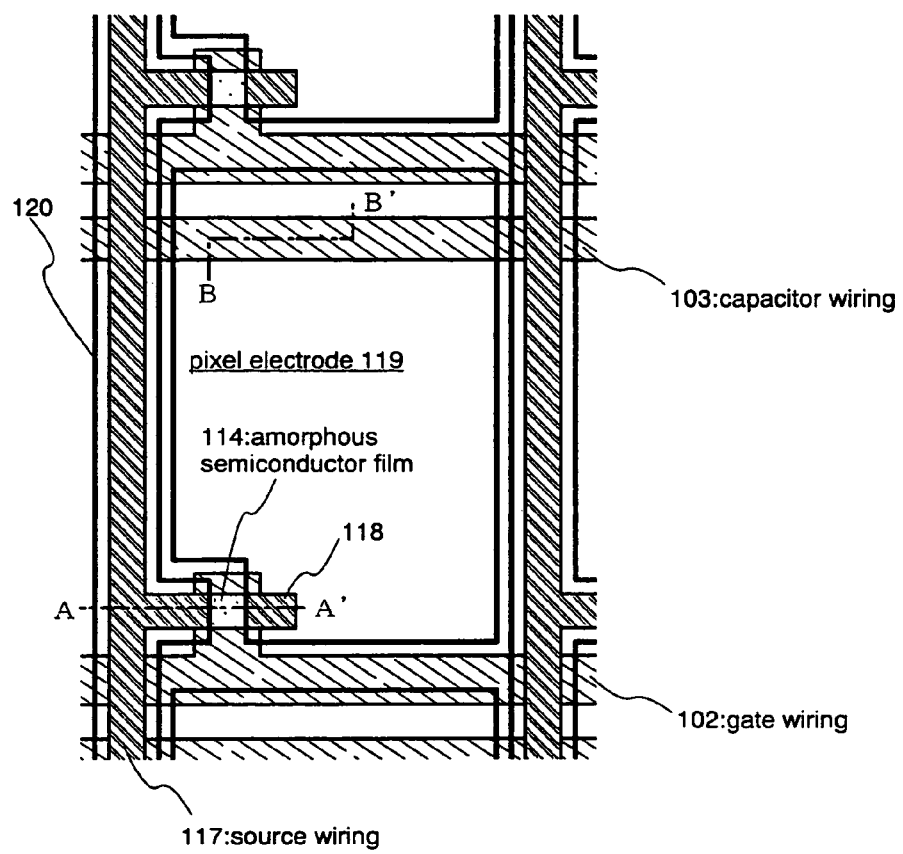
[Fig. 1]

[Fig. 2]
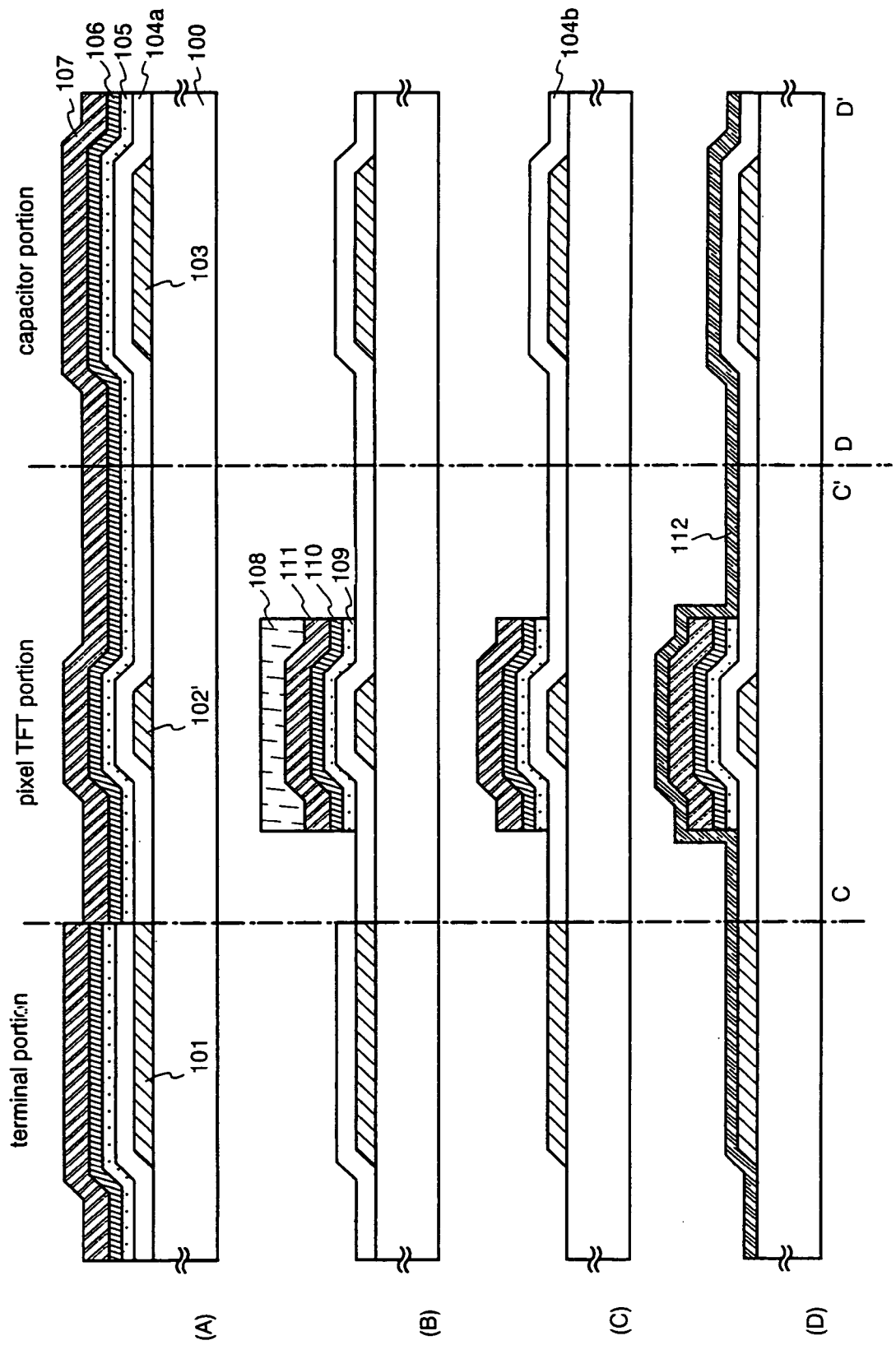

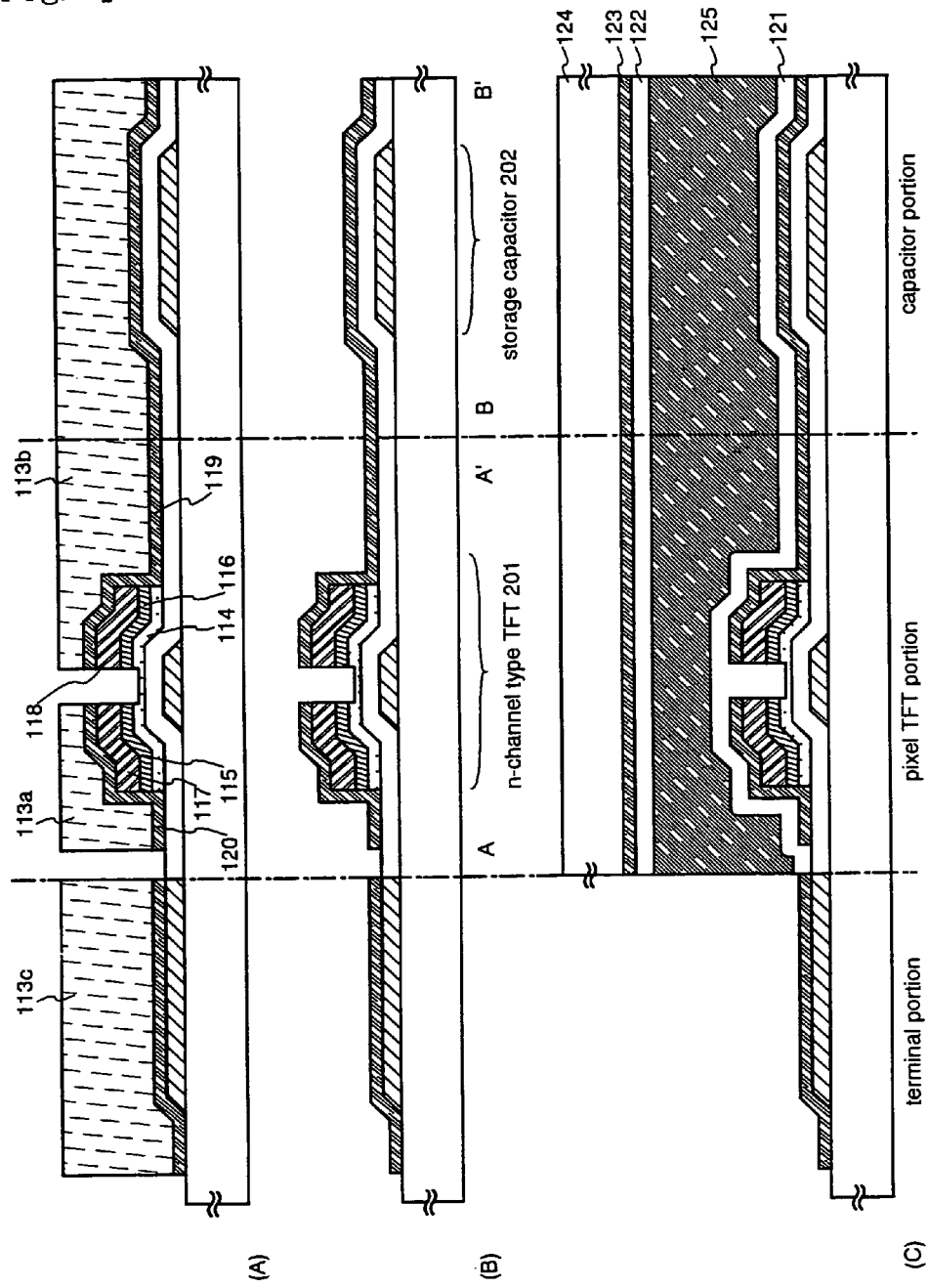

[Fig. 4]
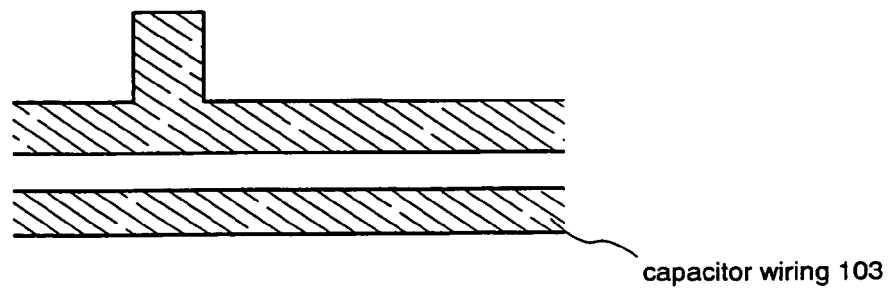
capacitor wiring 103
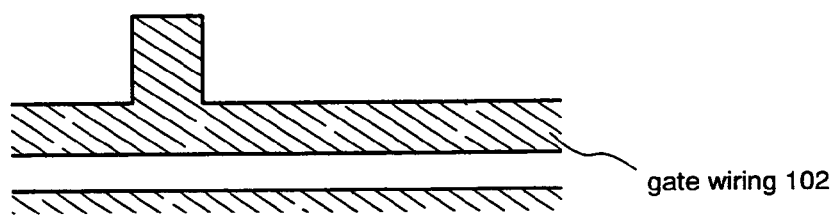
gate wiring 102

[Fig. 5]
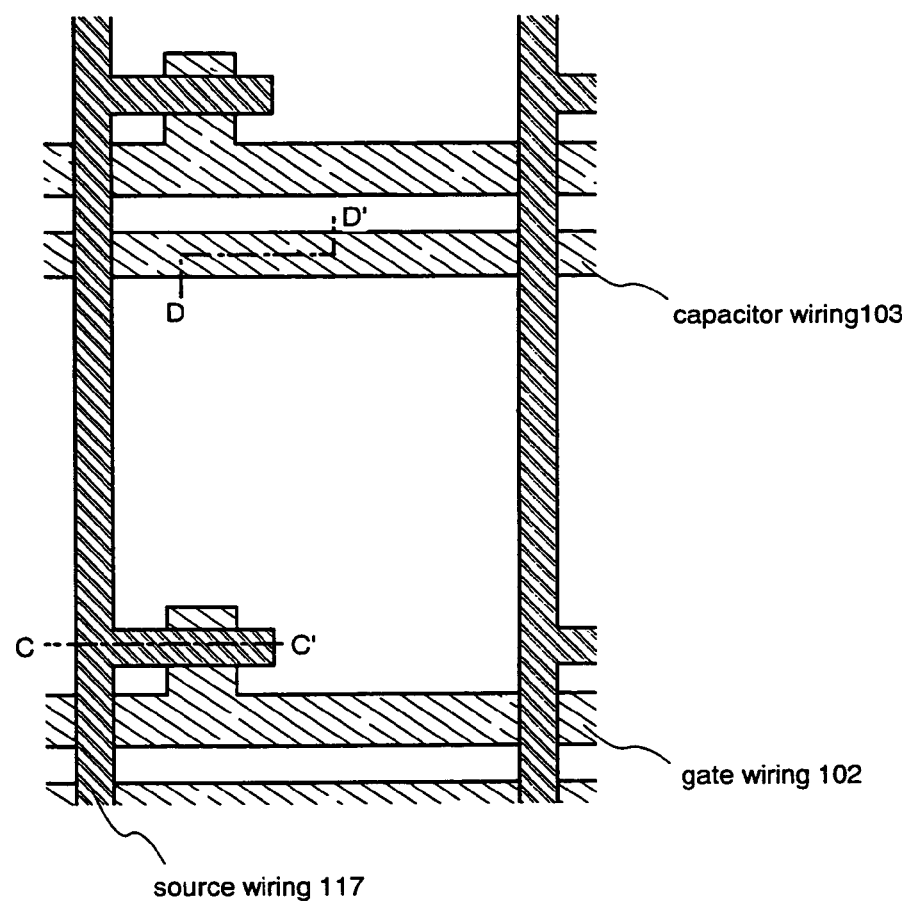

[Fig. 6]
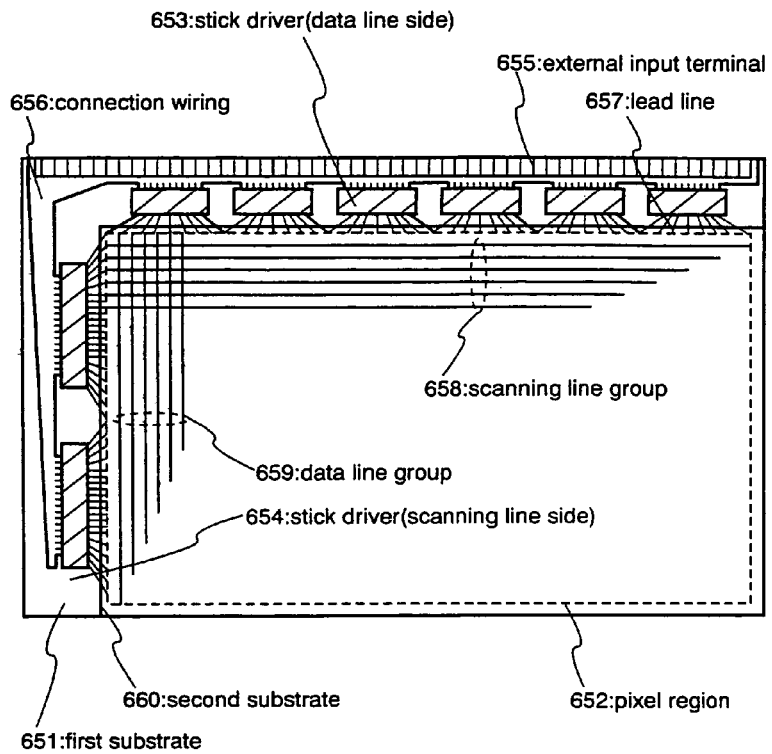
[Fig. 7]
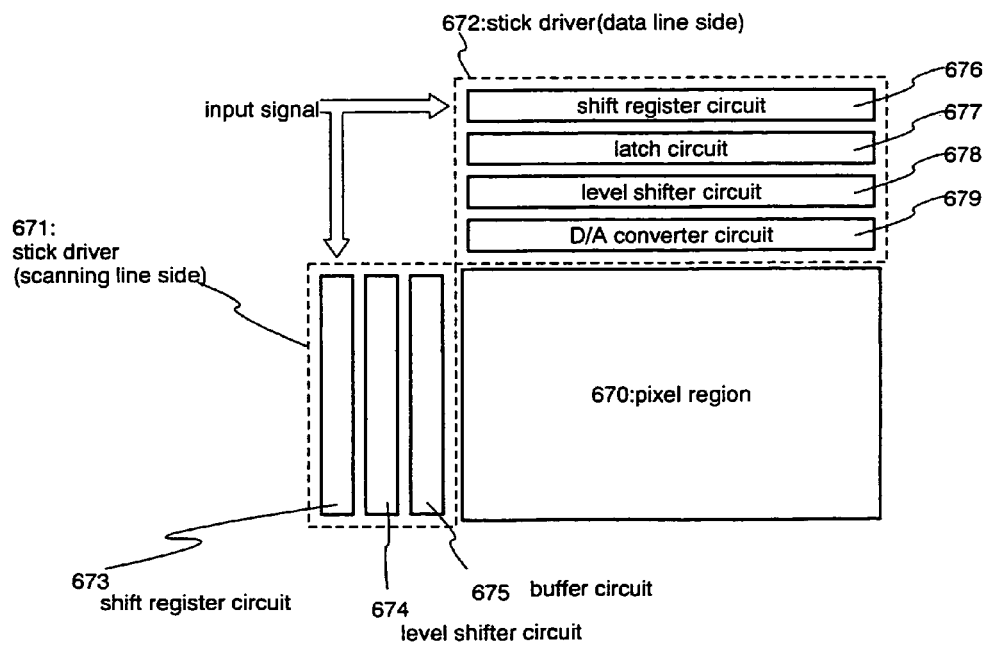

[Fig. 8]
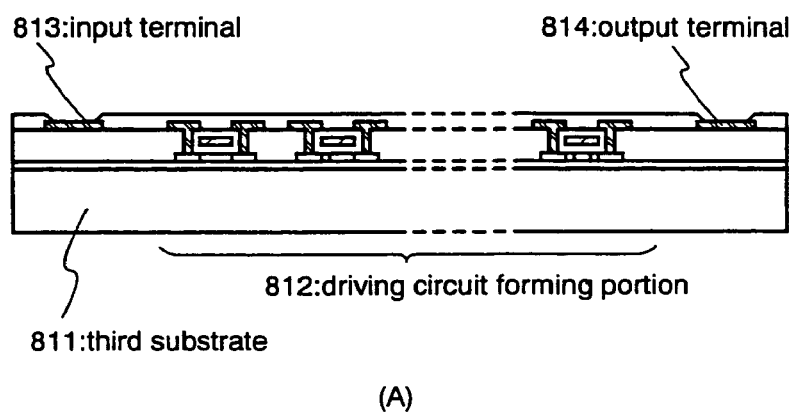
(A)
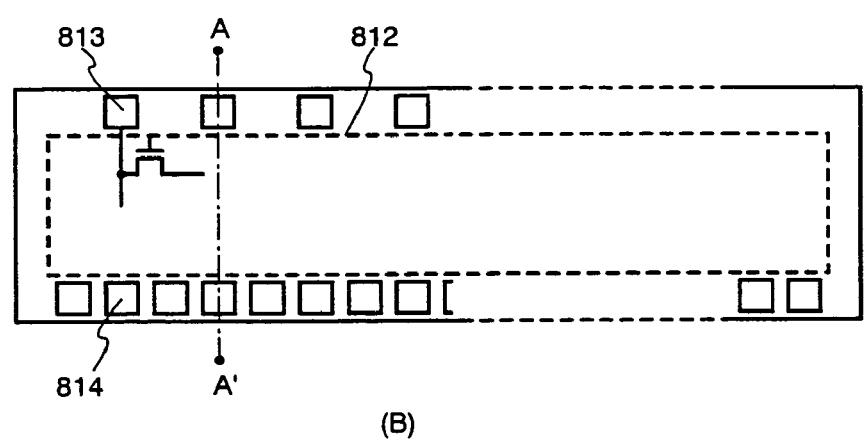
(B)

[Fig. 9]
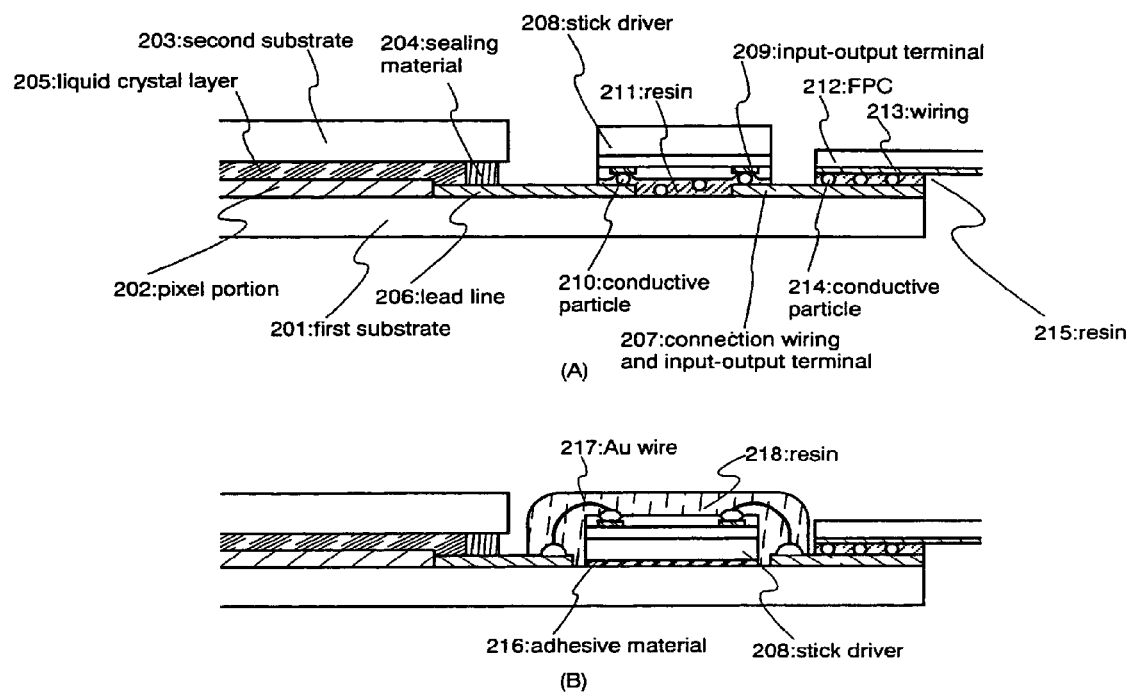
[Fig. 10]
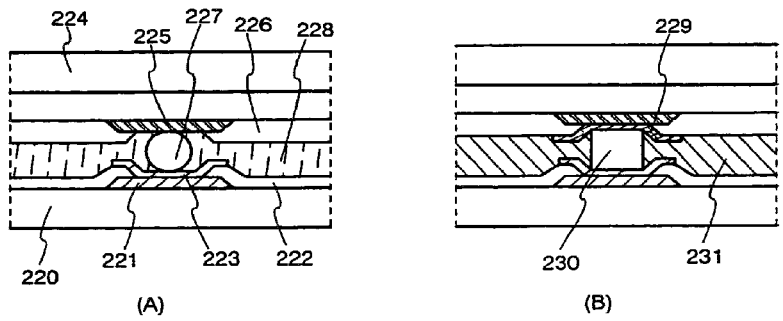

[Fig. 11]
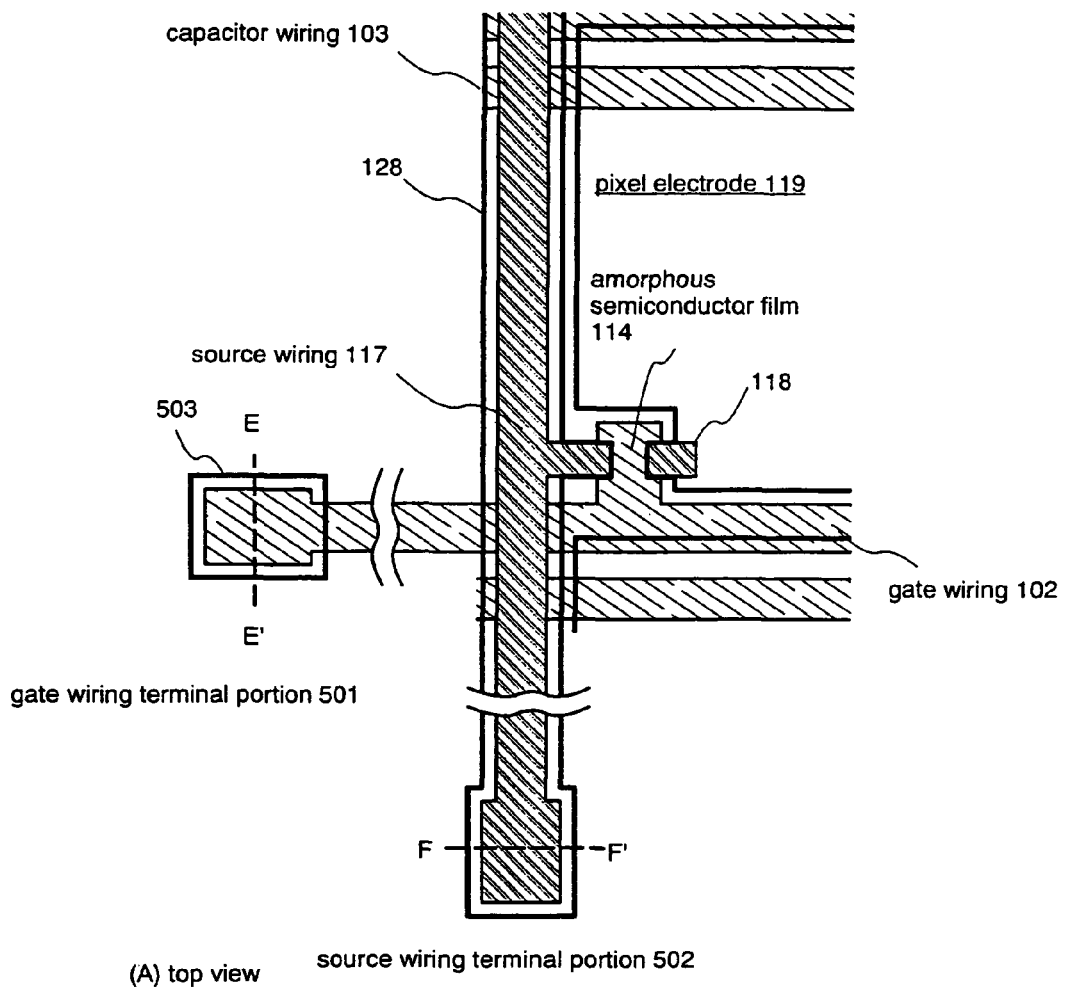
(A) top view
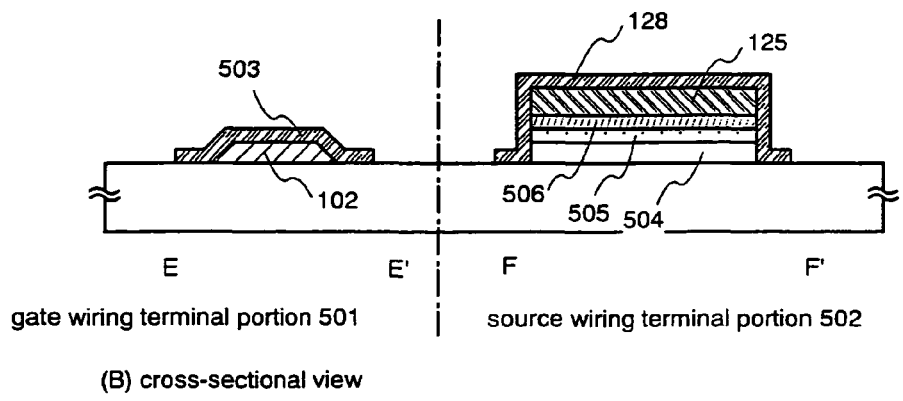
(B) cross-sectional view

[Fig. 12]
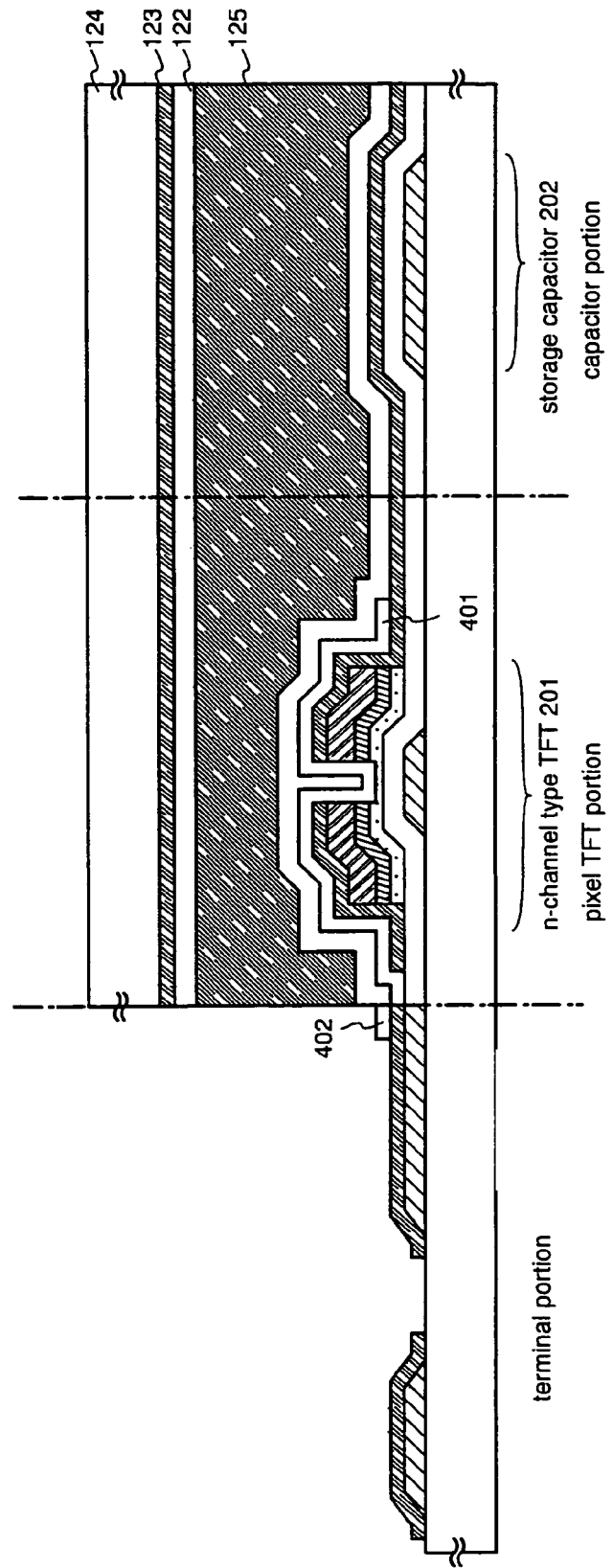

[Fig. 13]
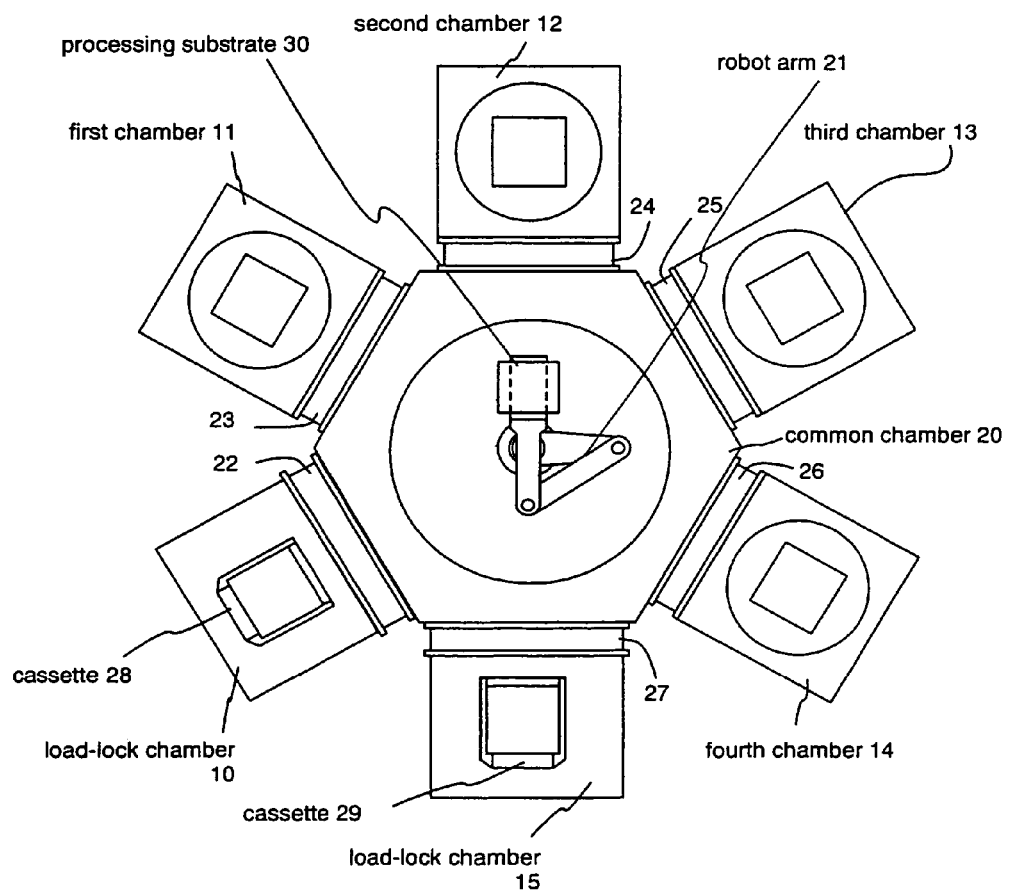

[Fig. 14]
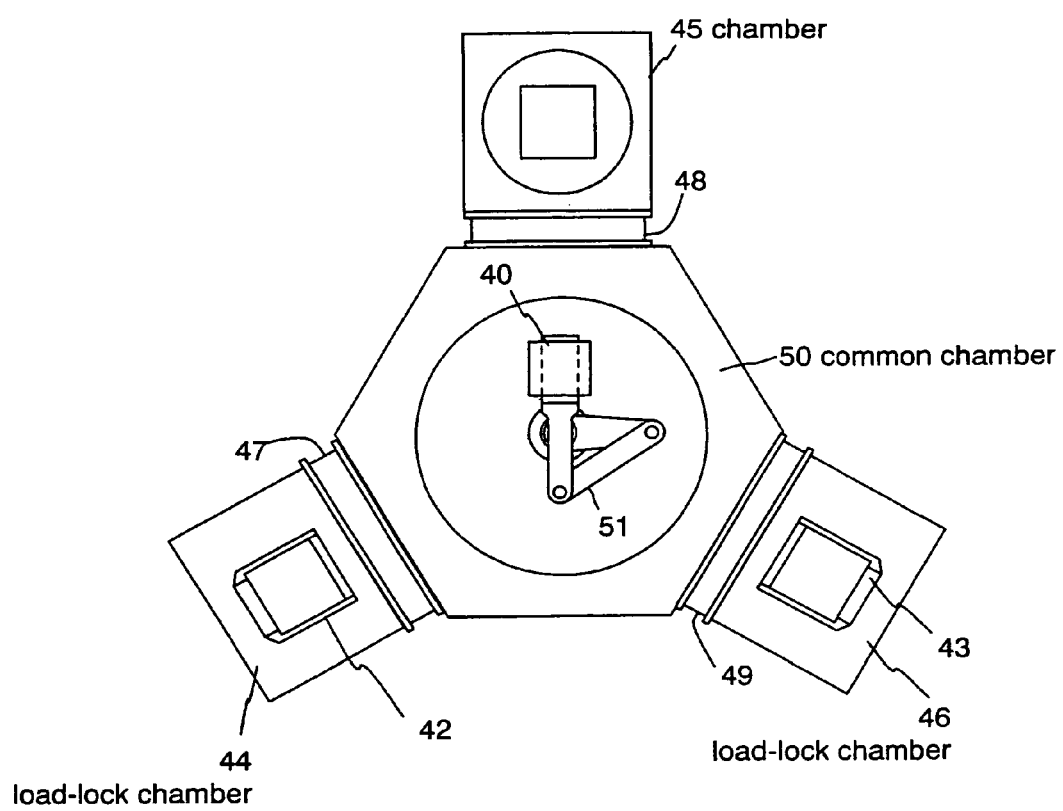

[Fig. 15]
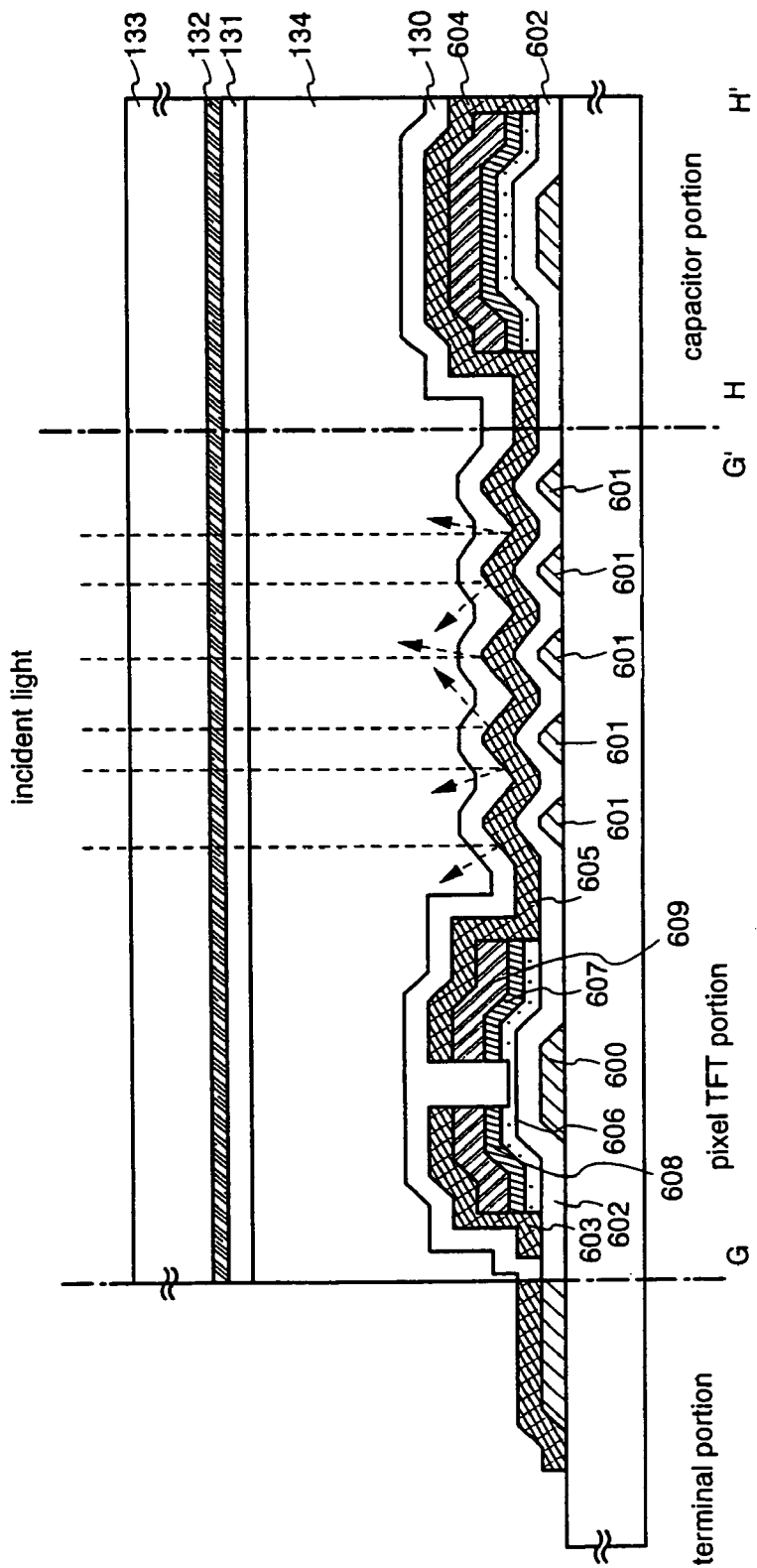

[Fig. 16]
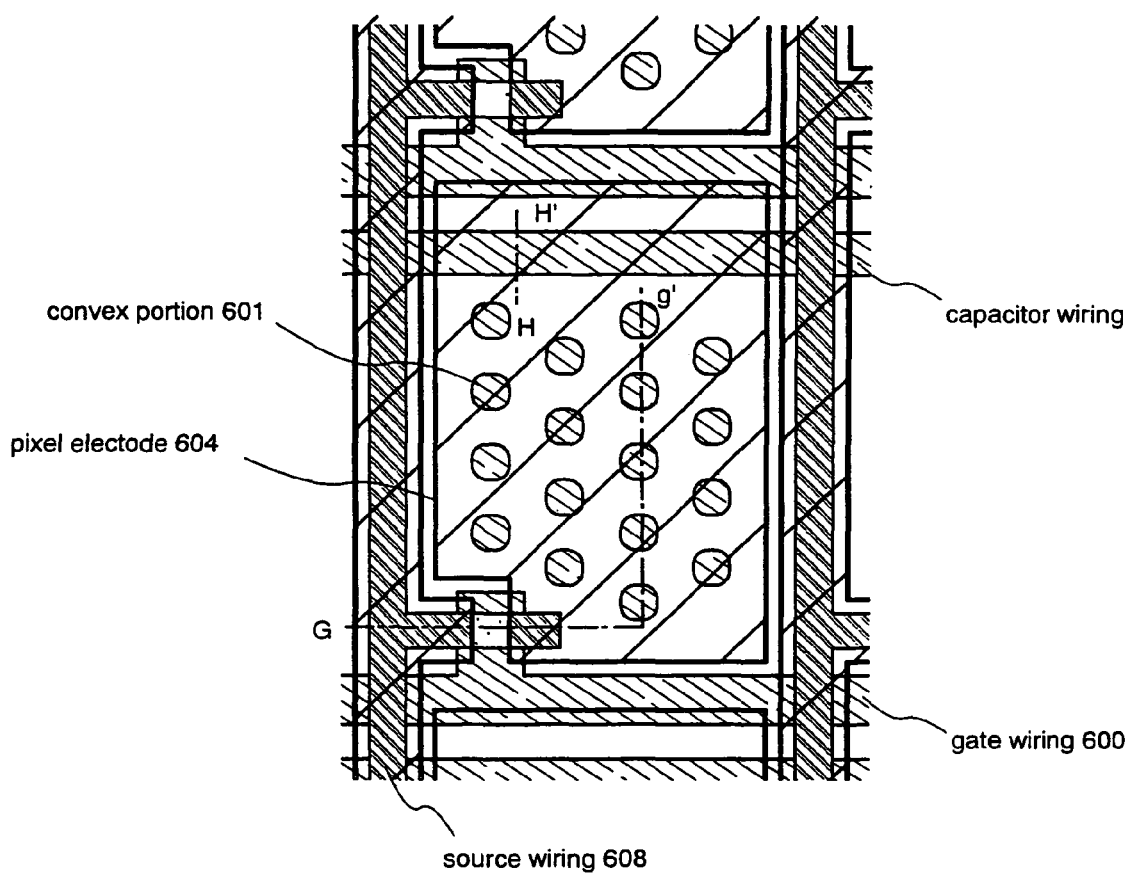

[Fig. 17]
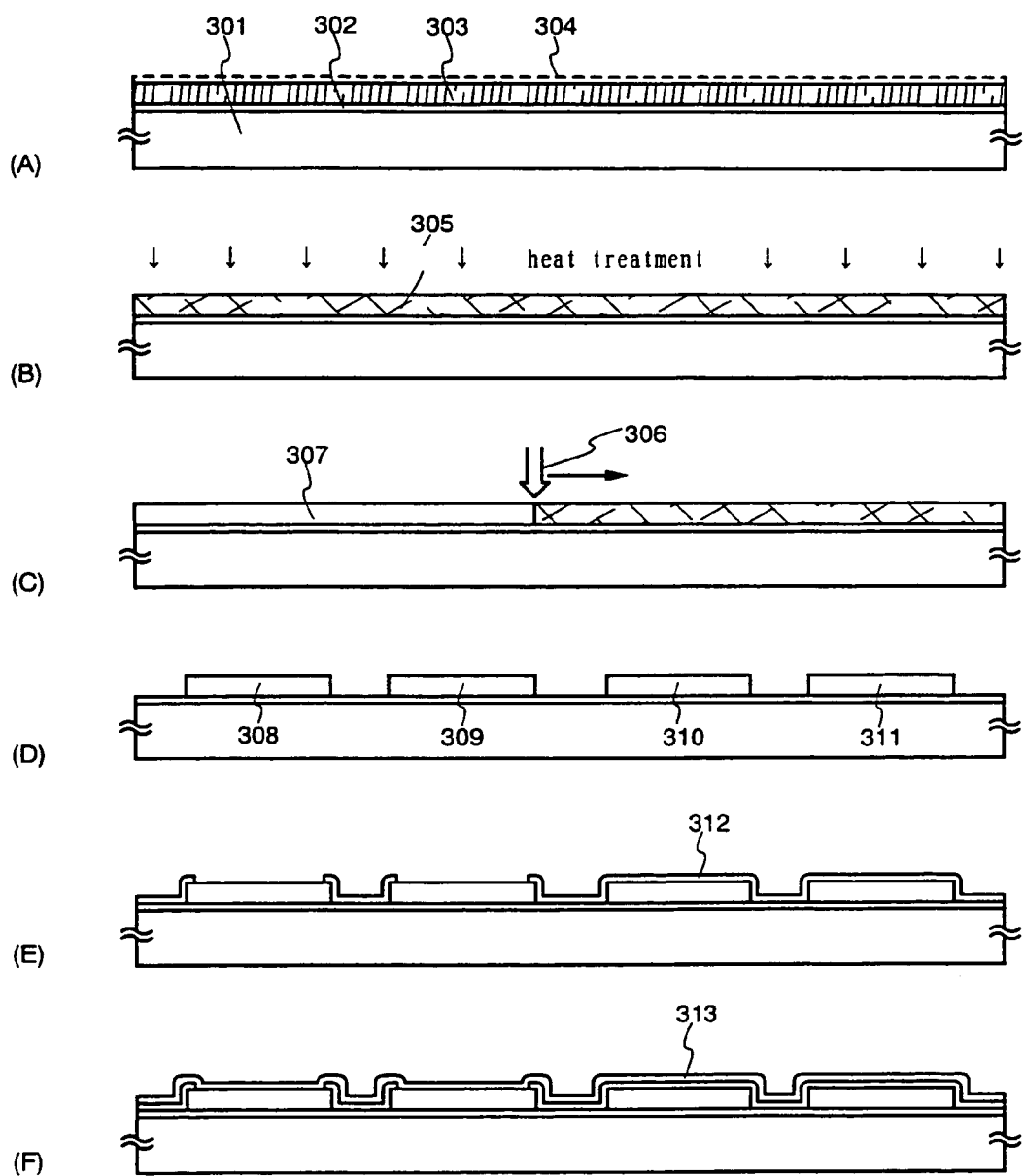

[Fig. 18]
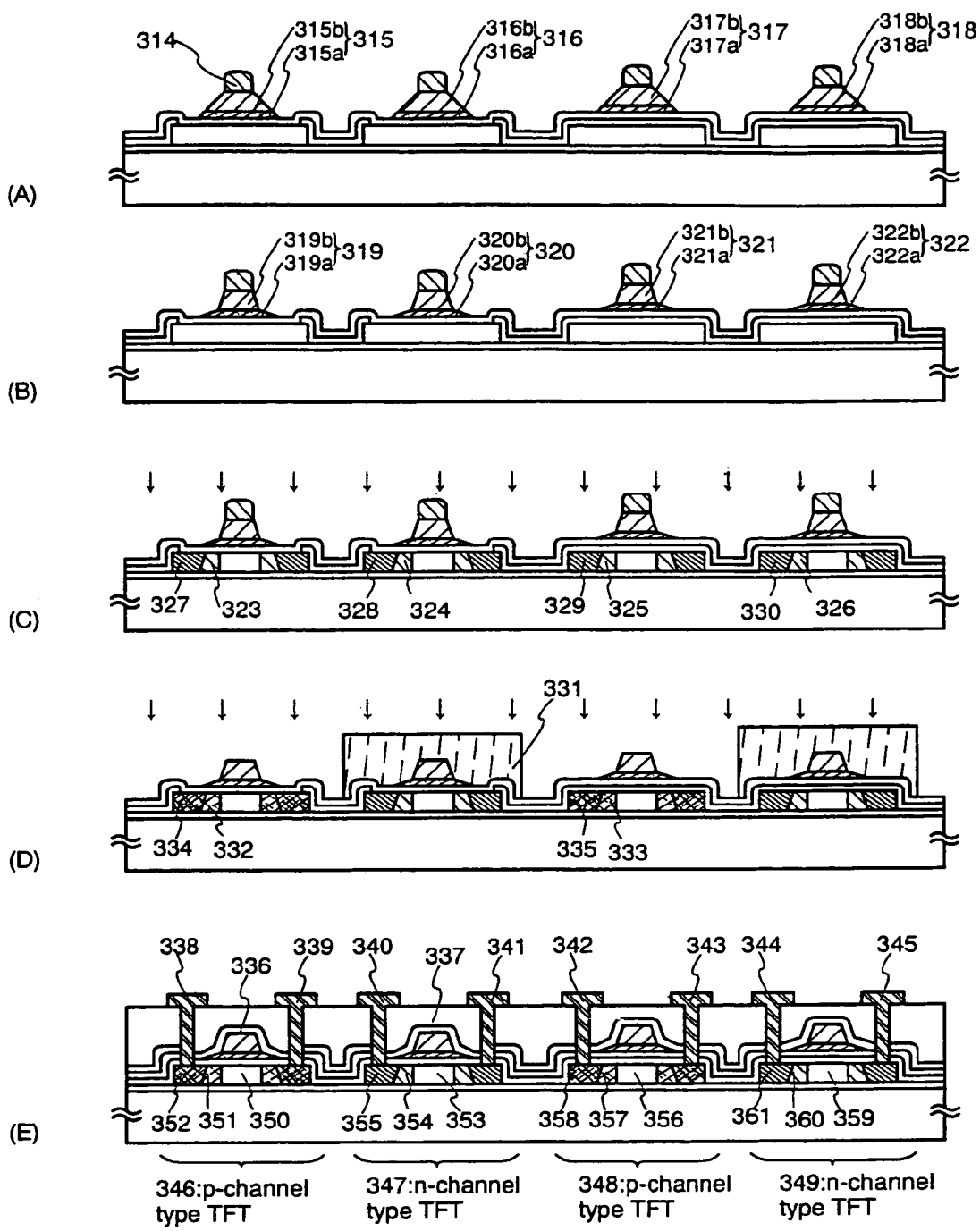

[Fig. 19]
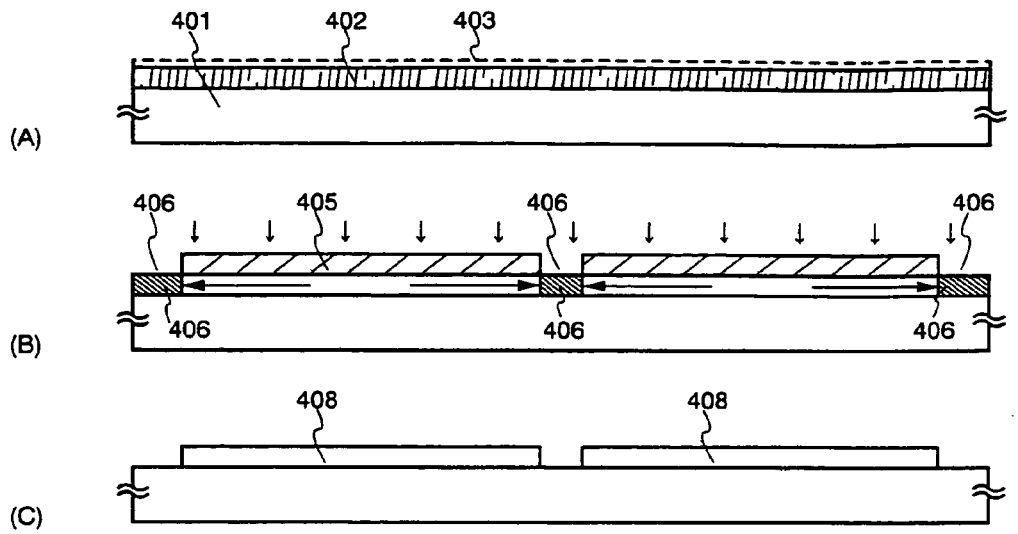
[Fig. 20]
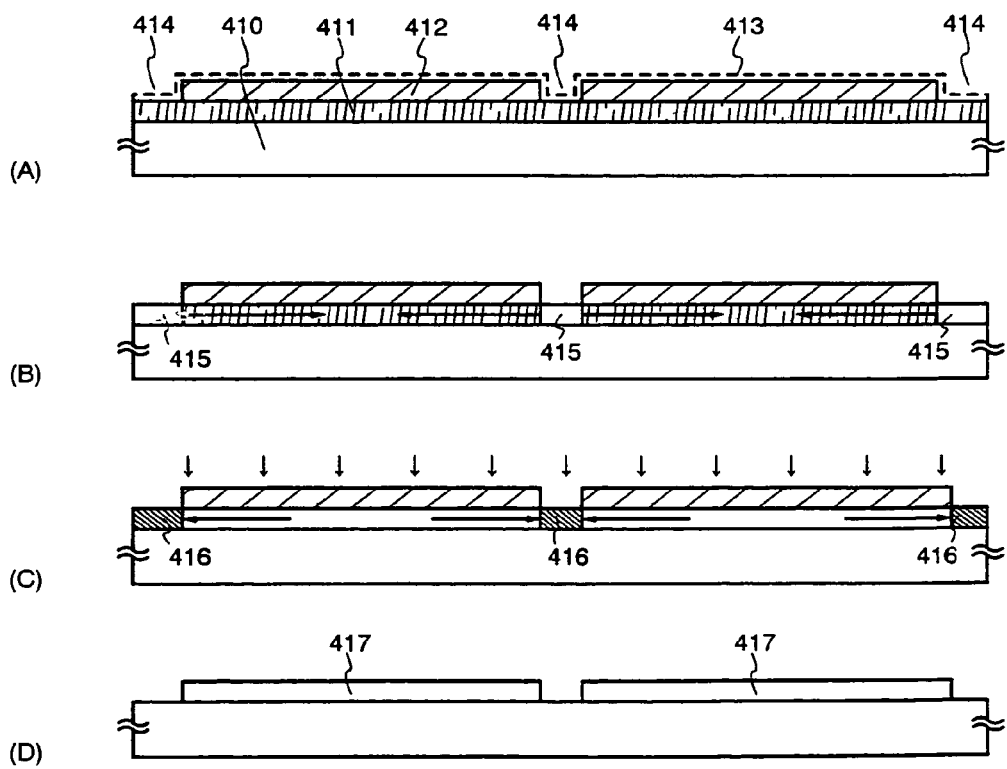

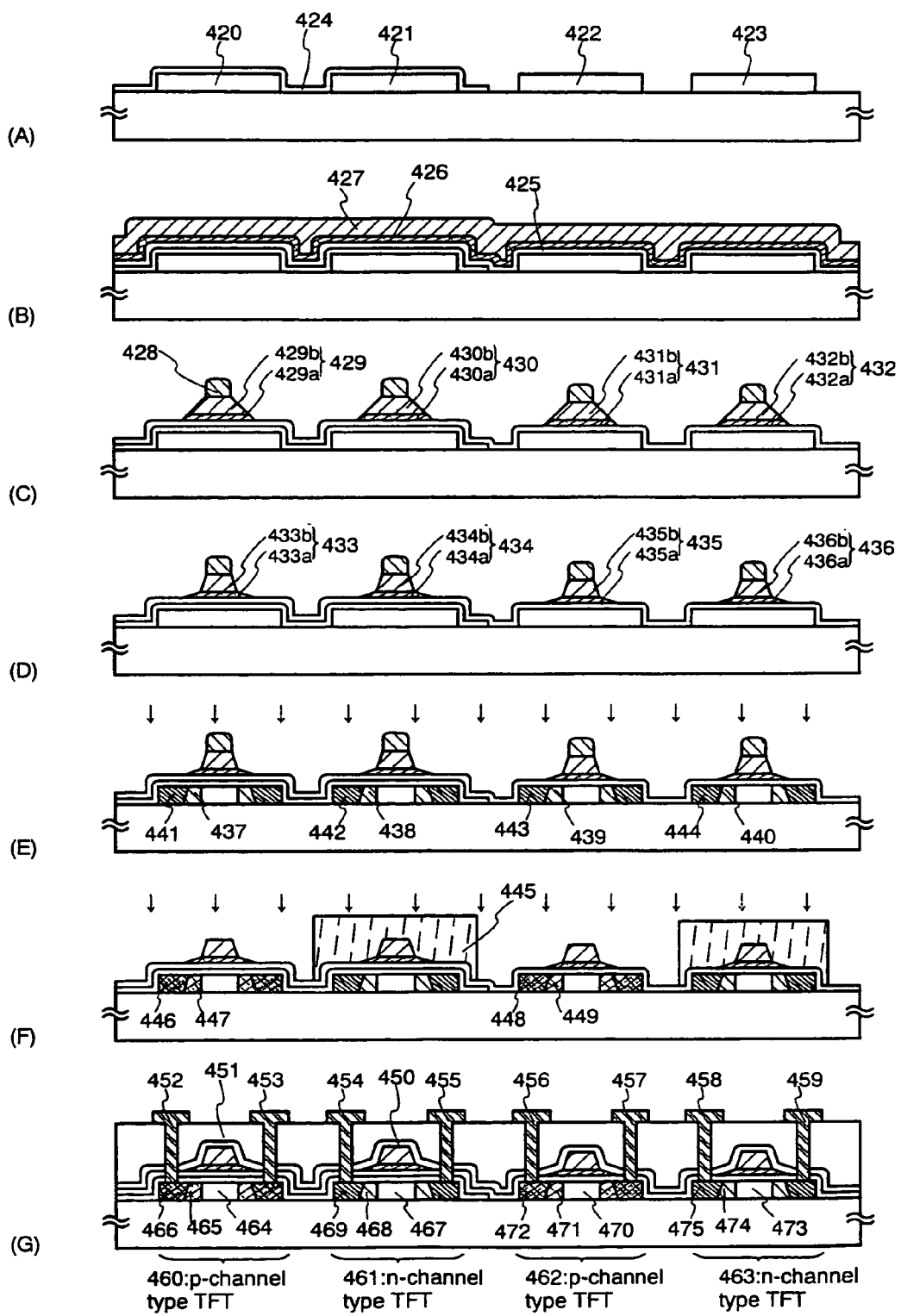
[Fig. 21]

[Fig. 22]
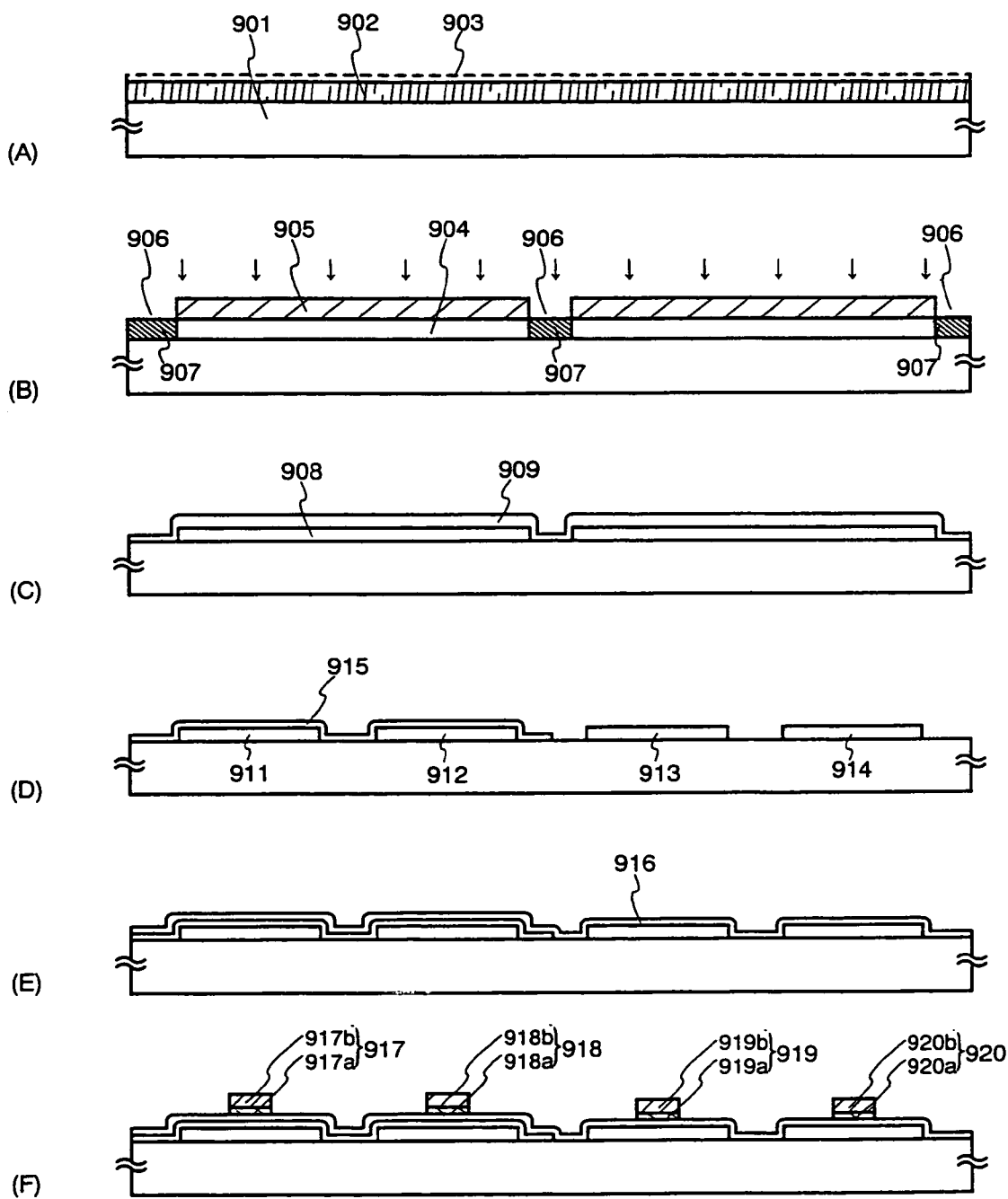

[Fig. 23]
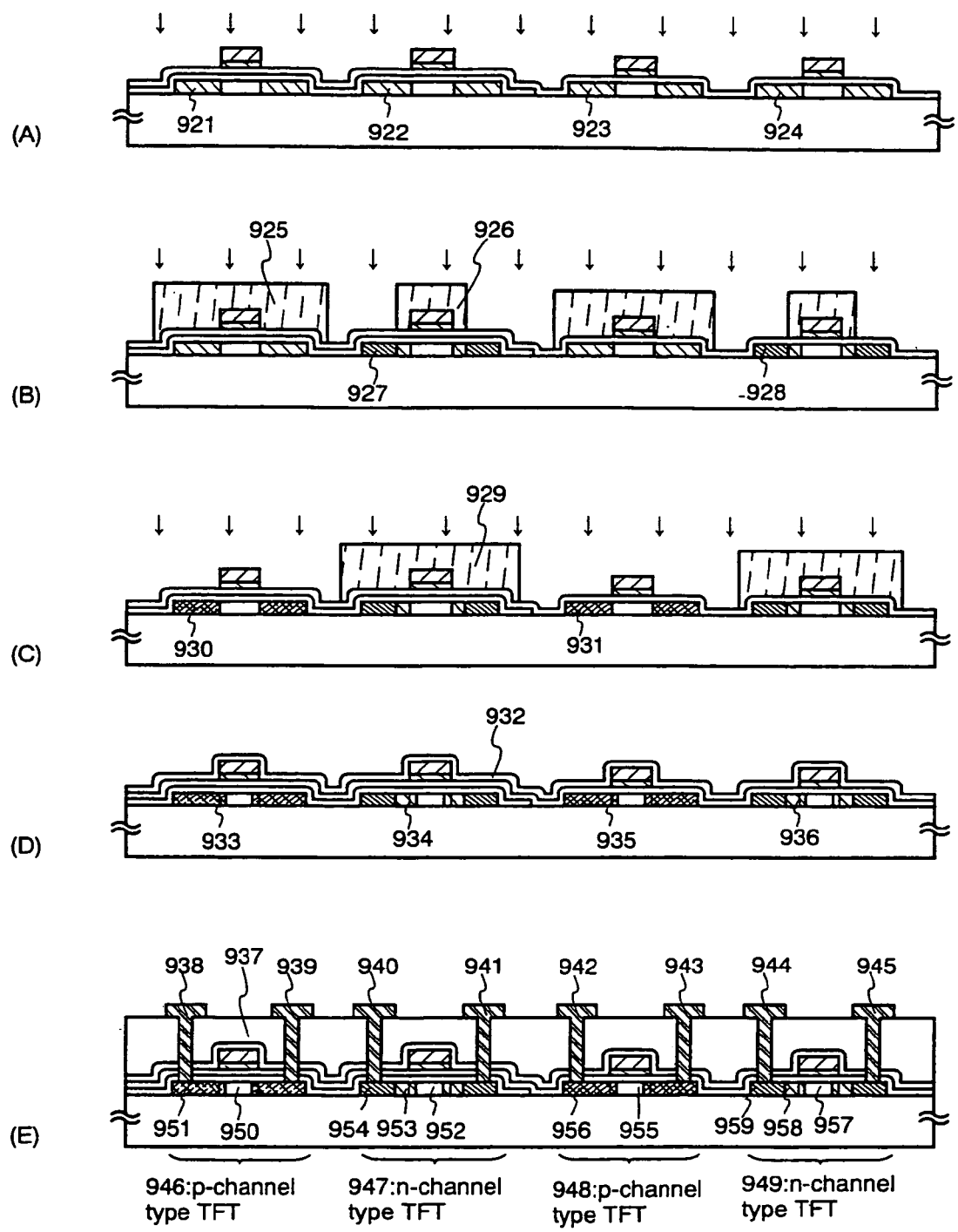

[Fig. 24]
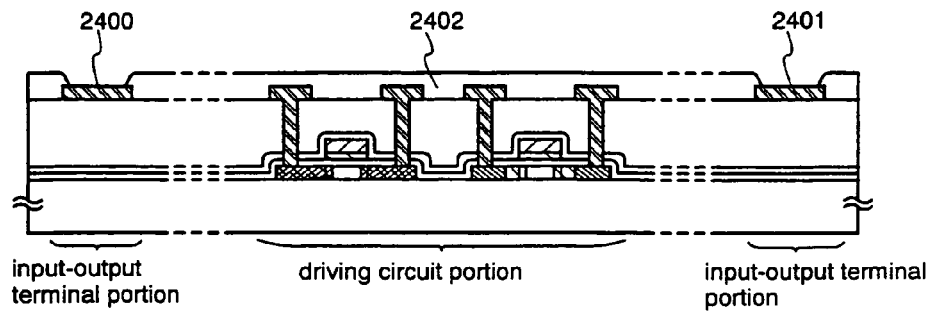
input-output terminal portion    driving circuit portion    input-output terminal portion
[Fig. 25]
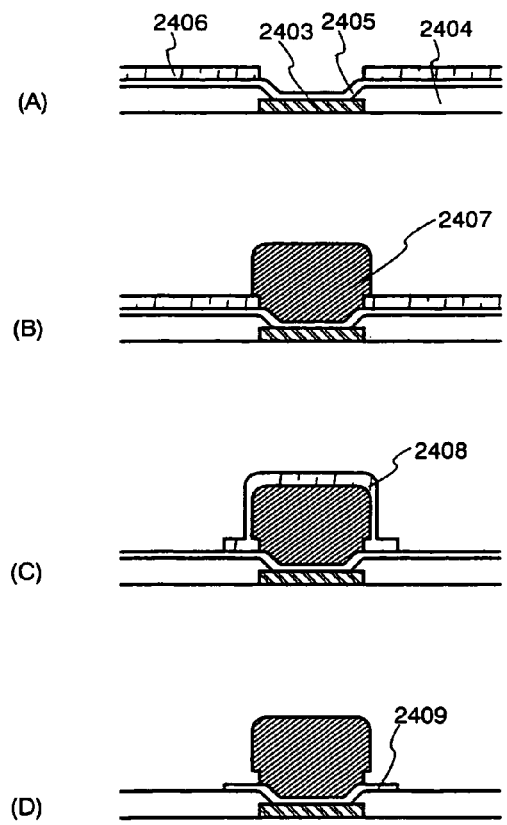

[Fig. 26]
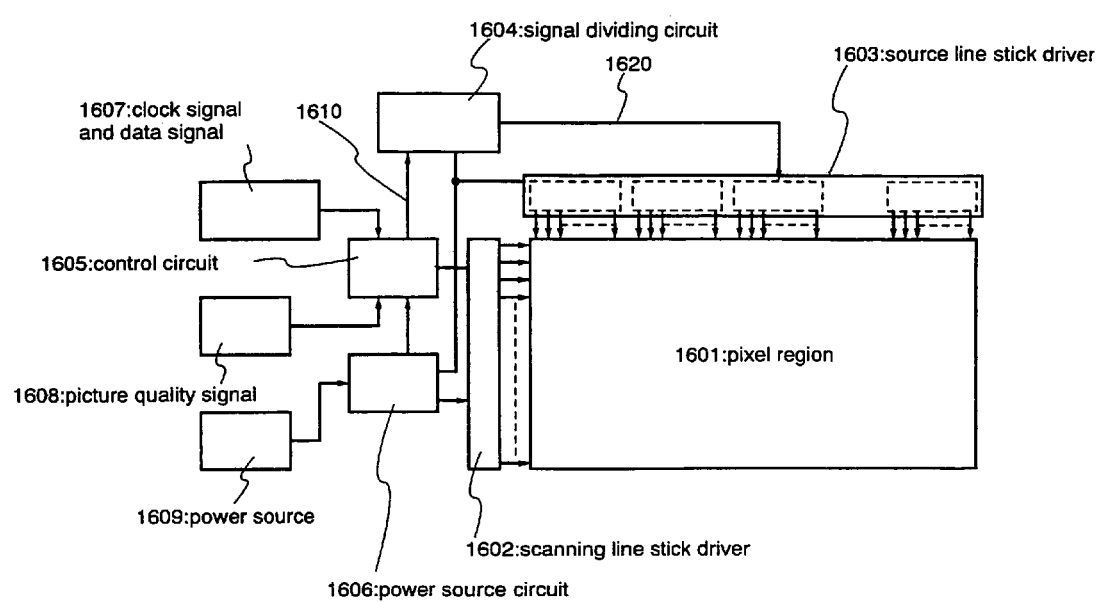

[Fig. 27]
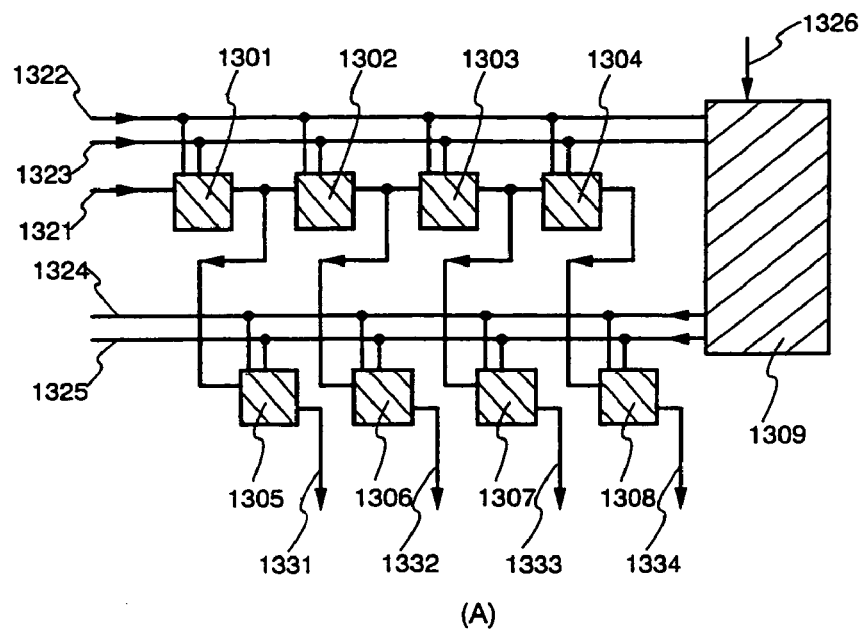
(A)
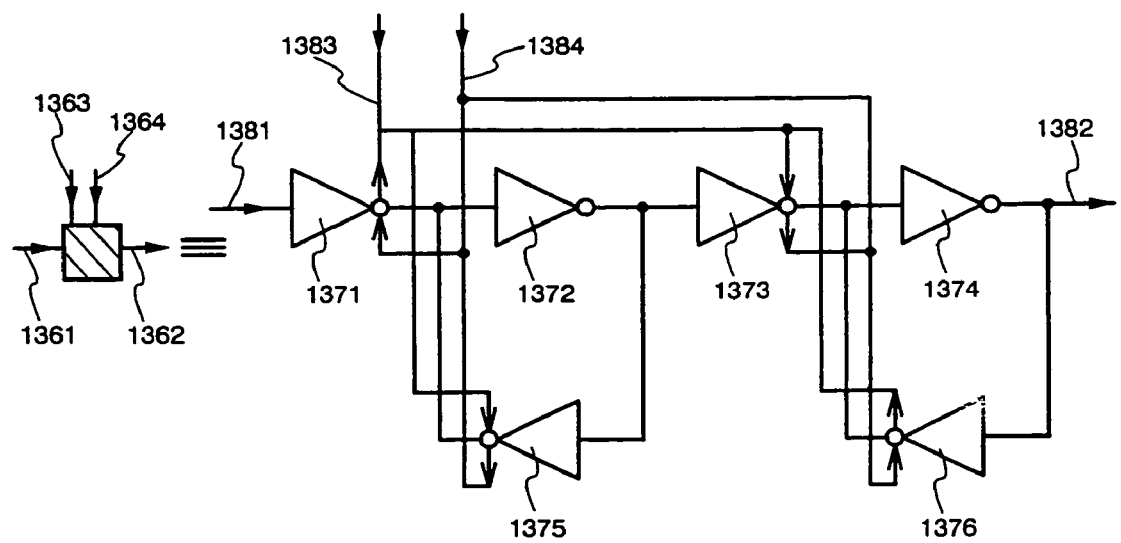
(B)

[Fig. 28]
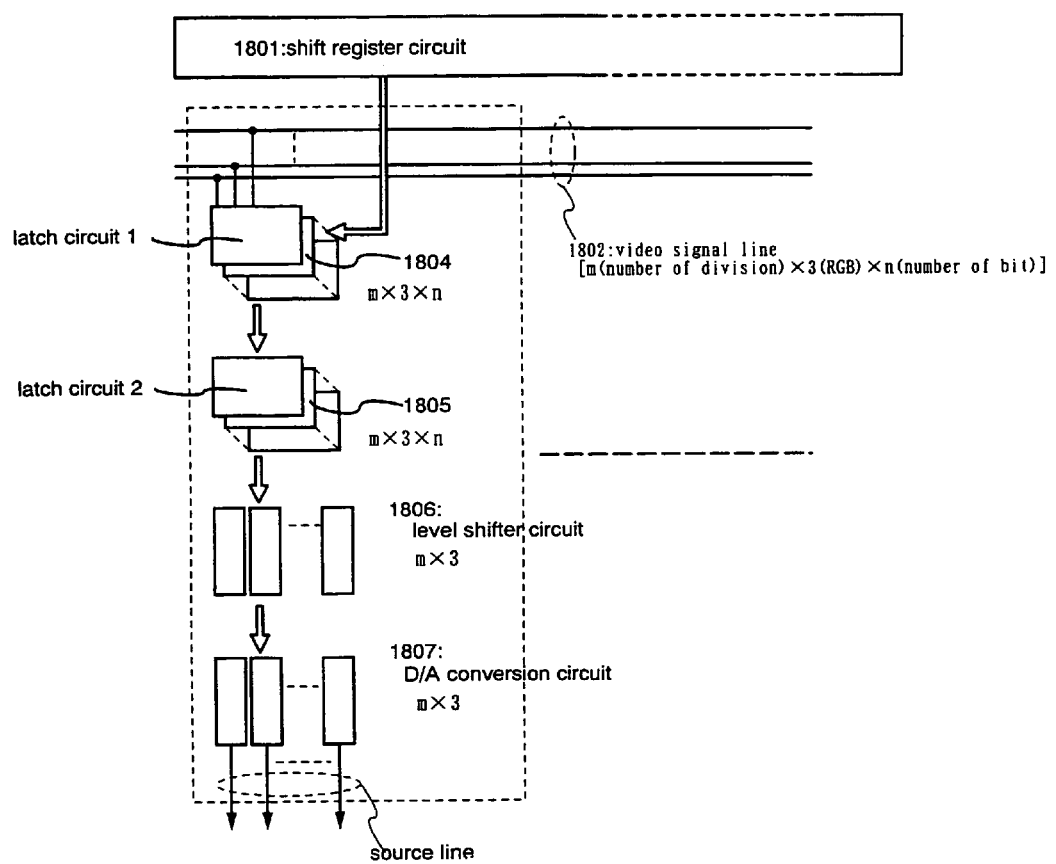

[Fig. 29]
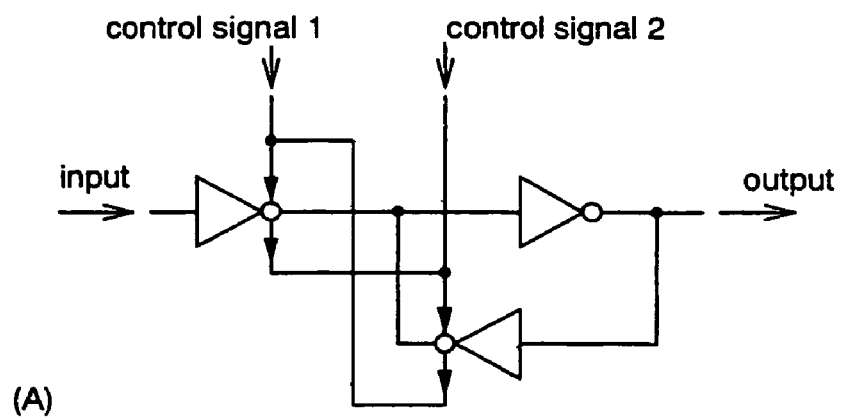
(A)
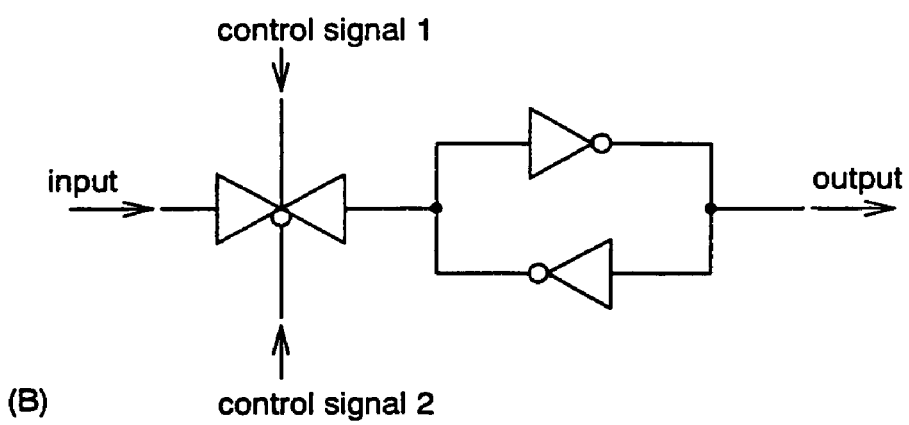
(B)
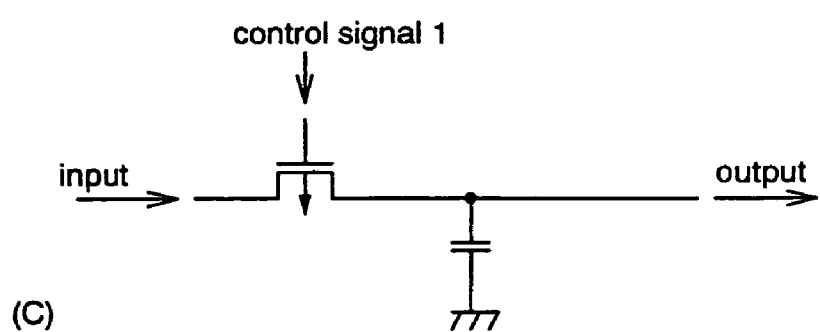
(C)

[Fig. 30]
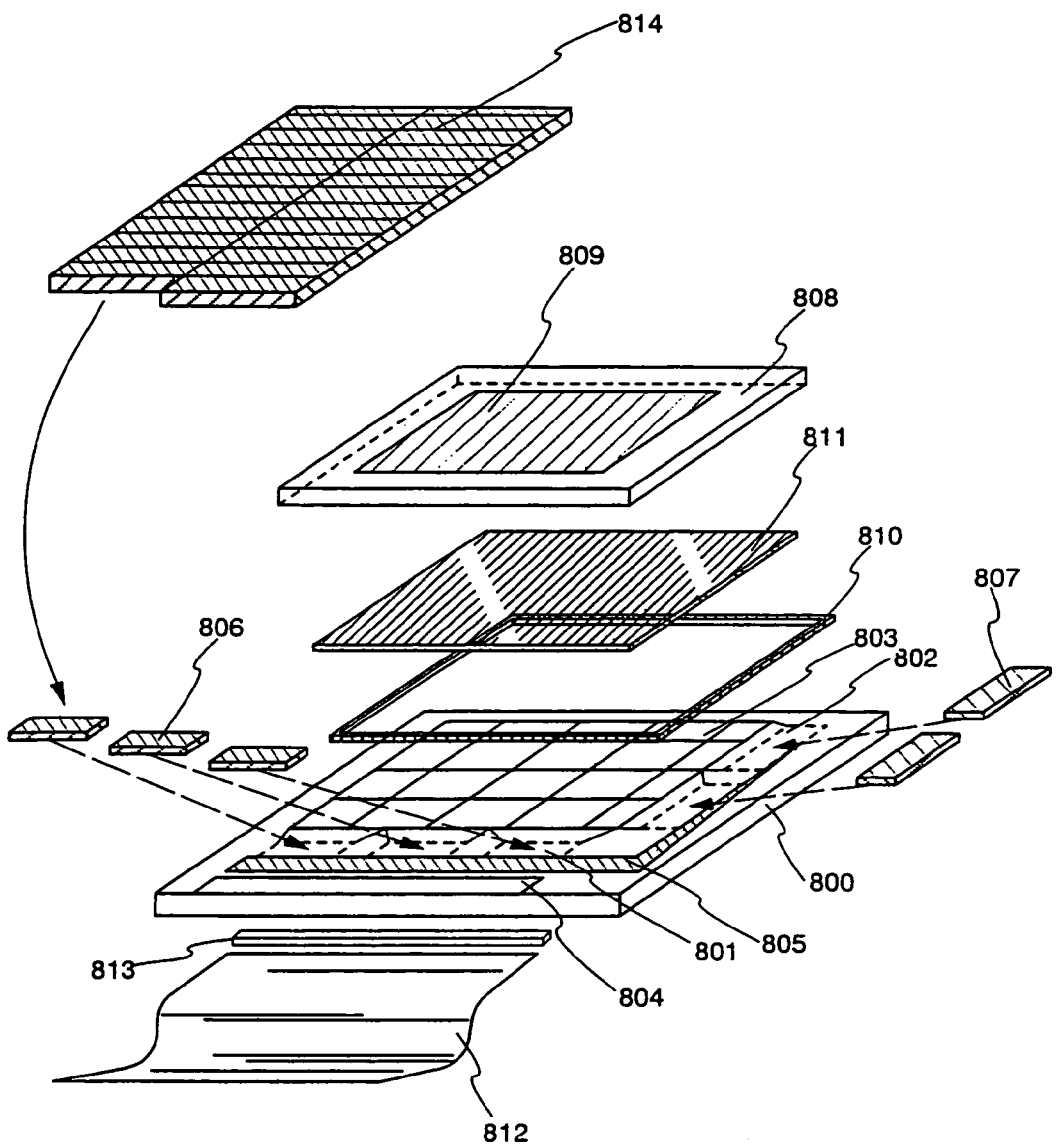
800:first substrate, 801:attaching scanning line side stick driver,
802:attaching source line side stick driver, 803:pixel region,
804:input terminal, 805:connection wiring, 806,807:stick driver,
808:second substrate, 809:opposing electrode, 810:sealing material,
811:liquid crystal, 812:FPC, 813:reinforcing plate, 814:third substrate

[Fig. 31]
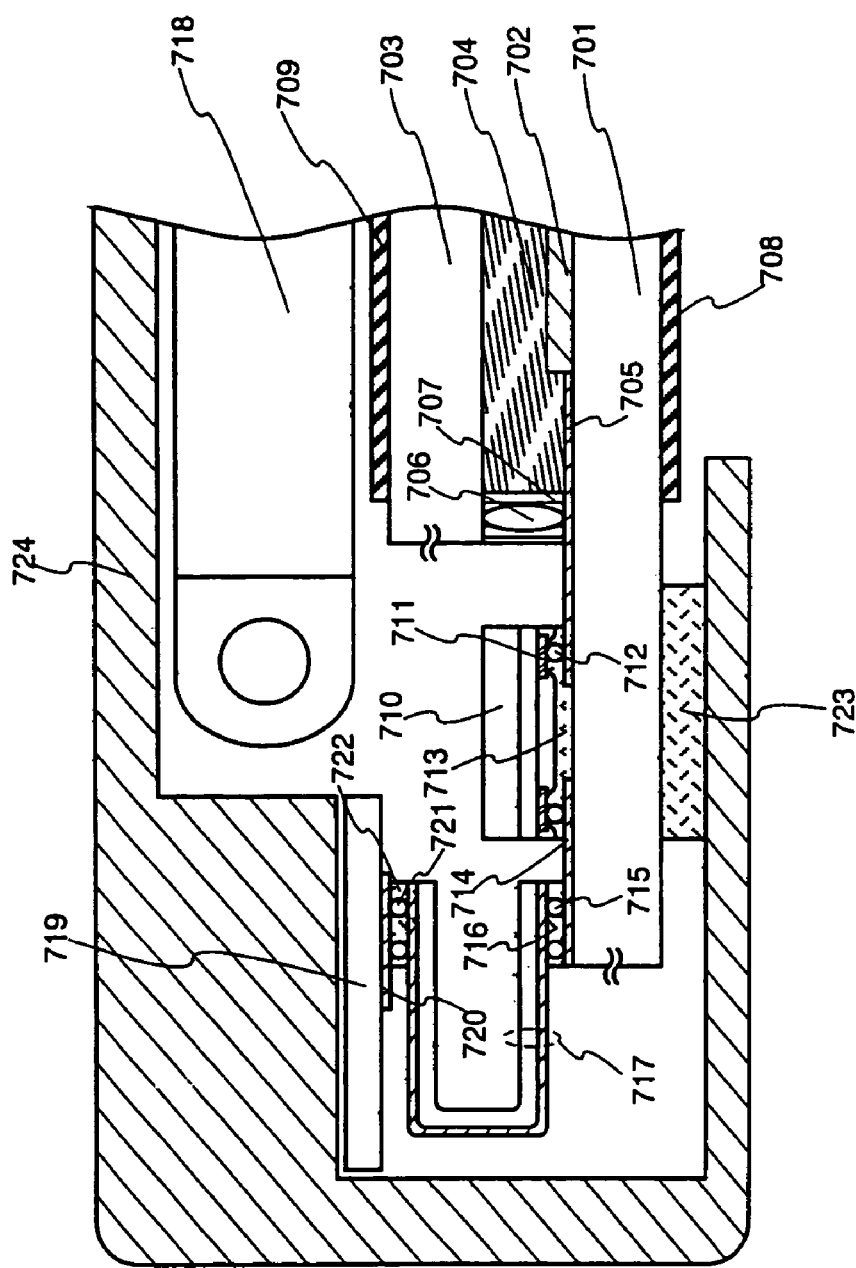

[Fig. 32]
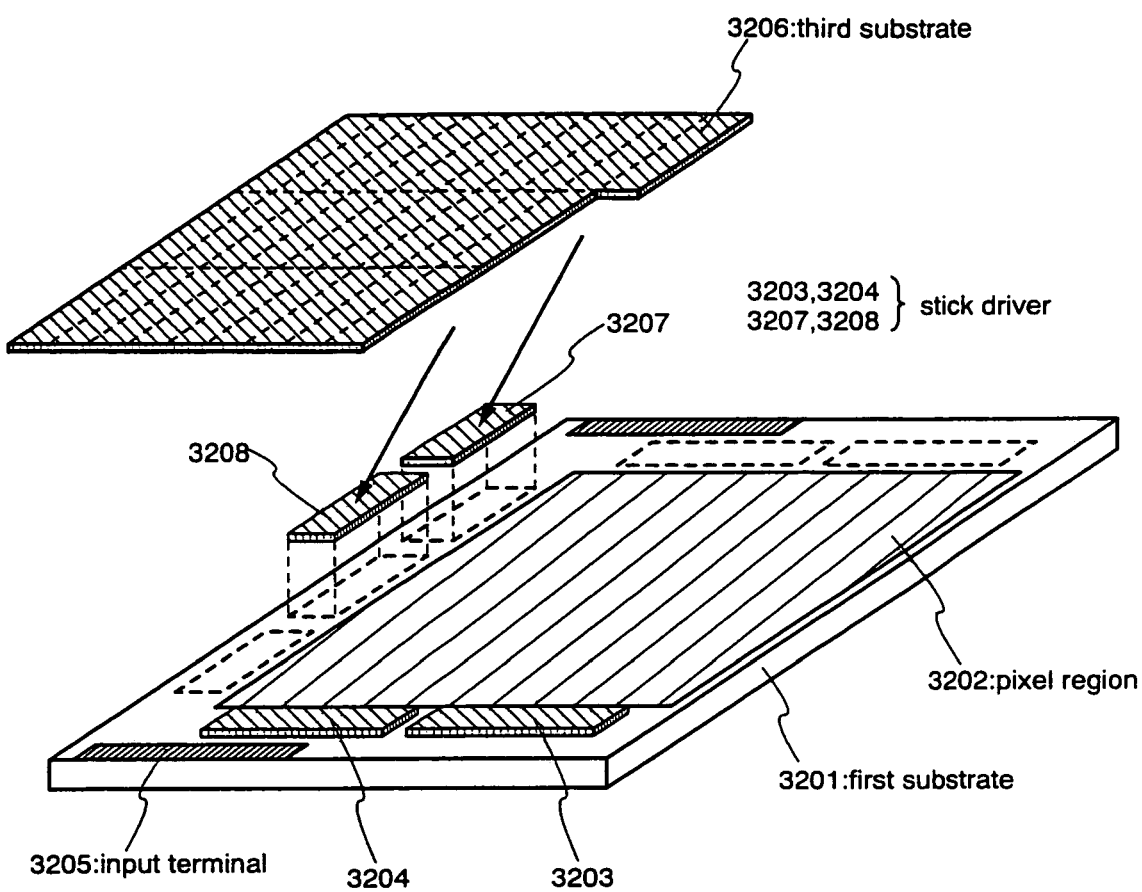

[Fig. 33]
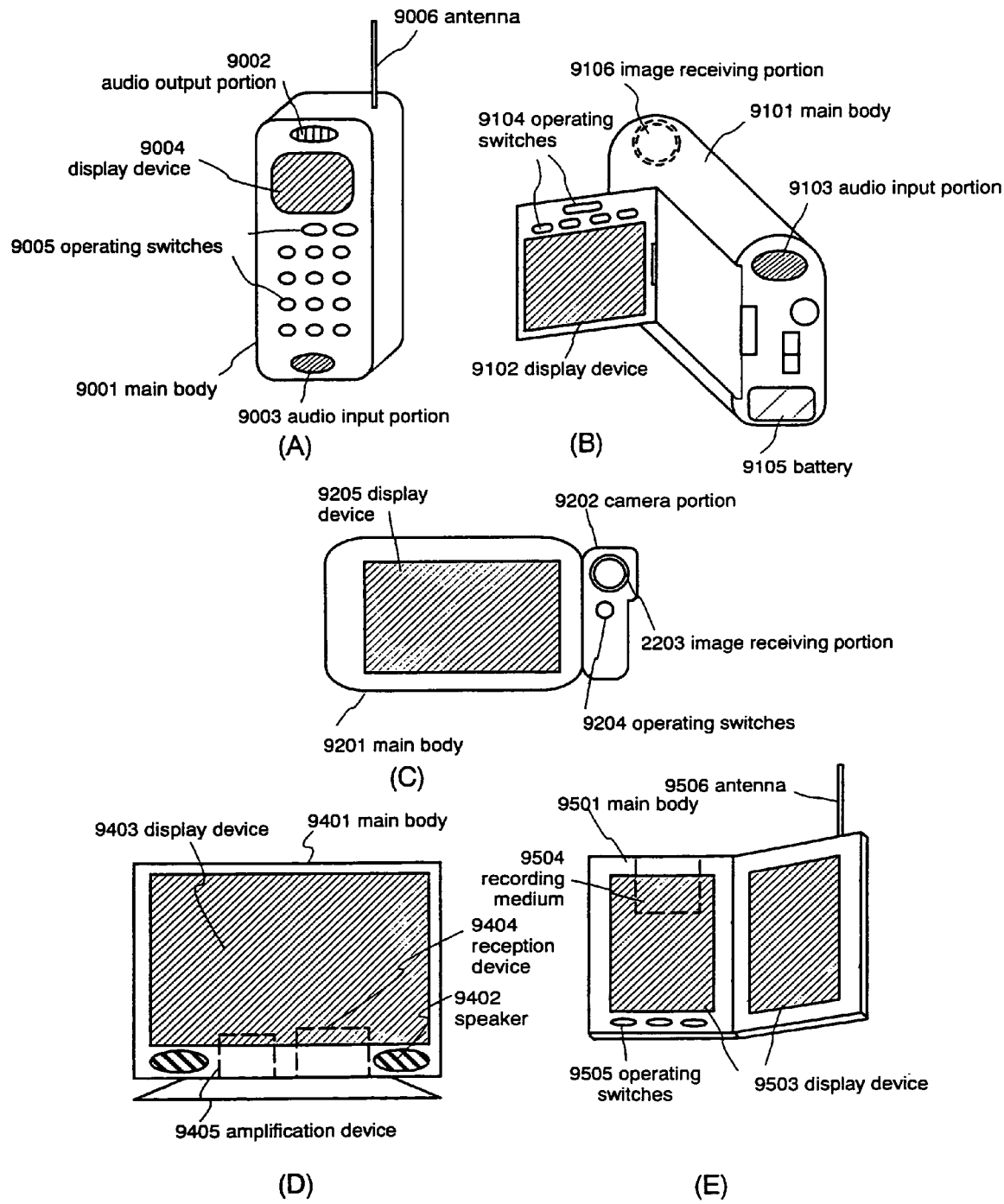

[Fig. 34]
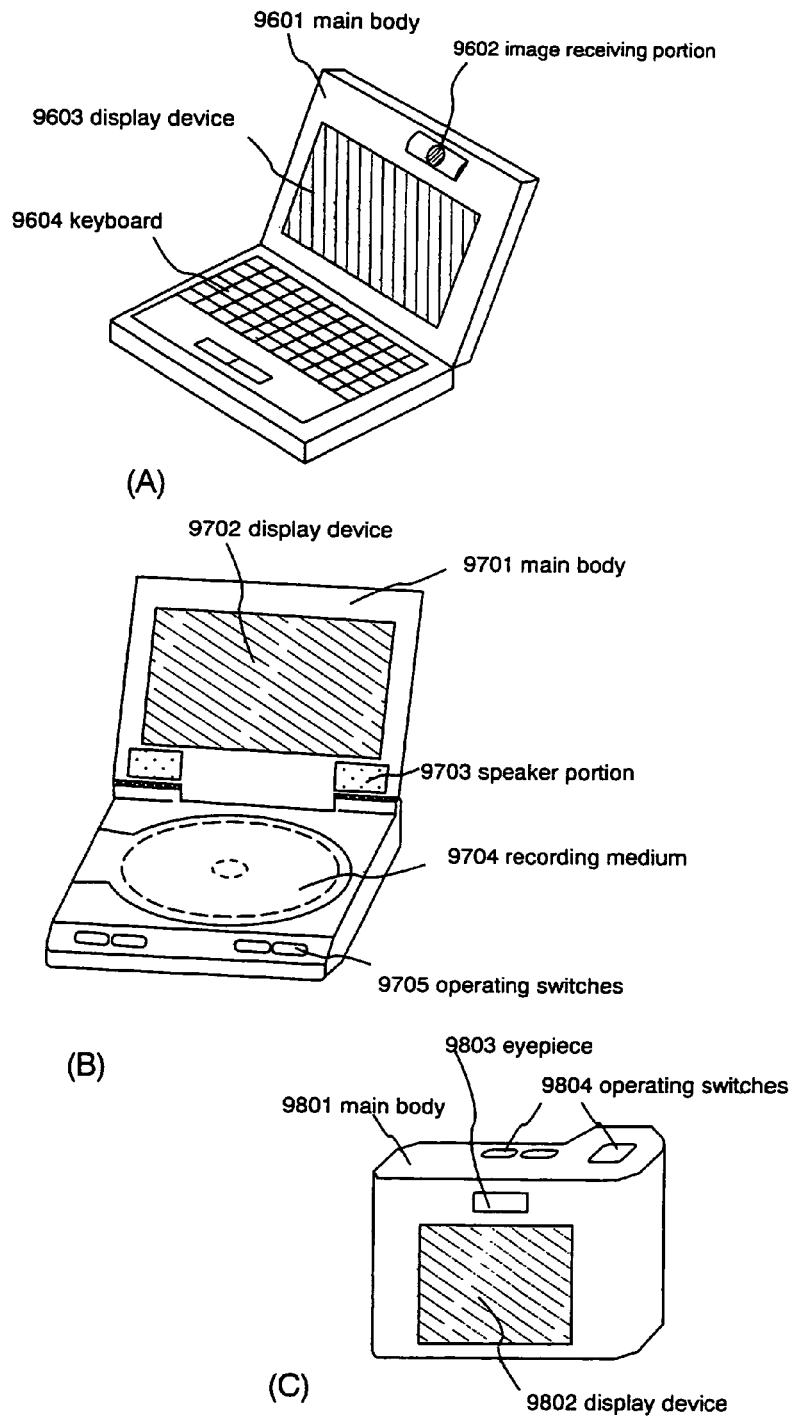

SEMICONDUCTOR DEVICE AND A METHOD OF MANUFACTURING THE SAME

BACKGROUND OF THE INVENTION

1. Field of the Invention

The present invention relates to a semiconductor device having a circuit composed of a thin film transistor (hereafter referred to as TFT), and to a method of manufacturing thereof. In particular, the present invention relates to the structure of each pixel in a pixel region forming a display portion, and to the structure of a driver circuit for transmitting a signal to the pixels. For example, the present invention relates to an electro-optical device, typically a liquid crystal display panel, and to electronic equipment loaded with this type of electro-optical device as a part.

Note that, throughout this specification, semiconductor device denotes a general device which can function by utilizing semiconductor characteristics and that the category of semiconductor devices includes electro-optical devices, semiconductor circuits, and electronic equipment.

2. Description of Related Art

A liquid crystal display device is known as an image display device. Due to the fact that a higher definition image can be obtained in comparison with a passive type liquid crystal display device, active matrix type liquid crystal display devices have come into widespread use. The structure in the active matrix type liquid crystal display device has the orientation of a liquid crystal controlled by application of a voltage to pixels arranged in a matrix shape, and image information displayed on a screen.

The use of this type of active matrix type liquid crystal display device is propagating widely, beginning with portable information terminals, such as a notebook type personal computer (note PC), a mobile computer, and a portable telephone, and continuing to various types of electronic equipment, such as a liquid crystal television. Compared to a CRT, it is possible to make this type of display device lighter weight and thinner, and depending upon its use, there is a demand for giving the screen a large surface area and increasing the density of pixels.

Techniques of forming portions of a TFT, such as a channel forming region, by using an amorphous semiconductor film, typically amorphous silicon, have superior productivity. The amorphous semiconductor film has the characteristic of being able to be formed on a relatively low cost, large surface area substrate, such as barium borosilicate glass and aluminum borosilicate glass. However, the largest value of the electric field effect mobility that can be obtained in a TFT in which the channel forming region is formed from the amorphous silicon film is only on the order of 1 $cm^2$/Vsec. The TFT can therefore be used as a switching TFT (a pixel TFT) formed in the pixel region, but cannot be given the desired operation when forming a driver circuit. Consequently, the driver circuit for controlling the voltage applied to the pixels in accordance with a signal uses an IC chip (a driving IC) manufactured on a single crystal silicon substrate, mounted in the periphery of the pixel region by a TAB (tape automated bonding) method or a COG (chip on glass) method.

The TAB method is a method of packaging in which a wiring is formed on a flexible insulating substrate from a material such as copper foil, an IC chip is installed directly on top, and one edge of the flexible substrate is connected to an input terminal of the display device. On the other hand, the COG method is a method of connecting in which the IC chip is directly joined in accordance with a wiring pattern formed on the substrate of the display device.

Further, the techniques of mounting the driver circuit on the display device substrate, as disclosed in Japanese Patent Application Laid-open No. Hei 7-0148880 and Japanese Patent Application Laid-open No. Hei 11-160734, in which a driver circuit is formed from a TFT manufactured by a non-single crystal semiconductor material on a substrate such as glass or quartz, and partitioned into strips (such substrates having a driver circuit cut into a strip shape are hereafter referred to as stick drivers), have been disclosed as other methods of mounting the driver circuit.

Whichever method is used, it is preferable to make the region in which the driver circuit is mounted as small as possible on the substrate forming the pixel region, and various designs have been ingeniously made for the method of driver circuit mounting, including the wiring layout.

CRTs have been used most as televisions and personal computer monitors. However, as the CRTs are replaced by the liquid crystal display devices from the viewpoint of saving space and of lower power consumption, while making liquid crystal display devices larger in size and higher in definition is promoted, there is also a demand for lowering their production cost.

An active matrix type display device uses a photolithography technique for manufacturing a pixel TFT, and at least five photomasks are used. A photomask is used in order to form a photoresist pattern on a substrate, which becomes a mask for an etching step in the photolithography technique. Using one photomask leads to processes such as applying resist, pre-baking, exposure, development, and post-baking, and in the steps before and after, there are processes such as film formation and etching, and in addition, processes such as resist peeling, supplemental cleaning, and drying. Consequently, the work related to manufacturing becomes complicated, which is a problem.

Reduction of the number of process steps is considered as an effective means in order to increase productivity and to increase yield. However, there is also a limit in the reduction of manufacturing cost if the number of photomasks is not reduced.

Further, static electricity is generated by causes such as friction during manufacturing steps because the substrate is an insulator. If static electricity is generated, then short circuits develop an intersection portion of wirings formed on the substrate, and deterioration or breakage of the TFT due to static electricity leads to display faults or deterioration of image quality in electro-optical devices. In particular, static electricity develops during rubbing in the liquid crystal process performed in the manufacturing steps, and this becomes a problem.

In addition, if the number of pixels increases, then the number of IC chips installed will also inevitably become large. With an RGB full color display XGA panel the number of terminals on the source line side of the pixel region alone becomes approximately 3000, and 4800 are necessary with UXGA. The size of the IC chip is limited by the wafer size in the manufacturing process, and the practical size limit of the longer side is on the order of 20 mm. Even with an output terminal pitch of 50 µm, one IC chip can only cover 400 connection terminals. Approximately 8 IC chips are required on the source line side only in the above XGA panel, and on the order of 12 are necessary for the UXGA panel.

A method of manufacturing a long size IC chip has also been considered, but the number of strip shape IC chips which can be cut out from a circular shape silicon wafer is naturally lowered, and therefore the method is not practical. In addition, the silicon wafer itself has a fragile nature, and if a rather long IC chip is manufactured, then the probability of failures increases. Furthermore, the mounting of the IC chips requires precise placement of the same and reduction in contact resistance of the terminal portion. If the number of IC chips joined to one panel increases, then the likelihood of defects developing increases, which leads to a fear of reducing the yield. In addition, the temperature coefficient of the silicon which becomes the substrate of the IC chip differs from the temperature coefficient of the glass substrate on which the pixel region is formed, and therefore problems such as warping develop after the two substrates are joined. This becomes a cause of a lowering in the reliability of the element due to the developed mechanical stress, as well as of direct defects such as an increase in the contact resistance.

On the other hand, it is possible to form the driver circuit with a length equal to that of the pixel region by using the stick driver, and mounting of the driver circuit can be performed by forming one stick driver. However, if the amount of surface area of the circuit portion increases, the number of stick drivers which become defective due to a single point defect increases, and therefore the number which can be cut out of one substrate is reduced, inviting a reduction in the process yield.

From the standpoint of productivity, a method of forming a plurality of stick drivers from TFTs manufactured from a crystalline semiconductor film on a large surface area glass substrate or quartz substrate is considered superior. However, the driving frequency differs between the scanning line side and the source line side, and further, the value of the driving voltage applied also differs. Specifically, the TFTs in the stick driver of the scanning line side must withstand on the order of 30 V, while the driving frequency is equal to or less than 100 KHz, and therefore no high speed characteristics are required. A voltage resistance on the order of 12 V is sufficient for the TFTs in the stick driver of the source line side, but high speed operation on the order of a driving frequency of 65 MHz at 3 V is required. Thus it is necessary to make the structure of the stick driver and the TFTs within the drivers different due to the different specifications required.

Based on this background, the realization of a reduction in steps for manufacturing a pixel TFT of a liquid crystal display device, reducing manufacturing costs and increasing yield, is a first object of the present invention. Further, a method of manufacturing a driver circuit, formed from TFTs which satisfy the characteristics required by each circuit and which are formed at the same time on a large surface area substrate such as a glass substrate; providing a display device which mounts that type of driver circuit; and providing a technique of improving reliability and productivity, are second objects of the present invention.

SUMMARY OF THE INVENTION

A first means for solving the above problems is characterized by forming a pixel TFT, which is formed in a pixel region, by using a channel etch type reverse stagger type TFT, and by performing patterning of a source region and a drain region, and patterning of a pixel electrode, by using the same photomask.

A method of manufacturing a pixel TFT of the present invention is simply explained with reference to FIG. 1. First, a gate wiring 102 and a capacitor wiring 103 are formed by patterning using a first mask (first photomask). Next, an insulating film (a gate insulating film), a first semiconductor film, a single conductivity type second semiconductor film, and a first conductive film are formed in order.

The first conductive film, the single conductivity type second semiconductor film, and the first semiconductor film are etched into predetermined shapes by using a second mask (a second photomask), delineating a channel forming region and a source or a drain region of the pixel TFT, along with patterning a source wiring and a drain electrode. A second conductive film is formed next in order to form a pixel electrode.

The second conductive film is etched using a third mask (a third photomask), forming a pixel electrode 119. In addition, the first conductive film and the single conductivity type second semiconductor film remaining on the channel forming region of the pixel TFT are removed by etching. A large etching selectivity cannot be taken with this process, and consequently a portion of the first semiconductor film is also etched.

The number of photomasks required for the manufacture of the pixel TFT can be reduced to three by this type of process. For cases of forming a protecting insulating film on the pixel TFT, it is necessary to form an opening in the pixel electrode, and therefore one additional photomask is necessary. The source wiring may be covered by the second conductive film, made from the same material as the pixel electrode, which can make a structure that protects the entire substrate from external static electricity or the like. Furthermore, a structure may be used in which a protecting circuit is formed using the second conductive film in a region other than the pixel TFT portion. By using this type of structure, generation of static electricity due to friction between manufacturing devices and the insulating substrate can be prevented in the manufacturing steps. In particular, the TFTs can be protected from static electricity generated during rubbing in the liquid crystal orientation process in the manufacturing steps.

In order to obtain a bright display for a reflecting type liquid crystal display device, there is a method of forming a pixel electrode having optimal reflective characteristics by making the surface of the pixel electrode rough. The present invention is also applied to this type of reflecting liquid crystal display device, and therefore it is not necessary to increase the number of photomasks. A method is used in which the surface of the pixel electrode is made rough by forming separate island shape patterns under the pixel electrode when forming the gate wiring. Only the gate insulating film and the pixel electrode are formed on this pattern, and therefore the surface of the pixel electrode can be formed having a roughened shape corresponding to the pattern.

A second means for solving the above problems is characterized in that, in a display device having a first substrate in which a pixel region is formed, and having a second substrate in which an opposing electrode is formed, a driver circuit formed using a TFT having a crystalline semiconductor layer and an input-output terminal dependent on the driver circuit are taken as a single unit to form a plurality of the units on a third substrate, and in that stick drivers obtained by partitioning the third substrate into separate units are mounted to the first substrate.

The structure of each circuit of the stick driver differs between the scanning line side and the source line side, and characteristics such as the thickness of the gate insulating film of the TFT and the channel length are made different depending upon the required circuit characteristics. For example, on the scanning line side, a stick driver composed of a shift register circuit, a level shifter circuit, and a buffer circuit, the TFT of the buffer circuit, which is required to withstand 30 V, has a gate insulating film which is thicker than that of the TFT of the shift register circuit. Further, on the source line side, a stick driver composed of a shift register circuit, a latch circuit, a level shifter circuit, and a D/A convertor circuit, the thickness of the gate insulating film of the shift register circuit and the latch circuit is made thin, and the channel length is formed shorter than that of the other TFTs in order to drive the stick driver at a high frequency.

Further, a means of lowering the frequency of a digital signal input to the stick driver is provided by forming a signal dividing circuit, formed in the source line side which requires a high frequency digital signal input. The load of the TFT of the stick driver is thus reduced, increasing the reliability of the driver circuit. The signal dividing circuit is provided with n input portions and m×n output portions, and by receiving the input signal from each of the n input portion, and by sending out a digital signal, in which the pulse length of the input digital signal is corrected by being expanded in time, from the m×n output portions, the frequency of the input digital signal is reduced. The corrected digital signal may be expanded in time to several times the length of the input digital signal pulse.

The fundamental concept of the present invention is shown in FIG. 32. A plurality of driver circuits are formed on a first substrate 3201, on which a display region 3202 is formed, and on a third substrate 3206, and stick drivers extracted by cutting the third substrate 3206 into a strip shape or a rectangular shape at each driver circuit, are joined to the first substrate. The structure of the driver circuits differs between the scanning line side and the source line side, but on each side a plurality of stick drivers are mounted. A form of mounting in which the scanning line driver circuit is formed from stick drivers 3203 and 3204, and in which the source line driver circuit is formed from stick drivers 3207 and 3208 is shown in FIG. 32.

From the point of view of increasing productivity, the stick driver is suitable in that a plurality are built on the large surface area of the third substrate. For example, a plurality of circuit patterns may be formed on the large surface area substrate, with dimensions of 300×400 mm or 550×650 mm, for making a single unit of the driver circuit portion and the input-output terminal, and then may finally be partitioned and removed. The length of the shorter side of the stick driver is set from 1 to 6 mm, and the length of the longer side is made between 15 and 80 mm. In partitioning to such size, a method of forming an outline on the surface of the glass substrate by utilizing an instrument such as a diamond tip, and then acting with an external force to break along the outline, can be performed. A machine for performing this type of process is referred to as a glass scriber, and the working width of the edge must be not less than 100 μm, and it is necessary to have an allowance of a 100 to 500 μm clearance. Further, there is also an error of _100 μm in the positional alignment precision of markers formed on the substrate. Therefore, it is necessary to have a 1 to 5 mm clearance in order to cut out stick drivers having a short side length of 2 mm using the glass scriber, and therefore there is a limit on how many stick devices can be taken from one substrate. On the other hand, a dicing device using a blade dicing method of cutting a silicon wafer into several dies has a blade width of 0.02 to 0.05 mm, and even considering the positional alignment precision, the substrate can be partitioned at a precision equal to or less than 100 μm.

Consequently, a method of effectively taking out stick drivers from one substrate is a method of dividing into a processing region for cutting by the low working precision glass scriber, and into a processing region for cutting by the high working precision dicing device. Specifically, a group is made from a region having a length of 100 to 200 mm on a side, and a plurality of stick drivers having a short side length of 1 to 6 mm are placed within the group. The partitioning between groups is then performed using the glass scriber, and the dicing device is used in order to remove the stick drivers from the partitioned groups.

Further, the stick drivers on the source line side have a channel length set from 0.3 to 1 μm, and in addition, in order to form the required circuits within the limited surface area as stated above, the stick drivers are formed with a design rule that is smaller than that of the stick drivers on the scanning line side. A technique of exposure using a stepper method is employed as a preferable method.

BRIEF DESCRIPTION OF THE DRAWINGS

[FIG. 1] A drawing showing a pixel structure of the present invention.

[FIG. 2] A cross-sectional drawing explaining a process of manufacturing a pixel TFT, a storage capacitor, and a terminal portion.

[FIG. 3] A cross-sectional drawing explaining the process of manufacturing the pixel TFT, the storage capacitor, and the terminal portion.

[FIG. 4] A top view explaining the process of manufacturing the pixel TFT and the storage capacitor.

[FIG. 5] A top view explaining the process of manufacturing the pixel TFT and the storage capacitor.

[FIG. 6] A diagram explaining the arrangement of a pixel region and a stick driver.

[FIG. 7] A block diagram explaining the circuit structure of a pixel region and a stick driver.

[FIG. 8] A cross-sectional diagram explaining the structure of a stick driver.

[FIG. 9] A diagram explaining an example of a method of mounting a stick driver.

[FIG. 10] A diagram explaining the example of a method of mounting the stick driver.

[FIG. 11] A top view and a cross-sectional diagram of an input terminal section.

[FIG. 12] A cross-sectional diagram explaining a structure of a pixel TFT, a storage capacitor, and a terminal portion.

[FIG. 13] A diagram explaining a composition of a multi-chamber type manufacturing device.

[FIG. 14] A diagram explaining a composition of a single chamber successive film deposition type manufacturing device.

[FIG. 15] A cross-sectional diagram of a reflecting type liquid crystal display device.

[FIG. 16] A top view of a pixel of the reflecting type liquid crystal display device.

[FIG. 17] A diagram explaining a process of manufacturing TFTs forming a driver circuit of a stick driver.

[FIG. 18] A diagram explaining the process of manufacturing the TFTs forming the driver circuit of the stick driver.

[FIG. 19] A diagram explaining a process of manufacturing TFTs forming a driver circuit of a stick driver.

[FIG. 20] A diagram explaining a process of manufacturing TFTs forming a driver circuit of a stick driver.

[FIG. 21] A diagram explaining a process of manufacturing TFTs forming a driver circuit of a stick driver.

[FIG. 22] A diagram explaining a process of manufacturing TFTs forming a driver circuit of a stick driver.

[FIG. 23] A diagram explaining the process of manufacturing the TFTs forming the driver circuit of the stick driver.

[FIG. 24] A cross-sectional diagram explaining the composition of a terminal portion of a stick driver.

[FIG. 25] A manufacturing process diagram of a bump formed in an input-output portion of a stick driver.

[FIG. 26] A block structure diagram explaining the circuit structure of a display device.

[FIG. 27] A diagram explaining the composition of a signal dividing circuit.

[FIG. 28] A diagram explaining the composition of a driver circuit of a stick driver connected to a source line.

[FIG. 29] A diagram explaining a specific example of a latch circuit.

[FIG. 30] An assembly diagram of a liquid crystal display device in which a stick driver is mounted.

[FIG. 31] A diagram explaining an example of mounting a display device to a housing of an electro-optical device.

[FIG. 32] A schematic diagram of an active matrix display device in which a stick driver is mounted.

[FIG. 33] A diagram explaining examples of semiconductor devices.

[FIG. 34] A diagram explaining examples of semiconductor devices.

DETAILED DESCRIPTION OF EXEMPLARY EMBODIMENTS

A pixel structure of a pixel region in a liquid crystal display device of the present invention is explained. FIG. 1 is one example of a planar diagram of such, and in order to simplify the explanation, the structure of one pixel out of the multiple number arranged in a matrix shape is shown.

As shown in FIG. 1, the pixel region has a plurality of gate wirings arranged parallel to each other, and a plurality of source wirings intersecting each of the gate wirings. A pixel electrode 119 is formed in a region enclosed by the gate wirings and the source wirings. Further, a wiring 120 made from the same material as the pixel electrode overlaps a source wiring 117 without overlapping the pixel electrode 119. A TFT is formed in the vicinity of an intersection portion of a gate wiring 102 and the source wiring 117 as a switching element. This TFT is a reverse stagger type TFT (also referred to as a bottom gate type TFT) having a channel forming region formed from a semiconductor film possessing an amorphous structure (hereafter referred to as a first semiconductor film).

In addition, a capacitor wiring 103 is arranged parallel to the gate wiring 102, between two adjacent gate wirings under the pixel electrode 119. The capacitor wiring 103 is formed on all the pixels, and a capacitor is formed with an insulating film 104b, which exists between the capacitor wiring 103 and the pixel electrode 119, as a dielectric.

The reverse stagger type TFT of the present invention is formed by a lamination of, in order on an insulating substrate, a gate electrode (formed integrally by the same layer as that of the gate wiring 102), a gate insulating film, a first semiconductor film, a source region or a drain region made from a second semiconductor film containing a single conductivity type impurity element (an n-type impurity is normally used), a source electrode (formed as integrated with the source wiring 117) and an electrode 118 (hereafter referred to as a drain electrode).

Under the source wiring (including the source electrode) and the drain electrode 118, a gate insulating film, a first semiconductor film, and a second semiconductor film containing an impurity element which imparts n-type conductivity are laminated in order on the insulating substrate.

The film thickness of a region between the drain region and a region contacting the source region is thinner compared to other regions of the first semiconductor film. The reason that the film thickness becomes thin is that when forming the source region and the drain region by partitioning the second semiconductor film, which contains the impurity element for imparting n-type conductivity, by etching, a portion of the first semiconductor film is also removed. Further, an end surface of the pixel electrode, an end surface of the drain electrode, and an end surface of the drain region coincide by this etching process. This type of reverse stagger type TFT is referred to as a channel etched type TFT. Furthermore, a characteristic of the reverse stagger type TFT of the present invention is that an end surface of the wiring 120, which covers the source electrode, the end surface of the source region, and the end surface of the source wiring coincide.

FIG. 6 is a diagram showing the structure of a display device of the present invention. A pixel region 652 is formed on a substrate 651. A second substrate 660, on which an opposing electrode is formed, is joined to the region in which the pixel region 652 has been formed, through a liquid crystal layer (not shown in the figure). The interval between the first substrate and the second substrate, namely the thickness of the liquid crystal layer, is determined by attached spacers, and is set from 3 to 8 μm for a nematic liquid crystal, and between 1 and 4 μm for a sumectic liquid crystal. It is preferable to use a non-alkaline glass such as aluminum borosilicate glass or barium borosilicate glass for the first substrate and the second substrate, and a thickness of 0.3 to 1.1 mm (typically 0.7 mm) is adopted, and therefore the thickness of the liquid crystal layer can be relatively ignored in outward appearance.

The pixel region 652 forms a matrix in which a scanning line (corresponding to gate wiring) group 658 and a source line group 659 intersect, and a TFT is arranged corresponding to each intersection portion. The reverse stagger type TFT explained in Embodiment Mode 1 is used for the TFTs placed here. It is possible to form an amorphous silicon layer by plasma CVD at a temperature equal to or less than 300° C., and even for a non-alkaline glass substrate with external dimensions of 550×650 mm, for example, the film thickness required for forming the TFTs can be formed in several tens of seconds. A characteristic of this type of manufacturing technique can be extremely usefully applied to the production of a display device with a large screen.

Stick drivers 653 and 654 forming a driver circuit are mounted in a region external to the pixel region 652. Reference numeral 653 denotes driver circuits on the source line side, and reference numeral 654 denotes driver circuits on the scanning line side, and both are partitioned into a plurality of circuits and mounted. In order to form the pixel region corresponding to full color RGB, 3072 wirings are required on the source line side, and 768 are required on the scanning line side for the XGA class. Further, for the UXGA class, 4800 and 1200 are required on the source line side and on the scanning line side, respectively. The source lines and scanning lines reaching the number mentioned above are, at the edge portion of the pixel region 652, divided up into several blocks to form lead lines 657 and grouped together corresponding to the output terminal pitch of the stick drivers 653 and 654.

On the other hand, an external input terminal 655 is formed in the edge portion of the substrate 651, and an FPC (flexible printed circuit) for connecting this portion to external circuits is attached. The space between the external input terminal 655 and the stick drivers is joined by connection wirings 656 formed on the substrate 651, which are finally gathered together corresponding to the pitch of the input terminals of the stick drivers.

The circuit structure of the stick drivers differs between on the scanning line side and on the source line side. An example is shown in FIG. 7, showing a state, similar to FIG. 6, in which scanning line side stick drivers 671 and source line side stick drivers 672 are formed outside of a pixel region 670. Although depending upon the pixel density, the stick drivers are mounted on the order of 1 to 2 on the scanning line side, and on the order of 2 to 10 on the data line side. The structure of the scanning line side stick driver 671 is composed of a shift register circuit 673, a level shifter circuit 674, and a buffer circuit 675. Although the buffer circuit 675 is required to have a voltage resistance on the order of 30 V, the operating frequency is on the order of 100 kHz, and therefore the TFTs forming this circuit are formed with a gate insulating film having a thickness of 150 to 250 nm, and a channel length of 1 to 2 μm, in particular. On the other hand, the source line side stick driver is composed of a shift register circuit 676, a latch circuit 677, a level shifter circuit 678, and a D/A converter circuit 679. The shift register circuit 676 and the latch circuit 677 are driven at a driving voltage of 3 V with a frequency equal to or greater than 50 MHz (for example, 65 MHz), and therefore the TFTs forming this circuit are formed with a gate insulating film having a thickness of 20 to 70 nm, and a channel length of 0.3 to 1 μm, in particular.

The stick drivers forming these types of driver circuit are formed on a third substrate 811 as shown in FIG. 8(A), and a circuit portion 812 formed from TFTs, an input terminal 813, and an output terminal 814 are formed. A channel forming region, a source region, and a drain region of TFTs of the driver circuit portion 812 are formed from a crystalline semiconductor film. It is possible to use a film obtained by crystallizing an amorphous semiconductor film by a laser crystallization method or a thermal crystallization method as the crystalline semiconductor film, and in addition, it is also possible to form the above regions with a single crystal semiconductor layer formed by using an SOI technique.

FIG. 8(B) is a top view of the stick driver, and the cross sectional diagram of FIG. 8(A) corresponds to a cut along the line A-A'. A plurality of output terminals for connecting to the source lines or the drain lines of the pixel region are formed at a pitch of 40 to 100 μm. Further, the input terminals 813 are also similarly formed corresponding to the number required. The input terminals 813 and the output terminals 814 are formed with a square shape or a rectangular shape in which the length of one side is from 30 to 100 μm. As shown in FIG. 6, the stick drivers are not formed in correspondence with the length of one side of the pixel region, but are formed into a rectangular shape or a stripe shape having a long side length of 15 to 80 mm, and a short side length of 1 to 6 mm. If the size of the pixel region, namely the size of the screen, is made large, then as one example, the length of one side of the screen of the size 20 becomes 443 nm. Of course it is possible to form the stick drivers corresponding to this length, but in order to ensure the strength of the substrate, this cannot become a practical shape. Rather, handling a plurality of stick drivers formed with a length of 15 to 80 mm and then divided becomes easy, and the manufacturing yield is also improved.

The superiority of the external dimensions of the stick driver over an IC chip is in the length of the long side, and from the viewpoint of productivity, it is not suitable to form the IC chip at length of 15 to 80 mm. Even if it is not impossible, the number of IC chips which can be taken out of a circular silicon wafer is reduced, and therefore it cannot be practically selected. On the other hand, the driving circuits from stick drivers are formed on a glass substrate, and as there is no limitation on what shape of substrate is used as a parent, there is no loss of productivity. By thus using the stick driver formed with a long side length of 15 to 80 mm, the corresponding number required for mounting in the pixel region is less than for a case of using IC chips, and therefore the manufacturing yield can be increased.

The method of mounting the stick drivers, manufactured using the third substrate, on the first substrate is similar to the COG method, and a method such as a connection method using an anisotropic conductive material or a wire bonding method can be employed. One such example is shown in FIG. 9. FIG. 9(A) shows an example of a stick driver 208 mounted in a first substrate 201 using an anisotropic conductive material. A pixel region 202, a lead line 206, and a connection wiring and input-output terminal 207 are formed on the first substrate 210. A second substrate is bonded to the first substrate 201 by a sealing material 204, and a liquid crystal layer 205 is formed in between. Further, an FPC 212 is bonded to one end of the connection wiring and input-output terminal 207 by the anisotropic conductive material. The anisotropic conductive material 215 is made from a resin 215 and a conductive particle 214 having a diameter of several tens to several hundreds of μm and having a surface plated by a material such as Au. The connection wiring and input-output terminal 207 and a wiring 213 formed in the FPC 212 are electrically connected through the conductive particle 214. The stick driver 208 is also bonded to the first substrate by an anisotropic conductive material, and an input-output terminal 209 and the lead line 206 or the connection wiring and input-output terminal 207, provided in the stick driver 208, are electrically connected through a conductive particle 210 mixed throughout a resin 211.

FIG. 10(A) is a cross-sectional diagram of a portion for explaining in detail a method of mounting a stick driver 224 in this way. It is preferable to form an input-output terminal 225 in the stick driver 224, and to form a protecting insulating film 226 in the periphery portion. A first conductive layer 221, a second conductive layer 223, and an insulating layer 222 are formed on a first substrate 220, as shown in the figure, and a lead line or a connection wiring is formed from the first conductive layer 221 and the second conductive layer 223. The conductive layers and the insulating layer formed on the first substrate are formed by the same processes as the pixel TFT of the pixel region. For example, when the pixel TFT is formed into a reverse stagger type, the first conductive layer 221is formed in the same layer as the gate electrode, and is formed from a material such as Ta, Cr, Ti, or Al. Normally, a gate insulating film is formed on a gate electrode, and the insulating layer 222 is formed from the same layer as the gate insulating film. The second conductive layer 223 formed overlapping the first conductive layer 221 is formed from the same transparent conductive film as the pixel electrode is formed from, and is formed in order to have good contact with a conductive particle 227. By suitably setting the size and the density of the conductive particle 227 mixed into a resin 228, with this mode, it is possible to form a structure in which the stick driver and the first substrate are electrically connected.

FIG. 10(B) is an example of the COG method using a compression force of the resin, and a barrier layer 229 is formed from a material such as Ta or Ti in the stick driver side, and approximately 20 μm size Au formed by a process such as electroless plating is made into a bump 230. A light hardened insulating resin 231 intervenes between the stick driver and the first substrate, and the compression force of the resin hardened by light hardening is utilized for pressure welding between the electrodes, thereby forming an electrical connection.

Further, the stick driver may be fixed to the first substrate by an adhesive material 216, as shown in FIG. 9(B), and the input-output terminal of the stick driver may be connected to the lead line or the connection wiring by an Au wire 217. This is then sealed by a resin 218.

The method of mounting the stick driver is not limited to the methods based on FIG. (9), and FIG. 10, and it is possible to use a known method not explained here, such as the COG method, the wire bonding method, or the TAB method.

By making the thickness of the stick driver the same as the thickness of the second substrate, on which the opposing electrode is formed, the height between both becomes nearly the same, and this can contribute to making the entire display device thinner. Further, by producing each of the substrates by the same material, even if temperature changes develop in the liquid crystal display device, a thermal stress is not generated, and there is no loss of characteristics in the circuits formed from the TFTs. In addition, by mounting the driver circuits by long size stick drivers, the required number corresponding to one pixel region can be reduced more than with IC chips, as shown in Embodiment Mode 2.

Embodiment 1

Embodiment 1 shows a method of manufacturing a liquid crystal display device, and a detailed explanation of a method of forming a TFT of a pixel portion on a substrate by a reverse stagger type TFT, and manufacturing a storage capacitor connected to the TFT, is made using FIGS. 1 to 5, in accordance with the processes used. Further, a manufacturing process for a terminal portion, formed in an edge portion of the substrate, and for electrically connecting to wirings of circuits formed on other substrates, is shown at the same time in the same figures.

In FIG. 2(A), a glass substrate, such as a barium borosilicate glass substrate or aluminum borosilicate glass substrate, typically Corning Corp. #7059 or #1737, is used as a substrate 100. In addition, a substrate such as a quartz substrate or a plastic substrate can also be used.

After forming a conductive layer over the entire surface of the substrate 100, a photolithography process using a first photomask is performed, and etching processing is performed, forming a gate electrode 102', a gate wiring (not shown in the figures), a capacitor wiring 103, and a terminal 101. Etching is performed at this time to form a tapered portion in at least an edge portion of the gate electrode 102'. Further, a top view of this state is shown in FIG. 4.

It is preferable to form the gate electrode 102', the gate wiring, the capacitor wiring 103, and the edge portion terminal 101 from a low resistance conductive material such as aluminum (Al) or copper (Cu), but simple Al has problems such as inferior heat resistance and easily corrodes, and therefore it is combined with a heat resistant conductive material. Further, an Ag—Pd—Cu alloy may also be used as the low resistance conductive material. One element selected from the group consisting of titanium (Ti), tantalum (Ta), tungsten (W), molybdenum (Mo), chromium (Cr), or an alloy having the above elements as its main constituent, or an alloy film of a combination of the above elements, or a nitrated compound having the above elements as its main constituent is formed as the heat resistant conductive material. For example, a lamination film of Ti and Cu, and a lamination film of TaN and Cu can be given. Furthermore, forming in combination with a heat resistant conductive material such as Ti, Si, Cr, or Nd, it is preferable because of improved levelness. In addition, an alloy of a single layer heat resistant insulating film or Mo and W, or an alloy of Mo and Ta may also be used.

In manufacturing the liquid crystal display device, it is preferable to form the gate electrode and the gate wiring by a combination of a heat resistant conductive material and a low electrical resistance conductive material. Provided that the screen size is on the order of, or less than, type 4, a two layer structure of a lamination of a conductive layer (A) made from a nitride compound of a heat resistant conductive material, and a conductive layer (B) made from a heat resistant conductive material is used. The conductive layer (B) may be formed from an element selected from the group consisting of Al, Cu, Ta, Ti, W, Nd, and Cr, or from an alloy of the above elements, or from an alloy film of a combination of the above elements, and the conductive layer (A) is formed from a film such as a tantalum nitride (TAN) film, a tungsten nitride (WN) film, or a titanium nitride (TiN) film. For example, it is preferable to use a two layer structure of a lamination of Cr as the conductive layer (A) and Al containing Nd as the conductive layer (B). The conductive layer (A) is given a thickness of 10 to 100 nm (preferably between 20 and 50 nm), and the conductive layer (B) is made with a thickness of 200 to 400 nm (preferably between 250 and 350 nm).

On the other hand, in order to be applied to a large screen, bigger than the type 4 class, it is preferable to use a three layer structure of a lamination of a conductive layer (A) made from a heat resistant conductive material, a conductive layer (B) made from a low electrical resistance conductive material, and a conductive layer (C) made from a heat resistant conductive material. The conductive layer (B) made from the low electrical resistance conductive material is formed from a material having aluminum (Al) as its main constituent, and in addition to pure Al, Al containing between 0.01 and 5 atomic % of a material such as scandium (Sc), Ti, Nd, or silicon (Si) is used. The conductive layer (C) is effective in preventing generation of hillocks in the Al of the conductive layer (B). The conductive layer (A) is given a thickness of 10 to 100 nm (preferably between 20 and 50 nm), the conductive layer (B) is made from 200 to 400 nm thick (preferable between 250 and 350 μm), and the conductive layer(C) is from 10 to 100 nm thick (preferably between 20 and 50 nm). In Embodiment 1, the conductive layer (A) is formed from a Ti film with a thickness of 50 μm, made by sputtering with a Ti target, the conductive layer (B) is formed from an Al film with a thickness of 200 nm, made by sputtering with an Al target, and the conductive layer (C) is formed from a 50 nm thick Ti film, made by sputtering with a Ti target.

An insulating film 104a is formed next on the entire surface. The insulating film 104a is formed using sputtering, and has a film thickness of 50 to 200 nm. For example, a silicon nitride film is used as the insulating film 104a, and formed with a thickness of 150 nm. Of course, the gate insulating film is not limited to this type of silicon nitride film, and another insulating film such as a silicon oxide film, a silicon nitride oxide film, or a tantalum oxide film may also be used, and the gate insulating film may be formed from a single layer or a lamination structure made from these materials. For example, a lamination structure having a silicon nitride film as a lower layer and a silicon oxide film as an upper layer may be used.

A first semiconductor film 105 is formed with a thickness of 50 to 200 nm (preferably between 100 and 150 nm) on the insulating film 104a over the entire surface by using a known method such as plasma CVD or sputtering. For example, an amorphous silicon (a-Si) film is formed with a thickness of 150 nm by sputtering using a silicon target. In addition, it is also possible to apply a microcrystalline semiconductor film, or a compound semiconductor film having an amorphous structure, such as an amorphous silicon germanium film ($Si_xGe_{(1-x)}$, where 0<x<1), or an amorphous silicon carbide ($Si_xC_y$).

A single conductivity type (containing an n-type or a p-type impurity element) second semiconductor film is formed next with a thickness of 20 to 80 nm. The single conductivity type second semiconductor film is formed on the entire surface by a known method such as plasma CVD or sputtering. In Embodiment 1, a single conductivity type second semiconductor film 106 is formed using a silicon target in which phosphorous (P) has been added. Alternatively, film deposition is performed by sputtering using a silicon target in an atmosphere containing phosphorous. In addition, the second semiconductor film may also be formed from a hydrogenated microcrystalline silicon film (μc-Si:H).

A first conductive film 107 made from a metallic material is formed by sputtering or vacuum evaporation. Provided that ohmic contact with the second semiconductor film 106 can be made, there are no particular limitation on the material of the first semiconductor film 107, and an element selected from the group consisting of Al, Cr, Ta, and Ti, or an alloy having the above elements as its main constituent, and an alloy film of a combination of the above elements or the like can be given. Sputtering is used in Embodiment 1, and a three layer structure formed from a 50 to 150 nm thick Ti film, an aluminum (Al) film with a thickness between 300 and 400 nm and overlapping the Ti film, and in addition a Ti film with a thickness of 100 to 150 nm is formed as the first conductive film 107. (See FIG. 2(A).)

The insulating film 104a, the first semiconductor film 105, the single conductivity type second semiconductor film 106, and the first conductive film 107 are all manufactured by a known method, and can be manufactured by plasma CVD or sputtering. These films (104a, 105, 106, and 107) are formed in succession by sputtering using suitably changing the target or the sputtering gas in Embodiment 1. The same reaction chamber, or a plurality of reaction chambers, in the sputtering device is used at this time, and it is preferable to laminate these films in succession without exposure to the atmosphere. By thus not exposing the films to the atmosphere, the mixing in of impurities can be prevented.

A photolithography process is then performed using a second photomask, a resist mask 108 is formed, and by removing unnecessary portions by etching, a wiring (becoming a source wiring and a drain electrode by subsequent processing) 111 is formed. Wet etching or dry etching is used as the etching process at this time. The first conductive film 107, the single conductivity type second semiconductor film 106, and the first semiconductor film 105 are etched in order in accordance with the pattern of the resist mask 108. Not only is the wiring formed by this process, but a semiconductor layer pattern forming the TFT is also formed at the same time. The wiring 111 composed of the first conductive film, a second conductive film 110 containing an impurity element which imparts n-type conductivity, and a first semiconductor film 109 are each formed in the portion forming the TFTs. In Embodiment 1, the first conductive film 107 in which the Ti film, the Al film, and the Ti film are laminated in order is etched by dry etching using a gas mixture of $SiCl_4$, $Cl_2$, and $BCl_3$ as a reaction gas, and the reaction gas is substituted with a gas mixture of CF4 and $O_2$, and the first semiconductor film 105 and the second semiconductor film 106, containing the impurity element for imparting n-type conductivity, are selectively removed. (See FIG. 2(B).) Further, the capacitor wiring 103 and the insulating film 104a remain in a capacitor portion, and the terminal 101 and the insulating film 104a also remain similarly in a terminal portion. A top view of this state is shown in FIG. 5. Note that, for simplicity, a second conductive film 112 deposited on the entire surface is not shown in FIG. 5.

After next removing the resist mask 108, a mask covering the entire surface of the pixel region is formed by screen printing, and the insulating film 104a covering a pad portion of the terminal portion is selectively removed. This process does not require high precision alignment, and therefore it can be performed by using screen printing or a shadow mask. An insulating film 104b is thus formed. (See FIG. 2(C).)

The second conductive film 112 is then deposited on the entire surface from a transparent conductive film. (See FIG. 2(D).) The second conductive film 112 is formed from a material such as indium oxide ($In_2O_3$) or indium oxide tin oxide alloy ($In_2O_3$—$SnO_2$, abbreviated as ITO) using a method such as sputtering or vacuum evaporation. The etching process for this type of material is performed using a chlorine solution. However, a residue is easily generated, particularly by ITO etching, and therefore an indium oxide zinc oxide alloy ($In_2O_3$—ZnO) may be used in order to improve the etching process characteristics. The indium oxide zinc oxide alloy has superior surface smoothing characteristics, and has superior thermal stability compared to ITO, and therefore even if the wiring 111 contacting the second conductive film 112 is made from an Al film, a corrosion reaction can be prevented. Similarly, zinc oxide (ZnO) is also a suitable material, and in addition, in order to increase the transmittivity of visible light and increase the conductivity, a material such as zinc oxide in which gallium (Ga) is added (ZnO:Ga) can be used.

Resist masks 113a to 113c are formed next by a photolithography process using a third photomask. Unnecessary portion are then removed by etching, forming a first semiconductor film 114, a source region 115, a drain region 116, the source electrode 117, the drain electrode 118, and the pixel electrode 119. (See FIG. 3(A).) The photolithography process patterns the second conductive film 112, and at the same time removes the wiring 111, the single conductivity type second semiconductor film 110 and a portion of the first semiconductor film 109 by etching, forming an opening. In Embodiment 1, the second conductive film 112 made from ITO is selectively removed first by wet etching using a mixed solution of nitric acid and hydrochloric acid, or a ferric chloride solution, and after selectively removing the wiring 111 by wet etching, the second semiconductor film 110, containing the impurity element which imparts n-type conductivity, and a portion of the first semiconductor film 109 are etched by dry etching. Note that wet etching and dry etching are used in Embodiment 1, but the operator may perform only dry etching by suitably selecting the reaction gas, and the operator may perform only wet etching by suitably selecting the reaction solution.

Further, the lower portion of the opening reaches the first semiconductor film, and the first semiconductor film 114 is formed having a concave portion. The wiring 111 is separated into the source wiring 117 and the drain electrode 118 by the opening, and the single conductivity type second semiconductor film 110 is separated into the source region 115 and the drain region 116. Furthermore, the second conductive film 120 contacting the source wiring covers the source wiring, and during subsequent manufacturing processes, especially during a rubbing process, fulfills a role of preventing static electricity from developing. An example of forming the second conductive film 120 on the source wiring is shown in Embodiment 1, but the second conductive film 120 may also be removed. Moreover, a storage capacitor is formed in the photolithography process by the capacitor wiring 103 and the pixel electrode 119, with the insulating film 104b in the capacitor portion as a dielectric. In addition, the second conductive film made from the transparent conductive film formed in the terminal portion and covered by the resist mask 113c remains after the photolithography process.

The resist masks 113a to 113c are removed next. A cross section diagram of this state is shown in FIG. 3(B). Note that FIG. 1 is a top view of one pixel, and FIG. 3(B) corresponds to cross sections taken along the lines A-A' and B-B'.

Furthermore, FIG. 11(A) shows top views of a gate wiring terminal portion 501 and a source wiring terminal portion 502 in this state. Note that the same symbols are used for area corresponding to those of FIG. 1 to FIG. 3. Further, FIG. 11(B) corresponds to a cross-sectional diagram taken along the lines E-E' and F-F' in FIG. 11(A). Reference numeral 503 in FIG. 11(A) denotes a connecting electrode made from a transparent conductive film and functioning as an input terminal. In addition, in FIG. 11(B) reference numeral 504 denotes an insulating film (extended from 104b), reference numeral 505 denotes a first amorphous semiconductor film (extended from 114), and reference numeral 506 denotes a second amorphous semiconductor film containing an impurity element which imparts n-type conductivity (extended from 115).

By thus using three photomasks and performing three photolithography processes, the pixel TFT having the reverse stagger type n-channel type TFT 201 and the storage capacitor 202 can be completed. By placing these in a matrix state corresponding to each pixel and thus composing the pixel portion, one substrate can be made in order to manufacture an active matrix type electro-optical device. For convenience, this type of substrate is referred to as an active matrix substrate throughout this specification.

An orienting film 121 is selectively formed next in only the pixel portion of the active matrix substrate. Screen printing may be used as a method of selectively forming the orienting film 121, and a method of removal in which a resist mask is formed using a shadow mask after application of the orienting film may also be used. Normally, a polyimide resin is often used in the orienting film of the liquid crystal display element. A rubbing process is then performed on the orienting film 121, orienting the liquid crystal elements so as to possess a certain fixed pre-tilt angle.

The active matrix substrate, and an opposing substrate 124 in which an opposing electrode 122, and an orientating film 123 are formed are next joined together by a sealant while maintaining a gap between the substrates using spacers, after which a liquid crystal material 125 is injected into the space between the active matrix substrate and the opposing substrate. A known material may be applied for the liquid crystal material 125, and a TN liquid crystal is typically used. After injecting the liquid crystal material, the injecting entrance is sealed by a resin material. (See FIG. 3(C).)

A stick driver forming a driver circuit, as shown in Embodiment Mode 2, is attached in the terminal portion. The stick driver uses driver circuits which differ between a scanning line side and a source line side. The active matrix type liquid crystal display device in which the pixel region is manufactured by three photomasks can thus be completed.

Embodiment 2

In Embodiment 2, an example of forming a protecting film on the pixel TFT manufactured in Embodiment 1 is shown in FIG. 12. Note that Embodiment 2 is identical to Embodiment 1 through the state of FIG. 3(B), and therefore only points of difference are explained. Further, the same symbols are used for locations corresponding to those in FIG. 3(B).

After first forming through the state of FIG. 3(B) in accordance with Embodiment 1, a thin inorganic insulating film is formed on the entire surface. An inorganic insulating film such as a silicon oxide film, a silicon nitride film, a silicon nitride oxide film, or a tantalum oxide film is used as the thin inorganic insulating film, and a single layer or a lamination structure made from these materials may be formed.

A photolithography process is performed next using a fourth photomask, forming a resist mask, and unnecessary portions are removed by etching, forming an insulating film 402 in the pixel TFT portion, and an inorganic insulating film 401 in the terminal portion. These inorganic insulating films 401 and 402 function as passivation films. Further, the thin inorganic insulating film 401 is removed in the terminal portion by the fourth photolithography process, exposing the second conductive film, made from the transparent conductive film, formed on the terminal 101 of the terminal portion.

The reverse stagger type n-channel type TFT and the storage capacitor, protected by the inorganic insulating film, can thus be completed in Embodiment 2 by performing the photolithography process using four photomasks four times in total. By thus structuring the matrix portion by arranging these into a matrix shape corresponding to each pixel, one substrate for manufacturing the active matrix type electro-optical device can be made. Note that it is possible to combine the constitution of Embodiment 2 with the that of Embodiment 1.

Embodiment 3

In Embodiment 1 an example centering on forming an insulating film, a first amorphous semiconductor film, a single conductivity type second amorphous semiconductor film, and a first conductive film by sputtering, but Embodiment 3 shows an example of using plasma CVD to form the films. Specifically, the insulating film, the first amorphous semiconductor film, and the single conductivity type second semiconductor film are formed by plasma CVD.

A silicon nitride oxide film is used as the insulating film in Embodiment 3, and is formed with a 150 nm thickness by plasma CVD. At this time, the power source frequency in the plasma CVD device is from 13 to 70 MHz, preferably between 27 and 60 MHz. In particular, by using a power source frequency of 27 to 60 MHz, a dense insulating film can be formed, and as a gate insulating film, the voltage resistance can be increased. Further, a silicon nitride oxide film manufactured by adding $SiH_4$, $NH_3$, and $N_2O$ has a relaxed stress in the interior of the film, and therefore it is a material which is preferable to use. Of course, the gate insulating film is not limited to this type of silicon nitride oxide film, and a single layer or a lamination structure may be formed from other insulating films such as a silicon oxide film, a silicon nitride film, or a tantalum oxide film. Showing one such example, a lamination structure of a lower layer of a silicon nitride film and an upper layer of a silicon nitride film is a preferable form as the gate insulating film.

When using a silicon oxide film, it can be formed by plasma CVD using a mixture of tetraethyl orthosilicate (TEOS) and $O_2$, with the reaction pressure set to 40 Pa, a substrate temperature of 250 to 350° C., and discharge at a high frequency (13.56 MHz) power density of 0.5 to 0.8 W/cm². Good characteristics as the gate insulating film can be obtained for the silicon oxide film thus formed by a subsequent thermal anneal at 300 to 400° C.

Typically, a hydrogenated amorphous silicon (a-Si:H) film is formed with a thickness of 100 nm by plasma CVD as the first semiconductor film. At this point, plasma CVD may be performed with a power source frequency of 13 to 70 MHz, preferably between 27 and 60 MHz, in the plasma CVD device. By using a power frequency of 27 to 60 MHz, it becomes possible to increase the film deposition speed, and the deposited film is preferable because it becomes an a-Si film having a low defect density. In addition, it is also possible to apply a compound semiconductor film having an amorphous structure, such as an amorphous silicon germanium film, as the first amorphous semiconductor film. If 100 to 100 kHz pulse modulation discharge is performed in the plasma CVD film deposition of the amorphous semiconductor film, then particle generation due to the plasma CVD gas phase reaction can be prevented, and pinhole generation in the formed film can also be prevented, and therefore is preferable.

Further, in Embodiment 3 a single conductivity type second amorphous semiconductor film is formed with a thickness of 20 to 80 nm as a semiconductor film containing a single conductivity type impurity element. For example, an a-Si:H film containing an n-type impurity element may be formed, and in order to do so, phosphine ($PH_3$) is added at a 0.1 to 5% concentration to silane ($SiH_4$). Alternatively, a hydrogenated microcrystalline silicon film (µc-Si:H) may also be used as a substitute for the second amorphous semiconductor film 106 containing an impurity element which imparts n-type conductivity.

These films can be formed in succession by appropriately changing the reaction gas. Further, the same reaction chamber, or a plurality of reaction chambers, in the plasma CVD device is used at this time, and these films can be laminated successively without exposure to the atmosphere. By thus depositing successively these films without exposing the films to the atmosphere, the mixing in of impurities can be prevented.

Embodiment 4

As shown in FIG. 2, in the process of laminating an insulating film, a first amorphous semiconductor film, a single conductivity type second amorphous semiconductor film, and a first conductive film, in order and successively, a multi-chamber type device having a plurality of reaction chambers, can be applied as one example of a sputtering device or a plasma CVD device.

FIG. 13 shows a schematic of a multi-chamber type device (a successive film deposition system) seen from above. The composition of the device is provided with load-unload chambers 10 and 15, and film forming chambers 11 to 14, and each chamber is connected to a common chamber 20. A vacuum evacuation pump and a gas introduction system are placed in the load-unload chamber, in the common chamber and in each of the other chambers.

The load-unload chambers 10 and 15 are load-lock chambers for transporting a processing substrate 30 to the chambers. The first chamber 11 is a reaction chamber for depositing the insulating film 104. The second chamber 12 is a reaction chamber for depositing the first amorphous semiconductor film 105, and the third chamber 13 is a reaction chamber for depositing the single conductivity type amorphous semiconductor film 106. The fourth chamber 14 is a reaction chamber for depositing the first conductive film 107.

One example of the operation of this type of multi-chamber device is shown. First, after pulling a first high vacuum state in all of the chambers, a gas such as nitrogen or argon is introduced, and by maintaining a pressure on the order of 0.01 to 5 Pa within the chambers, contamination due to reverse diffusion from the exhaust outlet or from degassing of the internal chamber walls is prevented.

The processing substrates are set into the load-unload chamber 10 by a cassette 28, each of which holds a plurality of substrates. The processing substrates are removed from the cassette by opening a gate valve 22, and are moved into the common chamber 20 by a robot arm 21. Position alignment is performed in the common chamber at this point. Note that the substrate 30 used is one on which the wirings 101, 102, and 103, obtained in accordance with Embodiment 1, have been formed.

The gate valve 22 is then closed, and a gate valve 23 is opened next. The processing substrate 30 is then moved into the first chamber 11. Film deposition processing is performed with in the first chamber at a temperature of 150 to 300° C., and the insulating film 104 is obtained. Note that a film such as a silicon nitride film, a silicon oxide film, a silicon nitride oxide film, or a lamination film of these films, can be used as the insulating film. A single layer silicon nitride film is employed in Embodiment 3, but a two-layer, three-layer, or higher layer lamination structure film may also be used. Note that a chamber capable of plasma CVD is used here, but a chamber which is capable of sputtering by use of a target may also be used.

After completing the deposition of the insulating film, the processing substrate is pulled out into the common chamber by the robot arm, and is then transported to the second chamber 12. Film deposition is performed within the second chamber at a temperature of 150 to 300° C., similar to that of the first chamber, and the first semiconductor film 105 is obtained by plasma CVD. Note that a film such as a microcrystalline semiconductor film, an amorphous germanium film, an amorphous silicon germanium film, or a lamination film of these films can be used as the first amorphous semiconductor film. Further, a heat treatment process for reducing the concentration of hydrogen may be omitted with a formation temperature of 350 to 500° C. for the first semiconductor film. Note that a chamber capable of plasma CVD is used here, but a chamber which is capable of sputtering by use of a target may also be used.

After completing deposition of the first semiconductor film, the processing substrate is pulled out into the common chamber and then transported to the third chamber 13. Film deposition process is performed within the third chamber at a temperature of 150 to 300° C., similar to that of the second chamber, and the single conductivity type second semiconductor film 106, containing an impurity element which imparts n-type conductivity (P or As), is obtained. Note that a chamber capable of plasma CVD is used here, but a chamber which is capable of sputtering by use of a target may also be used.

After completing deposition of the single conductivity type second semiconductor film, the processing substrate is pulled out into the common chamber, and then is transported to the fourth chamber 14. The first conductive film 107 is obtained within the fourth chamber by sputtering using a metallic target.

The processed substrate, on which four layers have thus been formed in succession, is then transported to the load-lock chamber 15 by the robot arm, and is contained in a cassette 29.

Embodiment 5

In Embodiment 4, an example of successive lamination using a plurality of chambers is shown, but in Embodiment 5 a method of successive lamination within one chamber maintained at high vacuum using the device shown in FIG. 14 can be employed.

The device system shown in FIG. 14 is used in Embodiment 5. In FIG. 14, reference numeral 40 denotes a processing substrate, reference numeral 50 denotes a common chamber, 44 and 46 denote load-lock chambers, 45 denotes a chamber, and reference numerals 42 and 43 denote cassettes. In order to prevent contamination developing during transport of the substrate, lamination is performed in the same chamber in Embodiment 5.

When the device shown in FIG. 14 is applied to Embodiment 1, a plurality of targets are prepared in the chamber 45, and the insulating film 104, the first semiconductor film 105, the single conductivity type second semiconductor film 106, and the first conductive film 107 may be laminated by changing the reaction gas in order.

Further, when applied to Embodiment 4, the insulating film 104, the first amorphous semiconductor film 105, and the single conductivity type second semiconductor film 106 may be laminated by changing the reaction gas in order.

Embodiment 6

As shown in Embodiment 4, a single conductivity type second semiconductor film can be formed from a microcrystalline semiconductor film in the manufacture process of a TFT using plasma CVD. By setting the substrate heating temperature during deposition between 80 and 300° C., preferably from 140 to 200° C., using a reaction gas of a gas mixture of silane gas diluted by hydrogen ($SiH_4:H_2=1:10$ to 100) and phosphine ($PH_3$), setting the gas pressure to 0.1 to 10 Torr, and the discharge power between 10 and 300 mW/cm$^2$, a microcrystalline silicon film can be obtained. Further, plasma doping of phosphorous (P) may also be performed after depositing the microcrystalline silicon film. By forming the single conductivity type second semiconductor film by the microcrystalline semiconductor film, a source or a drain region can be made low resistance, and the characteristics of the TFT can be increased.

Embodiment 7

In Embodiments 1 to 3, a method of manufacturing an active matrix substrate corresponding to a transmitting type liquid crystal display device is shown, but in Embodiment 7 an example of application to a reflecting type liquid crystal display device is shown, using FIGS. 15 and 16. FIG. 15 shows a cross-sectional diagram and FIG. 16 shows a top view, and the cross-sectional structure of the face cut along the dashed line G-G' in FIG. 16, and the cross-sectional structure corresponding to the face cut along the dashed line H-H' are shown in FIG. 15.

First, a substrate having an insulating surface is prepared. In addition to a substrate having light transmitting characteristics, such as a glass substrate, a quartz substrate, and a plastic substrate, a substrate, such as a semiconductor substrate, a stainless steel substrate, or a ceramic substrate, on which an insulating film is formed, may also be used as a substrate in Embodiment 7 due to the reflectivity of the liquid crystal display device.

Next, after forming a conductive film made from a metallic material on the substrate, and after forming a resist pattern using a first photomask, a gate wiring 750 and a convex portion 751 are formed by etching processing. The convex portion is placed in a region surrounded by the gate wiring and the source wiring, namely a region in which a pixel electrode is formed and which becomes a display region. Note that there are no particular limitations placed on the shape of the convex portion 751, and a cross section in the diameter direction may be polygonal, and it may have an asymmetric shape. For example, the shape of the convex portion 751 may be a cylindrical shape or a prismatic shape, and may be a conic or pyramidal shape. Further, the convex portion 751 may be placed regularly or irregularly. In Embodiment 7 it is preferable for the gate wiring to have a tapered shape, and therefore the convex portion 751 is given a pyramidal shape having a tapered shape. The angle of the tapered portion is from 5 to 45, preferably between 5 and 25.

An insulating film (a gate insulating film) 752, a first semiconductor film, a single conductivity type second semiconductor film, and a first conductive film are next formed in order. Note that either an amorphous semiconductor or a microcrystalline semiconductor may be applied to the first semiconductor film. A microcrystalline semiconductor film may also be used for the single conductivity type second semiconductor film, as shown in Embodiment 6. In addition, these films can be formed in succession, without exposure to the atmosphere, in a plurality of chambers or within the same chamber using sputtering or plasma CVD. The mixing in of impurities can be prevented by having no exposure to the atmosphere. The above insulating film 752 is formed on the substrate on which the convex portion 751 is formed, and has an uneven surface.

After forming a resist pattern using a second photomask, the first conductive film, the second semiconductor film, and the first semiconductor film are next etched by the etching process. Thus a source line 608 and an electrode (a drain electrode) 609 are formed, and a first semiconductor film 605 is formed. The source wiring, the drain electrode, and the semiconductor layer forming the TFT are formed into predetermined pattern by this etching process.

A second conductive film is deposited next on the entire surface. Note that a conductive film having reflectivity is used as the second conductive film. It is preferable to apply a material such as Al or Al for this type of conductive film, a layer may be formed from a material such as Ti or Ta as a barrier metal layer with respect to the lower layer, n order that the heat resistance characteristics are not inferior.

After forming a resist pattern using a third photomask, etching process is performed next, forming a pixel electrode 604 made from the second conductive film. The surface of the insulating film formed on the convex portion 601 is uneven, and the pixel electrode 604 is formed on the insulating film 602 which has the uneven surface, and therefore the surface of the pixel electrode 604 possesses unevenness, and the surface can be given light scattering characteristics.

Further, by using the structure of Embodiment 7 when manufacturing a pixel TFT portion, the number of photomasks used by the photolithography technique can be set to three. Conventionally, it was necessary to add a process of forming a uneven portion, but the convex portion is manufactured at the same time as the gate wiring in Embodiment 7, and therefore the uneven portion can be formed in the pixel electrode without any increase in the number of process steps.

Embodiment 8

A method of manufacturing a TFT applied mainly in a stick driver of a scanning line side is explained in Embodiment 8. Circuits such as a shift register circuit and a buffer circuit are formed in the stick driver of the scanning line side. The shift register circuit is assumed to be driven at 3 to 5 V, and the buffer circuit is assumed to be driven at 33 V. The TFT structuring the buffer circuit is required to have high voltage resistance, and therefore it is necessary for the film thickness of a gate insulating film to be thicker than that of other circuit TFTs. A manufacturing method thereof will be described with reference to FIG. 17 and FIG. 18.

In FIG. 17(A), a substrate such as a glass substrate, such as barium borosilicate or aluminum borosilicate, typically Corning Corp. #7059 or #1737, is used as a substrate 301.

This type of glass substrate shrinks slightly due to the heat treatment temperature, and if heat treatment processing is implemented at a temperature which is from 500 to 650° C. lower than the glass distortion point, then the substrate shrinkage ratio can be reduced.

A blocking layer 302 is formed in order to prevent diffusion into a semiconductor layer of materials such as alkaline metals contained in microscopic amounts within the substrate 301, and is formed from an insulating film such as a silicon oxide film, a silicon nitride film, or a silicon nitride oxide film. Further, in order to stabilize the threshold voltage ($V_{th}$) of the TFT, it is preferable to make the stress of the blocking layer into a tensile stress. The stress can be controlled by the manufacturing conditions of the above insulating film. With that as a goal, the blocking layer is not limited to a single layer, and may also be formed by laminating a plurality of insulating films having different structures. For example, the blocking layer can be formed by laminating a 10 to 200 nm (preferable between 50 and 100 nm) thick silicon nitride oxide film manufactured by plasma CVD from $SiH_4$, $NH_3$, and $N_2O$, and a 50 to 200 nm (preferably from 100 to 150 nm) thick silicon nitride oxide film manufactured similarly by plasma CVD using $SiH_4$ and $N_2O$.

A semiconductor layer 303 having an amorphous structure is formed with a thickness of 25 to 100 nm. Typical examples of semiconductor films having an amorphous structure include an amorphous silicon (a-Si) film, an amorphous silicon germanium (a-SiGe) film, an amorphous silicon carbide (a-SiC) film, and an amorphous silicon tin (a-SiSn) film, and any of these can be applied. These semiconductor films having an amorphous structure may be formed by a method such as plasma CVD, sputtering, or reduced pressure CVD, and are formed containing hydrogen on the order of 0.1 to 40 atomic %. One suitable example is an amorphous silicon film manufactured by plasma CVD and made from $SiH_4$ or from $SiH_4$ and $H_2$, with a film thickness of 55 nm. Note that $Si_2H_6$ may be used as a substitute for $SiH_4$.

A catalyst element which can lower the crystallization temperature of the amorphous semiconductor film is then added. It is possible to directly inject the catalyst element within the amorphous semiconductor film, and a catalyst element containing layer 304 may also be formed with a thickness of 1 to 5 nm by spin coating, printing, spraying, bar coding, sputtering, or vacuum evaporation. Examples of this type of catalyst element known to be effective with respect to amorphous silicon include nickel (Ni), germanium (Ge), iron (Fe), palladium (Pd), tin (Sn), lead (Pb), cobalt (Co), platinum (Pt), copper (Cu), and gold (Au). In order to form the catalyst element containing layer 304 by spin coating, an aqueous solution containing 1 to 100 ppm (preferably 10 ppm) by weight of the catalytic element is applied with the substrate rotating by a spinner.

In the crystallization process shown in FIG. 17(B), heat treatment is first performed at 400 to 500° C. for approximately 1 hour, reducing the amount of hydrogen contained within the amorphous silicon film to 5 atom % or less. Heat treatment is then performed for 1 to 8 hours at 550 to 600° C. in a nitrogen atmosphere using an annealing furnace. Heat treatment is ideally performed for 4 hours at 550° C. A crystalline semiconductor film 305 can thus be obtained. A crystalline silicon film having a crystalline structure is formed from the amorphous silicon film by this type of thermal crystallization process.

However, the crystalline semiconductor film 305 manufactured by this thermal crystallization method has localized amorphous regions remaining. In this case the existence of amorphous components possessing a broad peak at 480 cm$^{-1}$ can be confirmed by Raman spectroscopy. A laser crystallization method is a suitable method for the goal of crystallizing this type of remaining amorphous region.

A laser such as an excimer laser, a YAG laser, a $YVO_4$ laser, a $YAlO_3$ laser, and a YLF laser can be used as a laser light source used in the laser crystallization method. The excimer laser is capable of emitting high output light at a wavelength equal to or less than 400 nm, and therefore can suitably be used for crystallization of a semiconductor film. On the other hand, with solid state lasers such as the YAG laser, the $YVO_4$ laser, the $YAlO_3$ laser, and the YLF laser, the second harmonic (532 nm), the third harmonic (355 nm), and the fourth harmonic (266 nm) is used. Due to the penetration length, heating is from the surface and from the interior of the semiconductor layer when the second harmonic (532 nm) is used, and is from the surface of the semiconductor layer when the third harmonic (355 nm) or the fourth harmonic (266 nm) is used, similar to an excimer laser, and crystallization can be performed.

FIG. 17(C) shows this state, for example a Nd:YAG laser is used, with a pulse emission frequency set to between 1 and 10 kHz, and a laser energy density from 100 to 500 mJ/cm$^2$ (typically between 100 and 400 mJ/cm$^2$), and a linear shape laser light 306 formed from an optical system containing lenses, such as a cylindrical lens, is then scanned in a direction perpendicular to its longitudinal direction (or, the substrate is moved symmetrically). The line width of the linear shape laser light 306 is set between 100 and 1000 μm, for example 400 μm. By thus jointly using a thermal crystallization method and a laser crystallization method, a crystalline semiconductor film 307 having good crystallinity can be formed.

The crystalline semiconductor film 307 formed as above is suitable as an active layer of a TFT for forming such as a channel forming region, a source region, a drain region, and an LDD region. The crystalline silicon film manufactured by the thermal crystallization method using a catalyst element such as nickel has a structure, when viewed microscopically, of a plurality of needle shape or rod shape crystals gathered together. However, the continuity of adjoining grains is high, and it is expected that almost no dangling bonds are formed. Further, the majority of the crystal grains are oriented in the <110> direction. One such reason, it is thought, is that silicide compounds of the catalyst element participate in the crystal growth process when a catalyst element such as nickel is used. It is thought that among the initial nucleation, the (111) face nearly vertical with respect to the surface of the substrate grows preferentially because the film thickness of the semiconductor film is thin at 25 to 100 nm, and therefore the <110> orientation is enhanced in practice.

The crystalline semiconductor film 307 is next formed into island shape semiconductor layers 308 to 311 by an etching process. Four semiconductor layers are shown in FIG. 17(D), for convenience. Subsequent explanations assume that the semiconductor layers 308 and 309 are manufactured into TFTs of circuits driven at a low voltage, such as a shift register circuit, and that the semiconductor layers 310 and 311 are manufactured into TFTs of circuits driven at a high voltage, such as a buffer circuit.

In consideration of the driving voltage of the circuits, gate insulating films formed on the semiconductor layers are formed with different film thicknesses, even though for TFTs formed on the same substrate. Therefore a two stage film deposition process is necessary. First, a gate insulating film first layer 312 is formed with a thickness of 40 to 200 nm (preferably between 70 and 90 nm). The gate insulating film first layer on the semiconductor layers 308 and 309 is then removed by selective etching, thereby forming the state of FIG. 17(E).

Continuing, a gate insulating film second layer 313 is formed similarly, as shown in FIG. 17(F). As a result, when depositing each of the gate insulating film first layer 312 and the gate insulating film second layer 313 with a thickness of 80 nm, the thickness of the gate insulating film can become 80 nm on the semiconductor layers 308 and 309, and the thickness of the gate insulating film can become 160 nm on the semiconductor layers 310 and 311.

The gate insulating film is formed from an insulating film containing silicon by using plasma CVD or sputtering. A silicon nitride oxide film manufactured by plasma CVD from a gas mixture of $SiH_4$ and $N_2O$ is a suitable material as the gate insulating film. Of course, the gate insulating film is not limited to this type of silicon nitride oxide film, and insulating films containing other silicon may also be formed. When applying a silicon oxide film, it can be formed by plasma CVD in which TEOS (tetraethyl orthosilicate) and $O_2$ are mixed, with a reaction pressure of 40 Pa, and a substrate temperature set from 300 to 400° C., and discharge at a high frequency (13.56 MHz) power density of 0.5 to 0.8 W/cm². Good characteristics as the gate insulating film can be obtained in the silicon oxide film thus manufactured by subsequent thermal annealing at 400 to 500° C.

A conductive film for forming a gate electrode is formed on the gate insulating film thus manufactured. The gate electrode of the TFT shown in Embodiment 8 is formed by laminating two types of conductive materials having a selectivity of 5 to 20 or greater (preferably between 10 and 13) by dry etching. For example, the gate electrode is formed from a first conductive film made from a nitride compound conductive material and a second conductive film made from a heat resistant conductive material which has tolerance to 400 to 650° C. heat treatment. As a specific example, the first conductive film is formed from a material selected from the group consisting of tantalum nitride (TAN), titanium nitride (TIN), and tungsten nitride (WN), while the second conductive film is formed from an alloy material comprising one or plural members chosen from the group consisting of tantalum (Ta), titanium (Ti), tungsten (W), and molybdenum (Mo). Of course, materials which can be applied to the gate electrode are not limited to those materials recorded here, and provided that a conductive material combination fulfills the above specifications, it is also possible to select other conductive materials. Note that the selectivity means here a ratio of the etching rate of the second conductive film to that of the first conductive film.

Although not shown in the figures, the first conductive film is formed from a TaN film having a 50 to 100 nm thickness, and the second conductive film is formed from a W film with a thickness or 100 to 400 nm in Embodiment 8. The TaN film is formed by sputtering using a Ta target and a gas mixture of Ar and nitrogen. The W film is formed by sputtering with a W target. In addition, the W film can be formed by thermal CVD using tungsten hexafluoride ($WF_6$). Whatever is used, it is necessary to make the material have low resistance for use as the gate electrode. By making the crystal grains large, it is possible to make the W film have lower resistivity, and for cases when there are many impurity elements such as oxygen within the W film, crystallization is inhibited and the resistance becomes higher. By forming the W film using a target having a purity of 99.9999%, and in addition, taking sufficient consideration so that there is no mixing in of impurities within the gas phase during film deposition, a resistivity of 9 to 20 µΩcm can be realized.

The gate electrode is formed by a two stage etching process. A mask 314 is formed from resist, as shown in FIG. 18(A), and a first etching process is performed. There are no limitations placed on the etching process, but ideally an ICP (inductively coupled plasma) etching device is used, and etching is performed using $CF_4$ and $Cl_2$ as etching gasses, at a pressure of 0.5 to 2 Pa, preferably at 1 Pa, with an RF (13.56 MHz) input of 500 W from a coil shape electrode, performing plasma generation. A 100 W RF (13.56 MHz) power is input to the substrate side (sample stage) as well, substantially applying a negative self bias voltage. When $CF_4$ and $Cl_2$ are mixed, the W film and the Ta film can be etched at approximately the same rate.

In the first etching process, processing is performed so that edge portions of the first conductive film and the second conductive film are made into a tapered shape. The angle of the tapered portion is set from 15 to 45°. However, in order to etch without any residue remaining on the gate insulating film, an over-etching process, in which the etching time is increased by a ration on the order of 10 to 20%, may be performed. The selectivity of the silicon nitride oxide film is 2 to 4 (typically 3) with respect to the W film, and therefore the silicon nitride oxide film is etched on the exposed surface by approximately 20 to 50 nm due to the over-etching process. First shape conductive layers 315 to 318 (first conductive layers 315a to 318b and second conductive layers 315b to 318b) are thus formed from the first conductive film and the second conductive film by the first etching process.

A second etching process is performed next, as shown in FIG. 18(B). The ICP etching device is used, and $CF_4$, $Cl_2$, and $O_2$ are mixed as the etching gas, and a plasma is generated at a pressure of 1 Pa with 500 WRF power (13.56 MHz) supplied to a coil type electrode. The substrate side (sample stage) is supplied with 50 W RF (13.56 MHz) power, which, when compared to the first etching process, becomes a lower self-bias voltage. The W film is anisotropically etched in accordance with these conditions, and the Ta film is anisotropically etched at a slower etching rate, forming second shape conductive films 319 to 322 (first conductive layers 319a to 322a and second conductive layers 319b to 322b). The gate insulating film is not shown in detail in the figures, but a region not covered by the second shape conductive layers 315 to 318 is etched on the order of 20 to 50 nm, becoming thinner.

Two types of impurity regions having different concentrations are then formed, as shown in FIG. 18(C). Both types of impurity regions are n-type, and an impurity element which imparts n-type conductivity, such as phosphorous (P) or arsenic (As) is added by ion doping or ion implantation. A first doping process forms first impurity regions 323 to 326 in a self-aligning manner with the second conductive layers 319b to 322b as masks. Conceptually, high acceleration voltage, low dosage conditions are selected, and the concentration of the impurity element which imparts n-type conductivity added in the first impurity regions 323 to 326 is set from $1\times10^{16}$ to $1\times10^{19}$ atoms/cm³. For example, ion doping is performed using phosphine ($PH_3$) with the acceleration voltage set between 70 and 120 keV and with a dosage of $1\times10^{13}$ atoms/cm².

Low acceleration, high dosage conditions are selected for a second doping process performed next, performing the formation of impurity regions 327 to 330. The impurity element concentration of the second impurity regions 327 to 330 is set to a range of $1\times10^{20}$ to $1\times10^{21}$ atoms/cm³. One example of ion doping condition to attain that concentration is a dosage set between $1\times10^{13}$ and $5\times10^{14}$ atoms/cm², and an acceleration voltage of 30 to 70 keV. Thus the first impurity regions 323 to 326 formed in the semiconductor layer are formed overlapping the first conductive layers 319a to 322a, and the second impurity regions 327 to 330 are formed external to the second shape conductive layers 315 to 318.

Third impurity regions 332 to 335 in which an impurity element for imparting p-type conductivity are formed in the semiconductor layers 308 and 310 forming p-channel type TFTs, as shown in FIG. 18(D). The island shape semiconductor layers 309 and 311 forming the n-channel type TFTs are covered over their entire surface by a mask 331 as a resist at this point. Phosphorous (P) is added into each of the impurity regions 332 to 335 at different concentrations, and the p-type imparting impurity element is added by ion doping using diborane ($B_2H_6$), and even in shifted regions the p-type imparting impurity element is formed to have a concentration from $2\times10^{20}$ to $2\times10^{21}$ atoms/cm$^3$.

The impurity regions are formed in each of the semiconductor layers up through the above processes. The second conductive layers 319 to 322 function as gate electrodes. A first interlayer insulating film is then formed, as shown in FIG. 18(E). The first interlayer insulating film 336 is formed from a silicon nitride oxide film having a thickness of 100 to 200 nm. A process of activating the impurity elements added into each of the semiconductor layers is performed next with the aim of controlling the conductivity type. Thermal annealing using an annealing furnace, laser annealing, or rapid thermal annealing (RTA) can be applied to this process. Thermal annealing is performed at 400 to 700° C., typically between 500 and 600° C., in a nitrogen atmosphere having an oxygen concentration equal to or less than 1 ppm, preferably equal to or less than 0.1 ppm.

Laser annealing uses excimer laser light having a wavelength equal to or less than 400 nm, or the second harmonic (532 nm) of a YAG laser or a $YVO_4$ laser. The activation conditions may be appropriately selected by the operator, and when the excimer laser is used, the pulse emission frequency is set to 30 Hz and the laser energy density is set from 100 to 300 mJ/cm$^2$. Further, when the YAG laser is used, the second harmonic is used, with the pulse emission frequency set from 1 to 10 KHz, and the laser energy density may be set from 200 to 400 mJ/cm$^2$. The laser light, which is collected into a linear shape having a width from 100 to 1000 µm, for example 400 µm, is then irradiated by being passed over the entire substrate surface, and the process is performed at this point so that the overlap ratio of the linear shape laser light is from 80 to 98%.

In addition, a hydrogenation process of the semiconductor layer is performed by performing heat treatment for 1 to 12 hours at 300 to 450° C. in an atmosphere containing between 3 and 100% hydrogen. This process is one of terminating dangling bonds in the semiconductor layers by thermally excited hydrogen. Plasma hydrogenation (using hydrogen which is excited by the a plasma) may also be used as another means of hydrogenation.

A second interlayer insulating film 337 is formed with an average film thickness of 1.0 to 2.0 µm using an inorganic insulating material such as silicon oxide or silicon nitride, or an organic insulating material. A material such as polyimide, acrylic, polyamide, polyimideamide, BCB (benzocyclobutene) can be used as the organic insulating material. For example, when using a thermally setting type polyimide, it is formed by firing in a clean oven at 300° C. after application to the substrate. Further, when acrylic is used, a dual solution system is used, and after mixing a main material and a hardening agent, it is applied to the entire substrate by using a spinner, after which provisional heat treatment is performed on a hotplate for 60 seconds at 80° C., and then firing is performed for 60 minutes at 250° C. using a clean oven.

Wirings 338 to 345 for contacting the second impurity regions or a third impurity regions formed in the semiconductor layers are then formed. The wirings are formed from a 50 to 200 nm thick Ti film 768a, a 100 to 300 nm thick Al film 768b, and a 50 to 200 nm thick tin (Sn) film or Ti film with the wirings 338 to 345 formed by this type of structure, the Ti film formed first contacts the semiconductor layers and the heat resistance of the contact portion is increased.

The driver circuit having the p-channel type TFTs 346 and 348, and the n-channel type TFTs 347 and 349 can thus be formed. The gate insulating film of the p-channel type TFT 348 and the n-channel type TFT 349 is formed thicker than the gate insulating film of the p-channel type TFT 346 and the n-channel type TFT 347, becoming a structure in which voltage resistance is increased.

The p-channel type TFT 346 has: a channel forming region 350; a third impurity region 351 overlapping the second conductive film 319, the gate electrode; and a third impurity region 352 formed externally to the gate electrode. Further, the p-channel type TFT 348 has: a channel forming region 356; a third impurity region 357 overlapping the second conductive layer 321, the gate electrode; and a third impurity region 358 formed externally to the gate electrode. The p-channel type TFTs are single drain structures, and the third impurity regions function as sources or drains.

The n-channel type TFT 347 is formed from: a channel forming region 353; a first impurity region 354 overlapping the second conductive layer 320, the gate electrode; and a second impurity region 355 formed externally to the gate electrode. Further, the n-channel type TFT 349 is formed from: a channel forming region 359, a first impurity region 360 overlapping the second conductive layer 322, the gate electrode; and a second impurity region 361 formed externally to the gate electrode. The first impurity regions 354 and 360 are LDD (lightly doped drain) regions, and the second impurity regions 355 and 361 are regions functioning as source regions or drain regions. In particular, the first impurity regions are GOLD (gate overlapped drain) structures formed overlapping the gate electrodes, and therefore degradation of the TFT due to the hot carrier effect can be prevented, and even if a high voltage equal to or greater than 10 V is applied, extremely stable operation can be obtained.

Whichever is used, these TFTs are formed with a channel length of 1 to 5 µm, preferable between 1.5 and 2.5 µm. Therefore, design rules which must be applied may have a precision for line and space (line width and an interval between adjoining lines) of 1 to 1.5 µm, and on the order of 2 µm for contact holes.

The TFTs manufactured in Embodiment 8 are suitable for forming the scanning line side stick driver. In particular, the p-channel type TFT 348 and the n-channel type TFT 349 shown in FIG. 18(E) are applied to forming circuits, such as the buffer circuit, having a high applied voltage on the order of 30 V. Further, the p-channel type TFT 346 and the n-channel type TFT 347 may be applied in forming circuits such as the shift register circuit. Processes of forming the n-channel type TFTs and the p-channel type TFTs are shown here, but it can be assumed that the same process can be easily used to form a capacitive element or a resistive element, and therefore that is omitted. Furthermore, the TFT size required for circuit formation (channel length/channel/width) and the layout may suitably determined by the operator.

Embodiment 9

The voltage resistance required by a stick driver TFT formed in a source line side is on the order of 12 V, but the operating frequency is equal to or greater than 50 MHz (for example, 65 MHz) at 3V. A method of manufacturing a TFT suitable for such is explained in Embodiment 9.

Material quality with which it is possible to realize a high electric field effect mobility and a low subthreshold coefficient (S value) is required in a crystalline semiconductor film forming a channel forming region of the TFT. In other words, the crystalline semiconductor film having characteristics in which a fault level becomes trap centered or recombination centered, and in which the grain boundary potential is low. FIG. 19 show one example of a method of manufacturing such a crystalline semiconductor film.

A substrate able to withstand heat treatment at 600° C. (preferably 950° C.) and having an insulating surface can be applied as a substrate 401 in FIG. 19(A). From the viewpoint of quality and surface finishing precision, a quartz substrate is suitable. A semiconductor film 402 having an amorphous structure and formed in intimate contact with the quartz substrate 401 is formed with a thickness of 25 to 100 nm by plasma CVD or reduced pressure CVD. Films such as an amorphous silicon (a-Si) film, an amorphous silicon germanium (a-SiGe) film, an amorphous silicon carbide (a-SiC) film, and an amorphous silicon tin (a-SiSn) film are typical semiconductor films having an amorphous structure, and any of these can be applied. A layer containing a catalyst element capable of lowering the crystallization temperature of the amorphous semiconductor film is then formed. In FIG. 19(A) this is formed on the semiconductor film 402 having an amorphous structure, but it may also be formed on the substrate side. Catalyst elements capable of being applied here are the same as those of Embodiment Mode 2, and are formed by a similar method.

Heat treatment is then performed for 1 to 12 hours at 500 to 600° C. in a nitrogen or argon atmosphere, performing crystallization of the semiconductor film having an amorphous structure. Before crystallizing at this temperature, it is necessary to perform heat treatment at 400 to 500° C. for on the order of 1 hour, to drive out hydrogen contained within the film. Typical conditions are that heat treatment is performed for 8 hours at 570° C. after dehydrogenating processing for 1 hour at 450° C. A crystalline semiconductor film 404 having a crystalline structure is formed from the amorphous silicon film by this type of thermal crystallization method. (See FIG. 19(B).)

However, the concentration of the catalyst element remaining in the crystalline semiconductor film 404 is approximately $5 \times 10^{16}$ to $2 \times 10^8$ atoms/cm². The catalytic element is effective in crystallization of the semiconductor film, but as a material functioning to form TFTs later, it exists unnecessarily with regard to usage aims. The catalyst element existing within the crystalline semiconductor film acts as an impurity, forming such things as a fault level, and forming trap centers or recombination centers, and brings about semiconductor junction defects. FIG. 19(B) is for explaining a gettering process for removing the catalyst element, and an aim is to reduce the concentration of the catalytic element within the crystalline semiconductor film to $1 \times 10^{17}$ atoms/cm³ or less, preferably to $1 \times 10^{16}$ atoms/cm³ or less.

First, a 150 nm thick insulating film 405 is formed as a mask from a film such as a silicon oxide film on the surface of the crystalline semiconductor film 404. An opening 406 is formed externally to a region forming an active layer, forming a region in which the surface of the crystalline semiconductor film is exposed. Phosphorous (P) is then added by ion doping or ion injection, forming a region 407 in the crystalline semiconductor film in which phosphorous has been selectively added. If heat treatment is performed in this state for 5 to 24 hours at 550 to 800° C. in a nitrogen atmosphere, for example for 12 hours at 600° C., then the phosphorous (P) added region 407 works as a gettering site, and the catalytic element remaining in the crystalline semiconductor film 404 can be segregated in the phosphorous (P) added region 407.

By next removing the mask insulating film 405 and the phosphorous (P) added region 407 by etching, a crystalline semiconductor film 408, in which the catalyst element concentration can be reduced to $1 \times 10^{17}$ atoms/cm³ or less can be obtained. (See FIG. 19(C).)

Further, FIG. 20 show another example of a method of forming a crystalline semiconductor film. A substrate 410 and a semiconductor film 411 having an amorphous structure used in FIG. 20(A) are similar to those explained in FIG. 19(A). An insulating film 412 for a mask is formed on the semiconductor film 411 having an amorphous structure, and an opening 414 is selectively formed. A solution containing between 1 and 100 ppm by weight of a catalyst element is next applied, forming a catalyst element containing layer 413. The catalyst element containing layer 413 is formed with a structure contacting the semiconductor film 411 having an amorphous structure only in the opening 414.

Heat treatment is performed next at 500 to 650° C. for between 1 and 24 hours, for example at 600° C. for 12 hours, forming a crystalline semiconductor film. Crystallization proceeds from where the catalytic element contacts the semiconductor film 415 in this crystallization process, and crystallization progresses in a direction parallel to the surface of the substrate 410 (horizontal direction). The crystalline semiconductor film thus formed is composed of a collection of rod shape or needle shape crystals, and looking macroscopically, are grown possessing a certain fixed directionality, and therefore there is an advantage of the crystallinity being matched.

After forming the crystalline semiconductor film, a gettering process is performed for removing the catalyst element from the crystalline semiconductor film, similar to that of FIG. 19(B). Phosphorous (P) is added from the opening 414 already formed, forming a phosphorous (P) added region 416 in the crystalline semiconductor film. Heat treatment is performed in this state in a nitrogen atmosphere at 550 to 800° C. for 5 to 24 hours, for example at 600° C. for 12 hours, segregating the catalyst element which remains in the crystalline semiconductor film into the phosphorous (P) added region 416. (See FIG. 20(C).)

By next removing the mask insulating film 412 and the phosphorous (P) added region 416 by etching, a crystalline semiconductor film 417 in which the catalyst element concentration is reduced to $1 \times 10^{17}$ atoms/cm³ or less can be obtained. (See FIG. 20(D).)

The crystalline semiconductor film 408 shown in FIG. 19(C) and the crystalline semiconductor film 417 shown in FIG. 20(D) are both suitable for use in forming an active layer of the TFT. Island shape semiconductor films 420 to 423 are formed by partitioning this type of crystalline semiconductor film into island shapes, as in FIG. 21(A). For convenience, four semiconductor layers are shown in FIG. 21(A). Subsequent explanation is made by assuming that the semiconductor layers 420 and 421 are manufactured into TFTs of circuits driven at a low voltage, such as a shift register circuit, and that the semiconductor layers 422 and 423 are manufactured into TFTs of circuits driven at a high voltage, such as a latch circuit. The latter is formed with a thin gate insulating film in order to make it capable of high speed operation. Therefore, a two stage film deposition process is performed.

In consideration of the driving voltage of the circuits, the gate insulating films formed on the semiconductor layers are formed with different film thicknesses, even though for TFTs formed on the same substrate. Therefore, a two stage film deposition process is necessary. Initially, an insulating film such as a silicon oxide film or a silicon nitride oxide film is formed with a thickness of 20 to 50 nm, for example 40 nm. This type of insulating film is formed by plasma CVD or thermal CVD. One example of manufacturing conditions for thermal CVD is the use of $SiH_4$ and $N_2O$, a temperature of 800° C., and a pressure of 40 Pa, and by suitably setting the gas mixture ration, a dense film can be formed. The insulating film formed on the semiconductor layers 422 and 423 are removed next by etching with a substance such as hydrofluoric acid, forming a first insulating film 424. In addition, the surface is cleaned of contaminants and formation of an oxide film is performed in an atmosphere containing a halogen (typically chlorine) at 800 to 1000° C. (preferably 950° C.). The oxide film is formed to have a thickness of 30 to 50 nm (for example, 40 nm) in the semiconductor layers 422 and 423. As a result, an 80 nm thick insulating film is formed on the semiconductor layers 420 and 421. By forming the oxide film in the halogen atmosphere, microscopic amounts of impurities such as metallic impurities are removed, and a good insulating film, in which the interface level density with the semiconductor film is reduced, can be formed. Thus a second insulating film 425 having a different thickness between the semiconductor layers 420 and 421, and the semiconductor layers 422 and 423, is formed, and the insulating film is utilized as a gate insulating film. (See FIG. 21(B).)

Additionally, in FIG. 21(B) a first conductive film 426 and a second conductive film 427 are formed on the second insulating film 425 in order to form a gate electrode. These conductive films are manufactured similarly to Embodiment Mode 1, and the first conductive film 426 is formed from a TaN film with a 50 to 100 nm thickness, and the second conductive film 427 is formed from a W film having a 100 to 300 nm thickness.

Subsequent processing is performed similarly to that of Embodiment Mode 2, forming n-channel type TFTs and p-channel type TFTs. The formation of the gate electrode is performed by two stage etching. FIG. 21(C) shows a state in which a resist mask 428 is formed, and then first shape conductive layers 429 to 432 (first conductive layers 429a to 432a and second conductive layers 429b to 432b) are formed by a first etching process in which taper etching is performed. Further, FIG. 21(D) shows a state in which second shape conductive layers 433 to 436 (first conductive layers 433a to 436a and second conductive layers 433b to 436b) are formed by a second etching process by anisotropic etching.

The formation of impurity regions of the n-channel type TFTs and the p-channel type TFTs is in a self-aligning manner, using the second shape conductive layers. Two types of impurity regions having different concentrations are formed in the n-channel type TFTs. FIG. 21(E) shows first impurity regions 437 to 440 formed by a first doping process (conditions of high acceleration voltage and low dosage) and second impurity regions 441 to 444 formed by a second doping process (conditions of low acceleration voltage and high dosage). As for the impurity regions of the p-channel type TFTs, as shown in FIG. 21(F), a resist mask 445 is formed so as to protect a region in which the n-channel type TFT is formed, and regions 446 to 449, in which an impurity element for imparting p-type conductivity is added, are formed by a third doping process.

After forming the impurity regions, a first interlayer insulating film 450 is formed, and activation of the impurity elements is performed by performing heat treatment at 400 to 700° C. In addition, heat treatment is performed for 1 to 12 hours at 300 to 450° C. in an atmosphere containing 3 to 100% hydrogen, hydrogenating the semiconductor layers and performing reduction of the defect level density. A second interlayer insulating film 451 is formed with an average thickness of 1.0 to 2.0 µm from an inorganic insulating material such as silicon oxide or silicon nitride oxide, or by using an organic insulating material. Wirings 452 to 459 are formed from a material such as Al or Ti.

A driver circuit having p-channel type TFTs 460 and 462, and n-channel type TFTs 461 and 463 can thus be formed. The gate insulating films of the p-channel type TFT 462 and the n-channel type TFT 463 are formed thinner than the gate insulating films of the p-channel type TFT 460 and the n-channel type TFT 461, becoming a structure driven at high speed by a low voltage. The former TFTs are suitable for forming a circuits such as a latch circuit driven at a low voltage of 3 to 5 V, and the latter TFTs are suitable for forming a circuit such as a shift register circuit driven at a voltage of 5 to 12 V.

The channel length of these TFTs is from 0.3 to 1 µm (preferably 0.6 µm) for the low voltage portion, and from 0.6 to 1.5 µm (preferably 0.9 µm) for the mid-level voltage portion. Therefore, it is necessary for design rules which must be applied to have precision of 0.3 to 1.5 µm for line and space (line width and an interval between adjoining lines), and on the order of 0.9 µm for contact holes.

The TFTs manufactured in Embodiment 9 are suitable for forming the stick driver of the source line side. In particular, a circuit such as a latch circuit driven at 3 V at several tens of MHz is formed using the p-channel type TFT 462 and the n-channel type TFT 463 shown in FIG. 21(E). Further, a circuit such as a shift register circuit may be formed by applying the p-channel type TFT 460 and the n-channel type TFT 461. Processes of forming the n-channel type TFTs and the p-channel type TFTs are shown here, but it can be easily assumed that the same process can be used to form a capacitive element or a resistive element, and therefore that is omitted. Furthermore, the TFT size required for circuit formation (channel length/channel width) and the layout thereof may be suitably determined by the operator.

Embodiment 10

Another example of a method of manufacturing a TFT suitable for a stick driver formed in a source line side is shown. A process of forming a crystalline semiconductor film for forming an active layer of the TFT is the same as that of Embodiment Mode 3. In FIG. 22(A), a quartz substrate having an insulating surface and able to withstand heat treatment at 600° C. (ideally 950° C.) is suitable as a substrate 901. A semiconductor film 902 having an amorphous structure and formed in close contact with this type of substrate 401 is formed with a thickness of 40 to 100 nm, for example 70 nm, by plasma CVD or reduced pressure CVD. To form a good quality crystalline semiconductor film on the quartz substrate, it is necessary to make the film thickness of the amorphous semiconductor film formed as a start film somewhat thick. If the film thickness is equal to or less than 30 nm, then there is a fear that crystallization cannot be sufficiently achieved due to influences such as lattice misalignment between the film and the substrate as a base. The semiconductor film having an amorphous structure is the same material as that shown in Embodiment Mode 2 or Embodiment Mode 73, and typically amorphous silicon is used. A layer 903 containing a catalyst element capable of lowering the crystallization temperature of the amorphous semiconductor film is then formed.

Crystallization consists of performing dehydrogenation by heat treatment for 1 hour at 450° C. and performing next heat treatment for 12 hours at 600° C. As shown in FIG. 22(B), an insulating film 905 used as a mask is formed on a crystalline semiconductor film 904 thus obtained, and phosphorous (P) is added from an opening 906, forming a phosphorous (P) added region 907. A gettering process for removing the catalyst element is performed by heat treatment in a nitrogen atmosphere at 550 to 800° C. for 5 to 24 hours, for example at 600° C. 12 hours, segregating the catalyst element remaining in the crystalline semiconductor film 904 into the phosphorous (P) added region 907. The mask insulating film 905 and the phosphorous (P) added region 907 are removed afterward by etching, and a crystalline semiconductor film 908 in which the catalyst element concentration is reduced to $1 \times 10^{17}$ atoms/cm$^3$ or less is obtained. The amorphous semiconductor film becomes dense due to crystallization, and therefore its volume shrinks on the order of 1 to 10%, and the film thickness is reduced slightly.

FIG. 22(C) shows a process of oxidizing, by heat treatment, the crystalline semiconductor film thus formed. Thermal oxidation is performed by forming an oxide film in an atmosphere containing a halogen (typically chlorine) at 800 to 1000° C. (typically 950° C.). The crystalline semiconductor film 908 becomes thinner by the formation of an oxide film 909, and becoming thinner than the original thickness. For example, by forming the oxide film with a thickness of 60 nm, the semiconductor film is reduced by approximately 30 nm, and 40 nm of the crystalline semiconductor film can remain. (See FIG. 22(C).)

Semiconductor films 911 to 914 are formed by partitioning the crystalline semiconductor film 908 thus formed into island shapes by an etching process. In consideration of the driving voltage of the circuits, gate insulating films formed on the semiconductor films are formed with different film thicknesses, even though for TFTs formed on the same substrate. FIG. 22 show the formation process, and an insulating film such as a silicon oxide film or a silicon nitride oxide film is formed initially with a thickness of 20 to 50 nm, for example 40 nm. These insulating films are formed by plasma CVD or by thermal CVD. One example of manufacturing conditions in thermal CVD is the use of SiH$_4$ and N$_2$O, at a temperature of 800° C. and a pressure of 40 Pa, and by suitably setting the gas mixture ratio, a dense film can be formed. The insulating film formed on the semiconductor layers 913 and 914 is removed next by etching with a substance such as hydrofluoric acid, forming a first insulating film 915. In addition, the surface is cleaned of contaminants and formation of an oxide film is performed in an atmosphere containing a halogen (typically chlorine) at 800 to 1000° C. (preferably 950° C). The oxide film is formed to have a thickness of 30 to 50 nm (for example, 40 nm) in the semiconductor layers 913 and 914. On the other hand, an 80 nm thick insulating film is formed in the semiconductor layers 911 and 912. By forming the oxide film in the halogen atmosphere, microscopic amounts of impurities such as metallic impurities are removed, and a good insulating film, in which the interface level density with the semiconductor film is reduced, can be formed. Thus a second insulating film 916, having a different thickness between the semiconductor layers 911 and 912, and the semiconductor layers 913 and 914, is formed, and the insulating film is utilized as a gate insulating film.

Care must be taken for a gate electrode formed on the gate insulating film because the gate insulating film is formed thin. Of course it is possible to use a metallic conductive material formed by sputtering or vacuum evaporation, but it is more preferable to use a polycrystalline silicon film manufactured by reduced pressure CVD in which a first layer is contacting the gate insulating film is doped with phosphorous (P). The phosphorous (P) doped polycrystalline silicon film is formed with a thickness of 100 to 200 nm, preferably 150 nm, by using SiH$_4$ and PH$_3$, with He and H$_2$ used as dilution gasses, and heating at 450 to 500° C. In addition, in order to reduce the resistance value of the gate electrode a material such as a metallic silicide is formed in an upper layer. There is no limitation on applicable metallic silicides, such as tungsten silicide (WSi$_x$) or titanium silicide (TiSi$_x$), and the film may be formed by a method such as sputtering to a thickness of 100 to 200 nm, preferably 150 nm.

As shown in FIG. 22(F), gate electrodes 917 to 920 (first conductive layers 917*a* to 920*a* and second conductive layers 917*b* to 920*b*) are thus formed in a state of being divided into two layers, first conductive layers, and second conductive layers.

A first doping process is performed next in order to form LDD regions of n-channel type TFTs. A typical method for the doping is to perform ion doping using phosphine (PH$_3$), and first impurity regions 921 to 924 are formed in a self-aligning manner using the gate electrodes as masks. The phosphorous (P) concentration of these regions is set within a range of $2 \times 10^6$ and $5 \times 10^{19}$ atoms/cm$^3$. (See FIG. 23(A).)

In addition, a second doping process is performed, forming second impurity regions 927 and 928 in which an n-type impurity is added. These impurity regions form source regions and drain regions of the n-channel type TFT, and a resist mask 926 is formed in order to form the impurity regions in a region external to the gate electrode. Further, a resist mask 925 is formed so that phosphorous (P) is not added to the semiconductor layers forming p-channel type TFTs. Phosphorous (P) is used as an impurity element which imparts n-type conductivity, and ion doping using phosphine (PH$_3$) is performed so that the phosphorous concentration is within a concentration range of $1 \times 10^{20}$ and $1 \times 10^{21}$ atoms/cm$^3$. (See FIG. 23(B).)

Then, as shown in FIG. 23(C), third impurity regions 930 and 931 for forming source regions and drain regions in the semiconductor layers forming the p-channel type TFTs are formed. Ion doping is performed using diborane (B2H6) with the gate electrode 612 as a mask, forming the third impurity regions in a self-aligning manner. The entire surface of the semiconductor layers forming the n-channel type TFT is covered by a resist mask 929 at this time. The boron (B) concentration in the third impurity regions is set to be from $3 \times 10^{20}$ and $3 \times 10^{31}$ atoms/cm$^3$.

After forming the impurity regions, a first interlayer insulating film 932 is formed from a film such as a silicon nitride film, a silicon oxide film, or a silicon nitride oxide film, and impurity activation is performed by performing heat treatment for 10 to 60 minutes at 400 to 950° C., preferably between 800 and 900° C. The impurity elements diffuse into the gate electrode side by the heat treatment, forming overlap regions 533 to 536. (See FIG. 23(D).) A second interlayer insulating film 937 is formed with an average film thickness of 1.0 to 2.0 μm using an inorganic insulating material such as silicon oxide or silicon nitride oxide, or by using an organic insulating material. Wirings 938 to 945 are formed from a material such as Al or Ti. In addition, heat treatment is performed for 1 to 12 hours in an atmosphere containing 3 to 100% hydrogen at 450° C., hydrogenating the semiconductor layers and performing a process of reducing the defect level density. (See FIG. 23(E).)

A driver circuit having p-channel type TFTs 946 and 948, and n-channel type TFTs 947 and 949 can thus be formed. The gate insulating films of the p-channel type TFT 948 and the n-channel type TFT 949 are formed thinner than the gate insulating films of the p-channel type TFT 946 and the n-channel type TFT 947, becoming a structure driven at high speed by a low voltage. The former TFTs are suitable for forming a circuits such as a latch circuit driven at a low voltage of 3 to 5 V, and the latter TFTs are suitable for forming a circuit such as a shift register circuit driven at a voltage of 5 to 12 V.

The p-channel type TFTs 946 and 948 have a single drain structure composed of channel forming regions 950 and 955, and source or drain regions 946 and 956 made from the third impurity regions. The n-channel type TFTs 947 and 949 are composed of channel forming regions 952 and 957, LDD regions 953 and 958 formed from the first impurity regions, and source or drain regions 954 and 959 formed from the second impurity regions. The LDD regions formed in the n-channel type TFTs are formed with a length of 0.2 to 1 µm, and approximately 0.1 µm diffuses into the gate electrodes by the activation heat treatment, forming a structure in which the LDD regions overlap a gate electrode. With this structure, it is possible to prevent degradation of the characteristics due to the hot carrier effect, and it is possible to operate at high speed while reducing the parasitic capacitance to a minimum level.

The channel length of these TFTs is from 0.3 to 1 µm (preferably 0.6 µm) for the low voltage portion, and from 0.6 to 1.5 µm (preferably 0.9 µm) for the mid-level voltage portion. Therefore, it is necessary for design rules which must be applied to have precision of 0.3 to 1.5 µm for line and space (line width and an interval between adjoining lines), and on the order of 0.9 µm for contact holes.

The TFTs manufactured in Embodiment 10 are suitable for forming the stick driver of the source line side. In particular, a circuit such as a latch circuit driven at 3 V at several tens of MHz is formed using the p-channel type TFT 948 and the n-channel type TFT 949 shown in FIG. 23(E). Further, a circuit such as a shift register circuit may be formed by applying the p-channel type TFT 946 and the n-channel type TFT 947. Processes of forming the n-channel type TFTs and the p-channel type TFTs are shown here, but it can be easily assumed that the same process can be used to form a capacitive element or a resistive element, and therefore that is omitted. Furthermore, the TFT size required for circuit formation (channel length/channel width) and the layout thereof may be suitably determined by the operator.

Embodiment 11

A driver circuit of a scanning line side stick driver or a source line side stick driver can be formed from a TFT manufactured in accordance with any of the methods of Embodiments 8 to 10. An input-output terminal formed in this type of stick driver is formed on the same layer as a source wiring or a drain wiring, as shown in FIG. 24. Input-output terminals 2400 and 2401 are shown in FIG. 24 in a state of being formed in an edge portion of a stick substrate. In order to mount the input-output terminal on a first substrate on which a pixel region is formed by using a face down COG method, surface passivation is necessary, and therefore the surface is passivated by an insulating layer 2402. This type of input-output terminal portion can also be applied to a stick substrate manufactured in Embodiment Modes 2 to 4.

Further, it is necessary to form a bump on the input-output terminal for mounting the stick driver by COG. The bump may be formed by a known method, and one such example is explained using FIG. 25. In FIG. 25(A), reference numeral 2403 denotes an input-output terminal formed on the same layer as the source wiring or the drain wiring, and a barrier metal layer 2405 is formed on the input-output terminal 2403 from a lamination of Ti and Pd, or Cr and Cu. A method such as sputtering or vacuum evaporation is applied to the formation of the barrier metal layer. A resist mask 2406 for plating use is then formed.

Then, as shown in FIG. 25(B), a bump 2407 formed from Au is formed with a thickness of 5 to 25 µm by electroplating. The unnecessary resist mask 2406 is then removed, and resist is applied anew onto the bump, forming a resist mask 2408 for etching the barrier metal layer 2405. The photolithography process for forming this resist mask is performed through the bump, and therefore a high resolution cannot be obtained. The resist mask 2408 is formed to cover the bump and its periphery. By utilizing the resist mask 2408 and etching the barrier metal layer, a barrier metal layer 2409 is formed as shown in FIG. 25(D). Heat treatment is performed next at 200 to 300° C. in order to increase the adhesion of the bump and the barrier metal layer. A stick driver capable of being mounted on other substrates is thus completed.

Embodiment 12

The stick driver explained above can be used as a method of mounting a driver circuit of a liquid crystal display device. FIG. 26 shows a block structure diagram of such a display device. A pixel region 1601 is formed from an active matrix structure in which reverse stagger type TFTs like those shown in Embodiments 1 to 7 are formed at the intersections formed from a plurality of scanning lines and source lines. A scanning line stick driver 1602 and a source line stick driver 1603 are formed in a periphery region. A clock signal and a data signal 1607, and a picture quality signal 1608 input from the outside are input to a control circuit 1605 for converting to the stick driver input specifications, and are converted to the respective timing specifications. Further, a power source 1609 and a power source circuit 1606 made from an op-amp are provided by circuits attached externally. By mounting this type of control circuit 1605 and power source circuit 1606 by the TAB method, the display device can be made smaller.

These signals are output from the control circuit 1605 to the scanning line side and the source line side. A signal dividing circuit 1604 is formed in the source line side, and an input digital signal is partitioned into m pieces and supplied. The number of partitions m is a natural number equal to or greater than 2, and in practice it is suitable to partition into 2 to 16 pieces. In this case, if the number of input digital signal lines 1610 is taken as n, then the number of correcting digital signal lines 1620 becomes n×m. Although depending upon the pixel density, at least a plurality of source line side stick drivers is formed, and the load on the stick drivers is reduced by lowering the frequency of the digital signal input from the signal dividing circuit to 1/m. The signal dividing circuit may be implemented by an IC chip formed from a semiconductor integrated circuit, and it is also possible to form the signal dividing circuit by the same chip as that of the stick driver formed from integrated circuits of the TFTs shown in Embodiment 3 or Embodiment 4.

Embodiment 13

FIG. 27 shows an example of a signal dividing circuit. For convenience in Embodiment 13, an explanation is made with the number of input digital signal lines n set to 1, and the number of signal partitions m set to 4. Latch circuit pre-stages 1301 to 1304 and latch post-stages 1305 to 1308 are each composed of two inverters 1372 and 1374, and four clocked inverters 1371, 1373, 1375, and 1376, as shown in FIG.

27(B). A signal input portion 1381 corresponds to reference numeral 1361, a signal output portion 1382 corresponds to reference numeral 1362, and clock signal input portions 1383 and 1384 correspond to reference numerals 1363 and 1364, respectively.

A clock signal of a clock signal line 1322 and an inverted clock signal line 1323 is input into a counter circuit 1309, and when input is received from a reset signal 1326, sends an output to reverse clock signal line 1324 and an inverted reverse clock signal line 1325. The input digital signal is input from reference numeral 1321, and is sent in order from the latch circuit pre-stage 1301 to 1302 for each period of the clock signal. When the reverse clock signal is then inverted, the electric potential information of the input digital signal stored in the latch circuit pre-state is moved to the latch circuit post-stage. For example, the electric potential information of the latch circuit pre-stage 1301 is moved to the latch circuit post-stage 1305. Through this type of operation, the reverse digital signal is sent out from each of the reverse digital signal lines 1331 to 1334 connected to the output portion of the latch circuit post-stages 1305 to 1308. A case in which the number of partitions m is set equal to 4 is explained, and therefore the frequency of the reverse digital signal becomes ¼ the frequency of the input digital signal. Of course, the number of partitions is not limited to 4, and can be freely selected within a range of 2 to 32 (in practice, from 4 to 16).

Embodiment 14

One example of a circuit structure of the stick driver circuit, shown in FIG. 26, formed in the source line side is shown in FIG. 28. From the input side, the circuit structure is formed from a shift register circuit 1801, latch circuits 1804 and 1805, a level shifter circuit 1806, and a D/A conversion circuit 1807. When an input digital signal is n-bits expressing information for one pixel for performing RGB display, if the input digital signal is partitioned into m partitions, then m×3×n latch circuits 1804, and m×3×n latch circuits 1805 are required, and m×3 level shifter circuits 1806 and m×3 D/A converter circuits 1807 are needed.

FIG. 21 is a typical example of a latch circuit, FIG. 29(A) is an example using a clocked inverter, FIG. 29(B) is an SRAM type circuit, and FIG. 29(C) is DRAM type circuit. These are typical examples, and other structures are also possible.

The shift register circuit and the latch circuit have a driver voltage of 3 V, and send a signal, amplified to 10 V by the level shifter circuit, to the D/A converter circuit. A resistance partitioning type or a switched capacitance type can be employed as the D/A converter circuit.

TFTs forming the shift register circuit and the latch circuit may be manufactured using the p-channel type TFT 462 or the n-channel type TFT 463 shown in FIG. 21(G) in Embodiment Mode 3, or by using the p-channel type TFT 548 or the n-channel 549 sown by FIG. 23(E) in Embodiment Mode 4.

Embodiment 15

FIG. 30 is a diagram schematically showing a state of a liquid crystal display device being constructed using the stick driver of the present invention. A pixel region 803, an external input-output terminal 804, and a connection wiring 805 are formed on a first substrate. The pixel region 803 is manufactured by the reverse stagger type TFTs shown in Embodiment Mode 1. The regions enclosed by a dotted line are a region 801 for attaching the scanning line side stick driver and a region 802 for attaching the source line side stick driver. An opposing electrode 809 is formed in a second substrate 808, and the second substrate 808 is joined to the first substrate 800 by a sealing material 810. A liquid crystal is injected inside the sealing material 810, forming a liquid crystal layer 811. The first substrate and the second substrate are joined together having a predetermined gap, and the gap is set from 3 to 8 μm for a nematic liquid crystal, and between 1 and 4 μm for a sumectic liquid crystal.

Stick drivers 806 and 807 have circuit structures which differ between the source line side and the scanning line side as shown in Embodiment Mode 2. A third substrate 814 does not particularly make distinctions, and whatever is used, the stick drivers have to be adapted for the scanning line side driver circuit or the source line side driver circuit. The stick driver is mounted on the first substrate, and that method is explained in Embodiment Mode 1 by FIGS. 2 and 3. The stick driver shown in Embodiment 8 is suitable for the stick driver mounted in the scanning line side, and the driver circuit is formed on a glass substrate. Even assuming partitioned driving, TFT characteristics which can respond to a high signal frequency is required for the stick driver mounted on the date line side, and therefore the stick driver formed on the quartz substrate shown in Embodiment 9 or Embodiment 10 is suitable. An FPC (flexible printed circuit) 812 is attached to an external input-output terminal 804 in order to input external power supply and control signals. In order to increase the adhesion strength of the FPC 812, a reinforcing plate 813 may also be formed. The liquid crystal display device can thus be completed. The final process yield of the liquid crystal display device can be increased by performing an electrical inspection before mounting the stick drivers on the first substrate, and further, the reliability can be increased.

Embodiment 16

An example is shown in FIG. 31 of a method of loading the display device on which the stick driver is mounted, as shown in Embodiment 15, in an electro-optical device. The display device has a stick driver 710 mounted in an edge portion of a substrate 701 on which a pixel region 702 is mounted. This is then joined to an opposing substrate 703 by a sealant 707 enclosing spacers 706, and in addition, polarizing plates 708 and 709 are formed. This is then fixed into a housing 724 by a connecting portion material 723.

A stick driver 710 is connected to an input wiring 714 formed on the substrate 701, in an input-output terminal 711, by a resin 713 containing conductive particles 712. One end of the input-output wiring 714 is connects to a flexible printed circuit (FPC) by a resin 716 containing conductive particles 715. The FPC is connected by a similar means (a resin 722 containing conductive particles 721) to a printed substrate 719 on which circuits such as a signal processing circuit, an amplifier circuit, and a power supply circuit are formed, and the stick drivers convey signals required for image display to the display device. If the display device is a transmitting type liquid crystal display device, then back light 718, on which a light source and a photoconductor are formed, is formed on the side of the opposite substrate 703.

The method of assembling the display device shown here is one example, and the display device may be assembled appropriately matching the form of the electro-optical device.

Embodiment 17

From the view point of the productivity of the stick driver, a suitable is such that as many stick drivers as possible are cut out from one substrate in one process. A glass substrate or a quartz substrate is used as the substrate, whichever is used, when dividing the large surface are substrate, a first problem is how process loss can be eliminated. From the view point of process precision, a dicing device is suitable, but in order to directly process substrates used by liquid crystal lines of 300×400 mm, 550×650 mm, and in addition, 960×1000 mm, the scale of the device becomes large. If anything, a glass scriber, although having inferior processing precision, but which can easily section a large surface area substrate, is used. By doing so, the process is appropriately divided into a first stage of dividing the large surface area substrate into a plurality of pieces, and a second stage of partitioning each of the stick drivers from the plurality of divided substrate by using the dicing device.

For example, a plurality of groups 902 made from a region having a size of 100 to 200 mm on a substrate with a surface area of 300×400 mm employed by a first generation liquid crystal line, and a plurality of stick drivers having a short side length of 1 to 6 mm are placed within. The spacing between each group is arranged between 3 and 10 mm, and they are divided out from the large surface area substrate by the glass scriber along process lines 904. The stick driver within the group are arranged in increments of 0.5 to 1 mm, and a method of dividing by using the dicing device can be employed. If this type of process method is used, 360 stick drivers having a 2×20 mm size can be built into a 127×127 mm group, and 2160 stick drivers can be taken out of one substrate.

Further, a second problem in forming a plurality of stick drivers on a large surface area substrate is an exposure technique. The stick driver design rule is from 0.3 to 2 µm, preferably between 0.35 and 1 µm. With this type of design rule, it is necessary to performed exposure with good throughput. For the method of exposure, a proximity method and a projection method are effective in increasing the throughout, but there are disadvantages, such as a large size, high precision mask is necessary, and high resolution and precise alignment are difficult to obtain. On the other hand, with a step method as one example, an i-line (365 nm) is used and 44 mm diaganol regions at a resolution of 0.7 µm, or 54×30 mm regions, can be exposed at a single time. Corresponding to this, if the length of the longer side of the stick driver is made to be within this exposure range, then even with a sub-micron pattern, it is possible to perform exposure with good efficiency.

It is not necessarily required to have a sub-micron design rule for the pixel region of a device such as a liquid crystal display device, and therefore the proximity method and the projection method can be considered to be suitable methods capable of exposing a large surface area at once. Therefore, performing different exposure methods for the driver circuit portion and the pixel region is not only for increasing productivity. Rather, by mounting the stick drivers as in the present invention, it becomes possible to reduce the surface area of a peripheral portion (frame region) of a large screen display device.

Embodiment 18

Semiconductor devices having an incorporated display device structured as in Embodiment 8 are shown in Embodiment 18. The following can be given as examples of such semiconductor devices: a portable information terminal (such as a mobile computer, a mobile telephone, or an electronic book); a video camera; a still camera; a personal computer; and a television. Examples of these electronic devices are shown in FIGS. 33 and 34.

FIG. 33(A) is a portable telephone, and is composed of a main body 9001, an audio output portion 9002, an audio input portion 9003, a display device 9004, operation switches 9005, and an antenna 9006. The display device 9004 can use a liquid crystal display device on which a stick driver, mounted in the periphery of a pixel region, is made from the reverse stagger type TFT of the present invention.

FIG. 33(B) is a video camera, and is composed of a main body 9101, a display device 9102, an audio input portion 9103, operation switches 9104, a battery 9105, and an image receiving portion 9106. The display device 9102 can use a liquid crystal display device on which a stick driver, mounted in the periphery of a pixel region, is made from the reverse stagger type TFT of the present invention.

FIG. 33(C) is a mobile computer or a portable information terminal, and is composed of a main body 9201, a camera portion 9202, an image receiving portion 9203, operation switches 9204, and a display portion 9205. The display device 9205 can use a liquid crystal display device on which a stick driver, mounted in the periphery of a pixel region, is made from the reverse stagger type TFT of the present invention.

FIG. 33(D) is a television, and is composed of a main body 9401, speakers 9402, a display device 9403, a reception device 9404, and an amplification device 9405. The display device 9403 can use a liquid crystal display device on which a stick driver, mounted in the periphery of a pixel region, is made from the reverse stagger type TFT of the present invention.

FIG. 33(E) is a portable book, and is composed of a main body 9501, display devices 9502 and 9503, a recording medium 9504, operation switches 9505, and an antenna 9506, and displays data recorded on a mini-disk (MD) or a DVD, and data received by the antenna. The direct view display devices 9502 and 9503 can use a liquid crystal display device on which a stick driver, mounted in the periphery of a pixel region, is made from the reverse stagger type TFT of the present invention.

FIG. 34(A) is a personal computer, and is composed of a main body 9601, an image input portion 9602, a display device 9603, and a keyboard 9604. The display device 9603 can use a liquid crystal display device on which a stick driver, mounted in the periphery of a pixel region, is made from the reverse stagger type TFT of the present invention.

FIG. 34(B) is a player using a recording medium for recording a program (hereafter referred to as a recording medium), and is composed of a main body 9701, a display device 9702, a speaker portion 9703, a recording medium 9704, and operation switches 9705. Note that this device uses a medium such as DVD (digital versatile disk) or a CD as a recording medium, and can be used for music appreciation, film appreciation, games, and accessing the Internet. The display device 9702 can use a liquid crystal display device on which a stick driver, mounted in the periphery of a pixel region, is made from the reverse stagger type TFT of the present invention.

FIG. 34(C) is a digital camera, and is composed of a main body 9801, a display device 9802, an eyepiece 9803, operation switches 9804, and a image receiving portion (not shown in the figure). The display device 9802 can use a liquid crystal display device on which a stick driver, mounted in the periphery of a pixel region, is made from the reverse stagger type TFT of the present invention.

As explained above, a pixel TFT having a reverse stagger type n-channel type TFT, and a pixel region of a liquid crystal display device prepared with a storage capacitor, can be formed using three photomasks with the present invention. By doing so, the manufacturing process can be simplified. At the same time, a reflecting type liquid crystal display device in which the surface of a pixel electrode can is made uneven can be manufactured by using the three photomasks.

Further, when mounting a stick driver to the liquid crystal display device provided with the reverse stagger type pixel TFT and the storage capacitor, by mounting a driver circuit made from the stick driver which is longer than a conventional IC chip, the number required for corresponding to one pixel region can be reduced. As a result, it is possible to the manufacturing yield of the liquid crystal display device is increased, and it is possible to reduce the manufacturing cost.

On the other hand, seen from a manufacturing process point of view, the advantages of the stick driver are that it is possible to divide the production means as follows: for the pixel region, in which a sub-micron design rule is not necessarily required, a proximity method or a projection method, which are capable of exposing a large surface area in a single time, is applied; and for the stick driver, which requires a sub-micron design rule, a stepper method of exposure is performed. By using this type of means, productivity can be increased.

What is claimed is:

1. A semiconductor device comprising:
   a first substrate;
   a first thin film transistor formed over the first substrate;
   a pixel electrode electrically connected to said first thin film transistor;
   a first driver circuit formed over a second substrate, said first driver circuit comprising a second thin film transistor including a channel forming region comprising crystalline silicon, a terminal formed on a same layer as a source electrode of the second thin film transistor, an insulating film formed over the terminal where a portion of the terminal is exposed in an opening of the insulating film, a barrier metal layer formed over the insulating film and the terminal so that the barrier metal layer is in contact the portion of the terminal, and a bump formed on the barrier metal layer, wherein said second substrate is placed on one surface of said first substrate so that the bump is located between the first substrate and the second substrate; and
   a second driver circuit formed over a third substrate, said second driver circuit comprising a third thin film transistor including a channel forming region comprising crystalline silicon wherein said third substrate is placed on one surface of said first substrate,
   wherein a gate insulating film of the second thin film transistor is thicker than a gate insulating film of the third thin film transistor.

2. The semiconductor device according to claim 1 further comprising a liquid crystal layer adjacent to the pixel electrode.

3. The semiconductor device according to claim 1 wherein said first thin film transistor has a channel forming region comprising amorphous silicon.

4. The semiconductor device according to claim 1 wherein said pixel electrode has a reflective surface.

5. The semiconductor device according to claim 1 wherein said pixel electrode has uneven upper surfaces.

6. The semiconductor device according to claim 1 wherein said second substrate is mounted directly to said first substrate and said third substrate is mounted directly to said first substrate.

7. The semiconductor device according to claim 1 wherein the barrier metal layer comprises a lamination of Ti and Pd, or a lamination of Cr and Cu.

8. The semiconductor device according to claim 1 wherein the bump comprises Au.

9. A semiconductor device comprising:
   a first substrate;
   a first thin film transistor formed over the first substrate;
   a pixel electrode electrically connected to said first thin film transistor;
   a first driver circuit formed over a second substrate, said first driver circuit comprising a second thin film transistor including a channel forming region comprising crystalline silicon, a terminal formed on a same layer as a source electrode of the second thin film transistor, an insulating film formed over the terminal where a portion of the terminal is exposed in an opening of the insulating film, a baffler metal layer formed over the insulating film and the terminal so that the baffler metal layer is in contact the portion of the terminal, and a bump formed on the barrier metal layer, wherein said second substrate is placed on one surface of said first substrate so that the bump is located between the first substrate and the second substrate; and
   a second driver circuit formed over a third substrate, said second driver circuit comprising a third thin film transistor including a channel forming region comprising crystalline silicon wherein said third substrate is placed on one surface of said first substrate.

* * * * *

UNITED STATES PATENT AND TRADEMARK OFFICE
CERTIFICATE OF CORRECTION

| | | |
|---|---|---|
| PATENT NO. | : 7,995,183 B2 | Page 1 of 1 |
| APPLICATION NO. | : 10/932113 | |
| DATED | : August 9, 2011 | |
| INVENTOR(S) | : Shunpei Yamazaki et al. | |

It is certified that error appears in the above-identified patent and that said Letters Patent is hereby corrected as shown below:

In the specification, col. 20, line 33, "lower layer, n order that" should read "lower layer, in order that"

In the claims,

Claim 9, col. 40, line 35, "a baffler metal layer" should read "a barrier metal layer"

Claim 9, col. 40, line 36, "the baffler metal layer" should read "the barrier metal layer"

Signed and Sealed this
Twenty-first Day of February, 2012

David J. Kappos
*Director of the United States Patent and Trademark Office*